United States Patent
Iwamatsu et al.

(10) Patent No.: US 6,875,663 B2
(45) Date of Patent: Apr. 5, 2005

(54) SEMICONDUCTOR DEVICE HAVING A TRENCH ISOLATION AND METHOD OF FABRICATING THE SAME

(75) Inventors: Toshiaki Iwamatsu, Tokyo (JP); Takashi Ipposhi, Tokyo (JP); Takuji Matsumoto, Tokyo (JP); Shigenobu Maeda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/237,022

(22) Filed: Sep. 9, 2002

(65) Prior Publication Data

US 2003/0119245 A1 Jun. 26, 2003

(30) Foreign Application Priority Data

Dec. 20, 2001 (JP) ........................................ 2001-387522

(51) Int. Cl.⁷ ............................................. H01L 21/336
(52) U.S. Cl. ...................... 438/298; 438/228; 438/424; 438/450; 438/526
(58) Field of Search ................................. 438/199, 221, 438/223, 224, 228, 294–298, 424, 449–451, 526

(56) References Cited

U.S. PATENT DOCUMENTS

| | | | |
|---|---|---|---|
| 4,571,819 A | | 2/1986 | Rogers et al. |
| 5,004,701 A | * | 4/1991 | Motokawa .................. 438/450 |
| 5,240,874 A | * | 8/1993 | Roberts ...................... 438/298 |
| 5,433,794 A | * | 7/1995 | Fazan et al. ............... 148/33.3 |
| 5,440,161 A | | 8/1995 | Iwamatsu et al. |
| 5,478,759 A | * | 12/1995 | Mametani et al. .......... 438/228 |
| 5,506,168 A | * | 4/1996 | Morita et al. ............... 438/427 |
| 5,679,602 A | * | 10/1997 | Lin et al. .................... 438/298 |
| 5,691,233 A | * | 11/1997 | Matsumoto ................. 438/439 |
| 5,700,730 A | * | 12/1997 | Lee et al. ................... 438/298 |
| 5,719,426 A | | 2/1998 | Iwamatsu et al. |

(Continued)

FOREIGN PATENT DOCUMENTS

| | | |
|---|---|---|
| FR | 2767606 | 2/1999 |
| FR | 1122788 | 8/2001 |
| FR | 2805394 | 8/2001 |
| JP | 7-94754 | 4/1995 |
| JP | 10-12894 | 1/1998 |
| JP | 2001-111056 | 4/2001 |

OTHER PUBLICATIONS

Y. Hirano, et al. "Bulk–Layout–Compatible 0.18μm SOI–CMOS Technology Using Body–Fixed Partial Trench Isolation (PTI)" IEEE International SOI Conference, Oct. 1999, pp. 131–132.

(Continued)

Primary Examiner—Amir Zarabian
Assistant Examiner—Khahn Duong
(74) Attorney, Agent, or Firm—Oblon, Spivak, McClelland, Maier & Neustadt, P.C.

(57) ABSTRACT

The present invention provides a method of fabricating a semiconductor device in which deterioration in a transistor characteristic is prevented by preventing a channel stop implantation layer from being formed in an active region. A resist mask is formed so as to have an opening over a region in which a PMOS transistor is formed. Channel stop implantation is performed with energy by which ions pass through a partial isolation oxide film and a peak of an impurity profile is generated in an SOI layer, thereby forming a channel stop layer in the SOI layer under the partial isolation oxide film, that is, an N-isolation region. An impurity to be implanted here is an N-type impurity. In the case of using phosphorus, its implantation energy is set to, for example, 60 to 120 keV, and the density of the channel stop layer is set to $1 \times 10^{17}$ to $1 \times 10^{19}/\mathrm{cm}^3$. At this time, the impurity of channel stop implantation is not stopped in the SOI layer corresponding to the active region.

32 Claims, 61 Drawing Sheets

U.S. PATENT DOCUMENTS

| | | | | |
|---|---|---|---|---|
| 5,728,621 A | * | 3/1998 | Zheng et al. | 438/427 |
| 5,731,241 A | * | 3/1998 | Jang et al. | 438/424 |
| 5,801,082 A | * | 9/1998 | Tseng | 438/424 |
| 5,861,338 A | * | 1/1999 | Hu | 438/450 |
| 5,899,712 A | | 5/1999 | Choi et al. | |
| 5,904,551 A | * | 5/1999 | Aronowitz et al. | 438/514 |
| 6,080,628 A | * | 6/2000 | Cherng | 438/296 |
| 6,096,623 A | * | 8/2000 | Lee | 438/425 |
| 6,277,682 B1 | * | 8/2001 | Misium | 438/199 |
| 6,277,710 B1 | * | 8/2001 | Kim et al. | 438/431 |
| 6,346,442 B1 | * | 2/2002 | Aloni et al. | 438/258 |
| 6,362,035 B1 | * | 3/2002 | Shih et al. | 438/199 |
| 6,495,424 B2 | * | 12/2002 | Kunikiyo | 438/296 |
| 6,537,888 B2 | * | 3/2003 | Lee | 438/400 |
| 6,545,318 B1 | * | 4/2003 | Kunikiyo | 257/349 |
| 2002/0055220 A1 | * | 5/2002 | Soderbarg et al. | 438/234 |
| 2002/0093071 A1 | * | 7/2002 | Chheda et al. | 257/510 |

OTHER PUBLICATIONS

S. Maeda, et al. "Impact of 0.18 $\mu$m SOI CMOS Technology Using Hybrid Trench Isolation With High Resistivity Substrate on Embedded RF/Analog Applications" 2000 Symposium on VLSI Technology Digest of Technical Papers, 2000, pp. 154–155.

Yuuichi Hirano, et al. "Impact of 0.10 $\mu$m SOI CMOS with Body–Tied Hybrid Trench Isolation Structure to Break Through the Scaling Crisis of Silicon Technology" 2000 IEEE, 2000, pp. 467–470.

S. Maeda, et al. "A Highly Reliable 0.18$\mu$m SOI CMOS Technology for 3.3V/1.8V Operation Using Hybrid Trench Isolation and Dual Gate Oxide" 2001 Conference on Solid State Devices and Materials, pp. 270–271, 2001.

French Preliminary Search Report.

* cited by examiner

F I G . 1
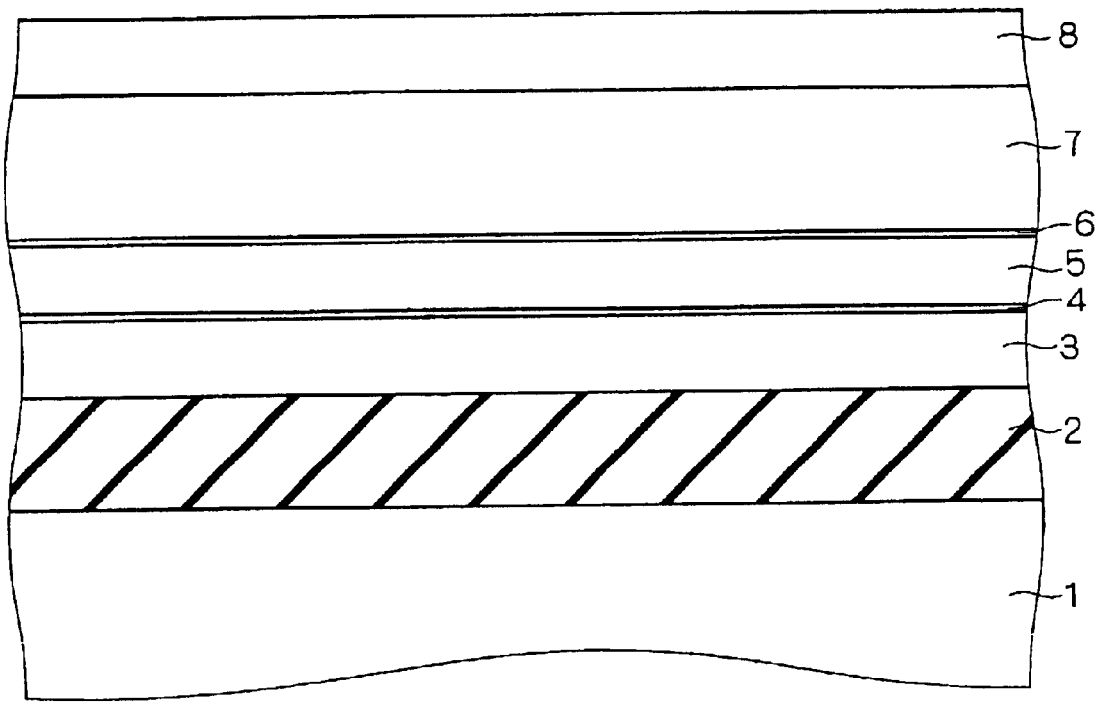

F I G . 4
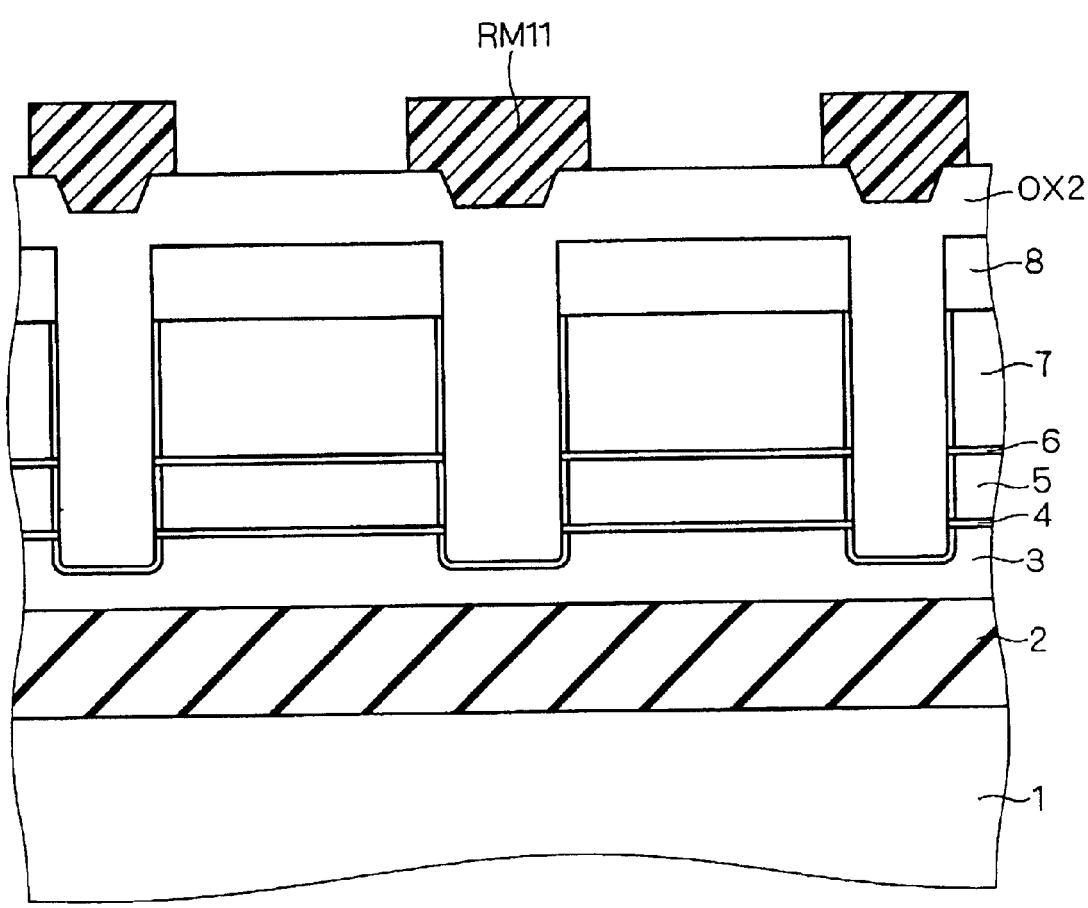

SEMICONDUCTOR DEVICE HAVING A TRENCH ISOLATION AND METHOD OF FABRICATING THE SAME

BACKGROUND OF THE INVENTION

1. Field of the Invention

The present invention relates to a semiconductor device and, more particularly, to a method of fabricating a semiconductor device having a trench isolation oxide film.

2. Related Background Art

A semiconductor device of an SOI (Silicon On Insulator) structure (hereinbelow, called an SOI device) formed on an SOI substrate in which a buried oxide film and an SOI layer are formed on a silicon substrate has characteristics such as reduced parasite capacity, high-speed operation, and low power consumption and is used for a portable device and the like.

Also for a bulk device directly formed on a silicon substrate, microfabrication technology and high integration technique progress conspicuously, and the speed of development of the bulk device is increasing.

In association with a progress of a device technique, the concentration of a channel impurity and that of a source/drain impurity are getting higher and, moreover, a sharp impurity profile is requested more and more. Consequently, there is a tendency that heat treatment after implanting impurities is performed at low temperature in short time.

On the other hand, for a device having a trench isolation structure formed by filling a trench in a silicon layer with an insulating material, heat treatment at high temperature for long time is indispensable to form the isolation structure.

As an example of the SOI device, FIG. 92 shows a partial sectional configuration of an SOI device 70 in which MOS transistors are electrically isolated from each other by a trench.

In FIG. 92, in an SOI substrate in which a buried oxide film 102 and an SOI layer 103 are formed on a silicon substrate 101, an N-channel type MOS transistor (NMOS transistor) NM1 and a P-channel type MOS transistor (PMOS transistor) PM1 are formed on SOI layer 103 and are electrically completely isolated from each other by an isolation oxide film 104. Isolation oxide film 104 is provided so as to surround NMOS transistor NM1 and PMOS transistor PM1.

Each of NMOS transistor NM1 and PMOS transistor PM1 is constructed by a source/drain region SD formed in SOI layer 103, a channel forming region CH, a gate oxide film GO formed on channel forming region CH, a gate electrode GT formed on gate oxide film GO, and a side wall oxide film SW covering side faces of gate electrode GO.

In SOI device 70, NMOS transistor NM1 and PMOS transistor PM1 are not only independent of each other by isolation oxide film 104 in SOI layer 103 but also completely isolated from other semiconductor devices and the like. The SOI device 70 has, therefore, a structure in which latch-up does not occur in the transistors in theory.

In the case of fabricating an SOI device having a CMOS transistor, there is consequently an advantage that the minimum isolation width determined by the microfabrication technology can be used and the chip area can be reduced. However, there are various problems caused by a substrate floating effect, such as accumulation of carriers (holes in the NMOS) generated by an impact ionization in the channel forming region, occurrence of a kink due to the accumulated carriers, deterioration in operation breakdown voltage resistance, and occurrence of frequency dependency of delay time caused by an unstable potential of the channel forming region.

Consequently, a partial trench isolation structure has been devised. FIG. 93 shows a partial sectional configuration of an SOI device 80 having a partial trench isolation structure (PTI structure).

In FIG. 93, NMOS transistor NM1 and PMOS transistor PM1 are provided on SOI layer 103 and are isolated from each other by a partial isolation oxide film 105 under which a well region WR is formed. Partial isolation oxide film 105 is disposed so as to surround NMOS transistor NM1 and PMOS transistor PM1.

A structure for electrically completely isolating devices by a trench oxide film reaching buried oxide film 102 like isolation oxide film 104 in SOI device 80 will be called a full trench isolation structure (FTI structure) and the oxide film will be called a full isolation oxide film.

Although NMOS transistor NM1 and PMOS transistor PM1 are isolated from each other by partial isolation oxide film 105, carries can move via well region WR under partial film 105. The carriers can be prevented from being accumulated in a channel forming region, and the potential of the channel forming region can be fixed via well region WR. Consequently, there is an advantage such that the various problems due to the substrate floating effect do not occur.

As an SOI device having a PTI structure with further improved reliability of a MOS transistor, a MOS transistor 90 to be described hereinbelow can be mentioned. A method of fabricating MOS transistor 90 will be described hereinbelow with reference to FIGS. 94 to 101. The configuration of MOS transistor 90 is shown in FIG. 101 for explaining the final process.

First, as shown in FIG. 94, by an SIMOX method for forming buried oxide film 102 by oxygen ion implantation, bonding, or the like, the SOI substrate constructed by silicon substrate 101, buried oxide film 102, and SOI layer 103 is prepared.

An oxide film 106 having a thickness of 10 to 30 nm (100 to 300 Å) is formed by CVD or thermal oxidation and, after that, a nitride film 107 having a thickness of 30 to 200 nm (300 to 2000 Å) is formed. Subsequently, a resist mask RM1 is formed on nitride film 107 by patterning. Resist mask RM1 has an opening for forming a trench.

Subsequently, by using resist mask RM1 as a mask, nitride film 107, oxide film 106, and SOI layer 103 are patterned by etching, thereby forming a partial trench TR in SOI layer 103 as shown in FIG. 95. The etching is performed not to completely etch SOI layer 103 to expose the buried oxide film 102 but the etching parameters of the etching are adjusted so that SOI layer 103 having a predetermined thickness remains on the bottom of the trench.

Since partial trench TR is formed so as to extend almost perpendicular to silicon substrate 101 with a predetermined width, device isolation which maintains fineness can be performed without deteriorating integration.

In the process shown in FIG. 96, an oxide film having a thickness of about 500 nm (5000 Å) is deposited, nitride film 107 is polished part way by CMP (Chemical Mechanical Polishing) and, after that, nitride film 107 and oxide film 106 are removed, thereby forming partial isolation oxide film 105. The region on the left side of the partial isolation oxide film 105 is set as a first region R1 in which a transistor having a low threshold voltage, and the region on the right side of the partial isolation oxide film 105 is set as a second region R2 in which a transistor having a general threshold voltage and high reliability is formed.

Subsequently, oxide film OX101 is formed on the entire face of SOI layer 103 in the process shown in FIG. 97. The thickness of oxide film OX101 is 1 to 4 nm (10 to 40 Å). After that, a resist mask RM2 is formed so as to cover second region R2, and a semiconductor impurity is ion implanted into SOI layer 103 in first region R1 via oxide film OX101. The implantation parameters in this case are parameters for forming a transistor having a low threshold voltage. In the case of forming, for example, an NMOS transistor, ions of boron (B) are implanted with an energy of 5 to 40 keV and a dose of $1\times10^{11}$ to $3\times10^{11}/cm^2$. Prior to the process, a process of forming a well region by implanting boron ions with an energy of 30 to 100 keV and a dose of $1\times10^{12}$ to $\times10^{14}/cm^2$ is performed.

In the process shown in FIG. 98, a resist mask RM3 is formed so as to cover first region R1, and a semiconductor impurity is introduced into SOI layer 103 in second region R2 via oxide film OX101 by ion implantation. The implantation parameters in this case are parameters for forming a transistor having a general threshold voltage. In the case of forming, for example, an NMOS transistor, ions of boron (B) are implanted with an energy of 5 to 40 keV and a dose of $3\times10^{11}$ to $5\times10^{11}/cm^2$.

In the process shown in FIG. 99, a resist mask RM4 is formed so as to cover second region R2, and oxide film OX101 in first region R1 is removed.

After removing resist mask RM4, an oxide film is formed in the whole area in the process shown in FIG. 100. At this time, an oxide film OX102 having a thickness of 2 to 4 nm (20 to 40 Å) is formed in region R1, and an oxide film OX103 is obtained by increasing the thickness of oxide film OX101 in region R2. After that, in the whole area, a polycrystalline silicon layer (hereinbelow, called a polysilicon layer) PS1 serving as a gate electrode is formed.

Subsequently, in the process shown in FIG. 101, by patterning polysilicon layer PS1 and oxide films OX102 and OX103, gate electrodes GT1 and GT2 and gate oxide films GO1 and GO2 are formed and, by forming a side wall oxide film SW and source/drain layer SD, NMOS transistors NM3 and NM4 are formed. Under partial isolation oxide film 105, well region WR exists.

On NMOS transistors NM3 and NM4, an interlayer insulating film is formed. A plurality of contact holes (not shown) penetrating the interlayer insulating film and reaching source/drain layer SD are formed. In such a manner SOI device 90 is configured.

As described above, the SOI device having the PTI structure is being widely used as a device capable of solving various problems caused by the substrate floating effect. However, there is a case that, in the well region under the partial isolation oxide film, the impurity concentration decreases due to a segration phenomenon at the time of forming an oxide film, and the conduction type reverses. In order to stop this, channel stop implantation for implanting impurities of the same conduction type as that of the impurities to the well region is performed. However, as described above, at the time of forming the trench isolation structure, heat treatment of long time at high temperature is indispensable. Consequently, even if the channel stop implantation is performed before the trench isolation structure is formed, there is the possibility that the impurities are diffused in the heat treatment performed after that, the profile is disturbed, and an intended effect cannot be obtained.

As a method of solving the problem, a method of implanting impurities after forming the trench isolation structure can be mentioned. However, in this case, a problem arises such that it is difficult to implant impurities of high concentration into only the region under the trench isolation oxide film.

Specifically, as shown in FIG. 102, in the case of forming partial isolation oxide film 105 on the surface of SOI layer 103 and implanting ions through partial isolation oxide film 105 into the region under the partial isolation oxide film 105, the impurities of high concentration are also introduced into an active region AR in which a semiconductor device such as a MOS transistor is to be formed and an impurity layer XL is formed.

This happens for the reason that an isolation step (for example, 20 nm) is low, which is specified by the height L of a portion projected from the main surface of SOI layer 103, of partial isolation oxide film 105. If implantation is performed with an energy that impurities are implanted through partial isolation oxide film 105 and the peak of an impurity profile is formed in the well region under partial isolation oxide film 105. impurity layer XL of high concentration is formed also in active region AR. The conduction type of impurity layer XL is opposite to that of the source/drain layer.

As a result, it becomes difficult to adjust the threshold value of a MOS transistor and to make the source/drain layer of the MOS transistor or a depletion layer formed around a PN junction of the source/drain layer reach buried oxide film 102.

FIG. 103 shows a configuration in which a MOS transistor is formed in active region AR. Due to existence of impurity layer XL, impurities of the source and drain are canceled off, and source/drain region SD does not reach buried oxide film 102. The depletion layer formed around the PN junction of the source/drain layer cannot also reach buried oxide film 102 due to the existence of impurity layer XL.

On the other hand, when the isolation step of partial isolation oxide film 105 is made large, impurity layer XL of high concentration can be prevented from being formed in active region AR. From the viewpoint of microfabrication of a semiconductor device, it is desirable that the isolation step is set to 20 nm or less.

SUMMARY OF THE INVENTION

An object of the present invention is to provide a method of fabricating a semiconductor device in which deterioration in a transistor characteristic is prevented by preventing a channel stop implantation layer from being formed in an active region.

According to an invention of a first aspect, a method of fabricating a semiconductor device includes at least one kind of a MOS transistor on a semiconductor layer, and a trench isolation oxide film for defining at lest one active region as a region in which the MOS transistor is formed and electrically isolating the MOS transistor, which includes the following steps (a) to (e).

Specifically, the steps (a) to (e) are the step (a) of forming an auxiliary film for forming the trench isolation oxide film on the semiconductor layer, the step (b) of forming a trench penetrating the auxiliary film and reaching a predetermined depth in the semiconductor layer, the step (c) of forming the trench isolation oxide film by filling the trench with an oxide film and, after that, removing the auxiliary film on the active region by a predetermined thickness to thereby make the trench isolation oxide film project from a main surface of the auxiliary film, the step (d) of implanting ions of an impurity of a conduction type different from that of a source/drain layer of the MOS transistor with energy by which the ions pass through the trench isolation oxide film and a peak of a profile is formed in the semiconductor layer under the trench isolation oxide film after the step (c), thereby forming channel stop layers in the semiconductor layer under the trench isolation oxide film, and the step (e) of reducing the thickness of the trench isolation oxide film after formation of the channel stop layer.

By forming a trench isolation oxide film having a large isolation step and performing channel stop implantation via the trench isolation oxide film, the high-concentration channel stop layer can be formed in the isolation region in a self aligned manner. In this case, since the channel stop layer is not formed in the semiconductor layer corresponding to the active region, the threshold value of the MOS transistor can be adjusted without a hitch, and a source/drain layer of the MOS transistor or a depletion layer formed around the PN junction of the source/drain layer can be allowed to reach a deep region. Thus, a semiconductor device in which deterioration in a transistor characteristic is prevented can be obtained.

According to the present invention of a second aspect, a method of fabricating a semiconductor device includes at least one kind of a MOS transistor on a semiconductor layer, and a trench isolation oxide film for defining at lest one active region as a region in which the MOS transistor is formed and electrically isolating the MOS transistor, which includes the following steps (a) to (e).

Specifically, the method includes the step (a) of forming an auxiliary film for forming the trench isolation oxide film on the semiconductor layer, the step (b) of forming a trench penetrating the auxiliary film and reaching a predetermined depth in the semiconductor layer the step (c) of forming the trench isolation oxide film by filling the trench with an oxide film and removing the trench isolation oxide film to a predetermined thickness, after the step (c), the step (d) of implanting ions of an impurity of a conduction type different from that of a source/drain layer of the MOS transistor with energy by which the ions pass through the trench isolation oxide film and a peak of a profile is generated in the semiconductor layer under the trench isolation oxide film in a state where the auxiliary film is left on the active region, thereby forming channel stop layers in the semiconductor layer under the trench isolation oxide film, and the step (e) of, after formation of the channel stop layers, further reducing the thickness of the trench isolation oxide film.

By leaving the auxiliary film on the active region and performing channel stop implantation via the trench isolation oxide film having a small isolation step with energy by which a peak of a profile is generated in the semiconductor layer, a high-concentration channel stop layer can be formed in the isolation region in a self aligned manner. In this case, since the channel stop layer is not formed in the semiconductor layer corresponding to the active region, the threshold value of the MOS transistor can be adjusted without a hitch, and a source/drain layer of the MOS transistor or a depletion layer formed around the PN junction of the source/drain layer can be allowed to reach a deep region. Thus, a semiconductor device in which deterioration in a transistor characteristic is prevented can be obtained.

According to the present invention of a third aspect, a method of fabricating a semiconductor device includes at least one kind of a MOS transistor on a semiconductor layer, and a trench isolation oxide film for defining at lest one active region as a region in which the MOS transistor is formed and electrically isolating the MOS transistor, and includes the following steps (a) to (d).

Specifically, the method includes the step (a) of forming an auxiliary film for forming the trench isolation oxide film on the semiconductor layer, the step (b) of forming a side wall spacer of an insulating film on an inner wall of the trench after forming a trench penetrating the auxiliary film and reaching a predetermined depth in the semiconductor layer, the step (c) of implanting ions of an impurity of a conduction type different from that of a source/drain layer of the MOS transistor with energy by which a peak of a profile is formed in the semiconductor layer on the bottom of the trench in a state where the side wall spacer is formed, thereby forming channel stop layers in the semiconductor layer on the bottom of the trench and the step (d) of forming the trench isolation oxide film by filling the trench with an oxide film after formation of the channel stop layer.

The channel stop implantation is performed at a stage where a trench is formed. Consequently, the implantation energy may be small. Since the impurity cannot pass through the auxiliary film on the semiconductor layer corresponding to the active region with the energy, the impurity of the channel stop implantation can be prevented from being implanted into the semiconductor layer corresponding to the active region with reliability.

According to the present invention of a fourth aspect, a method of fabricating a semiconductor device includes a trench isolation oxide film for defining an active region as a region in which a MOS transistor is formed on a semiconductor layer having crystallizability and electrically isolating the MOS transistor, and including the following steps (a) and (b).

Specifically, the method includes the step (a) of forming the trench isolation oxide film in a main surface of the semiconductor layer, and the step (b) of implanting ions of an impurity of a conduction type different from that of a source/drain layer of the MOS transistor at an angle that the implanted ions cause channeling at the time of implantation of ions to the semiconductor layer. The impurity implantation is performed with energy by which the impurity passes through the trench isolation oxide film and a peak of a profile is generated in the semiconductor layer under the trench isolation oxide film.

Since channeling is used at the time of forming the channel stop layer, it becomes easy to perform channel stop implantation only to the semiconductor layer under the trench isolation oxide film having a small isolation step.

According to the present invention of a fifth aspect, a method of fabricating a semiconductor device includes a trench isolation oxide film for defining an active region as a region in which a MOS transistor is formed on a semiconductor layer and electrically isolating the MOS transistor, which includes the following steps (a) to (e).

Specifically, the method includes the step (a) of forming the trench isolation oxide film in a main surface of the semiconductor layer, the step (b) of forming a channel stop layer in the semiconductor layer under the trench isolation oxide film, the step (c) of forming the MOS transistor on the active region, the step (d) of forming a nitride film so as to cover at least a gate electrode of the MOS transistor and the active region, and the step (e) of performing thermal oxidation after the step (d).

After the nitride film is formed so as to cover the gate electrode of the MOS transistor and the active region, thermal oxidation is performed. Consequently, the cross sectional area of the trench isolation oxide film which is not covered with the nitride film increases, and the thickness of the channel stop layer is reduced. Thus, the junction area can be reduced, and the junction capacitance can be also reduced.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 through 13 are cross sections showing a method of fabricating a semiconductor device of a first embodiment according to the present invention.

DETAILED DESCRIPTION OF THE PREFERRED EMBODIMENTS

A. First Embodiment

A-1. Fabricating Method

Figure 2:
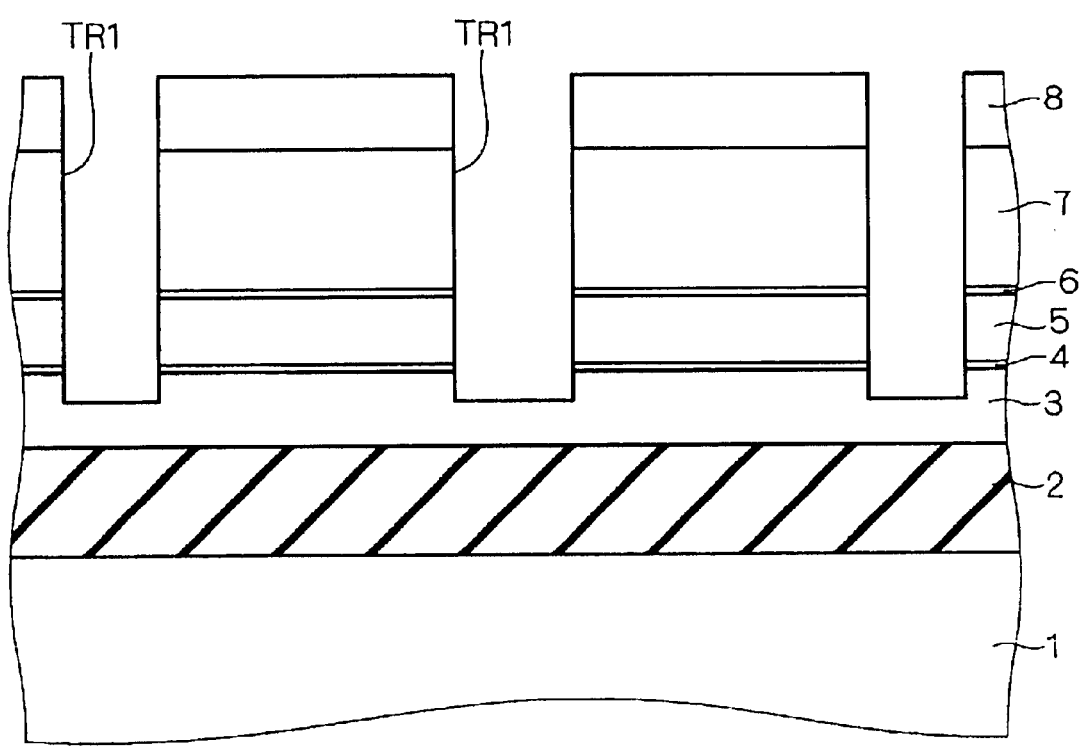

With reference to FIGS. 1 to 13 as cross sections for sequentially showing a fabricating process, a fabricating method of a first embodiment according to the present invention will be described.

First, as shown in FIG. 1, by the SIMOX method for forming a buried oxide film 2 by oxygen ion implantation, bonding, or the like, an SOI substrate constructed by a silicon substrate 1, a buried oxide film 2, and an SOI layer 3 is prepared. The SOI substrate may be formed by a method other than the above methods.

Usually, the film thickness of SOI layer 3 is 50 to 200 nm, and the film thickness of buried oxide film 2 is 100 to 500 nm. On the SOI substrate, a silicon oxide film (hereinafter, called an oxide film) 4 having a thickness of 10 to 30 nm (100 to 300 Å) is formed by CVD (with a temperature condition of about 800° C.) or thermal oxidation (with a temperature condition of 800 to 1000° C.).

After that, a polycrystalline silicon film (hereinbelow, called a polysilicon film) 5 having a thickness of 10 to 100 nm (100 to 1000 Å) is formed on oxide film 4 by CVD.

An oxide film 6 having a thickness of 10 to 200 (100 to 2000 Å) is formed on polysilicon film 5 by CVD or thermal oxidation, and a polysilicon film 7 having a thickness of 10 to 300 nm (100 to 3000 Å) is formed on oxide film 6 by CVD.

Further, a silicon nitride film (hereinbelow, called a nitride film) 8 having a thickness of 30 to 200 nm (300 to 2000 Å) is formed on polysilicon film 7 by CVD (with a temperature condition of about 700° C.). Since oxide film 4, polysilicon film 5, oxide film 6, polysilicon film 7, and nitride film 8 function auxiliarily to form a trench isolation oxide film to be formed later, they may be called auxiliary films.

Nitride film 8 is patterned with a resist mask having openings corresponding to the positions in which the trench isolation oxide film is to be formed, and nitride film 8 and polysilicon film 7 are selectively removed by dry etching or wet etching.

After that, as shown in FIG. 2, patterned nitride film 8 is used as an etching mask, by etching oxide film 6, polysilicon film 5, and oxide film 4 and etching SOI layer 3 to predetermined depth, thereby forming a trench TR1. The etching parameters of the etching are adjusted so as not to completely etch SOI layer 3 to expose buried oxide film 2 but so as to leave SOI layer 3 having a predetermined thickness on the bottom of the trench.

Since partial trench TR1 is formed so as to extend in the direction almost perpendicular to silicon substrate 1 with a predetermined width, without deteriorating the integration degree, device isolation can be carried out while maintaining microfabrication.

Figure 3:
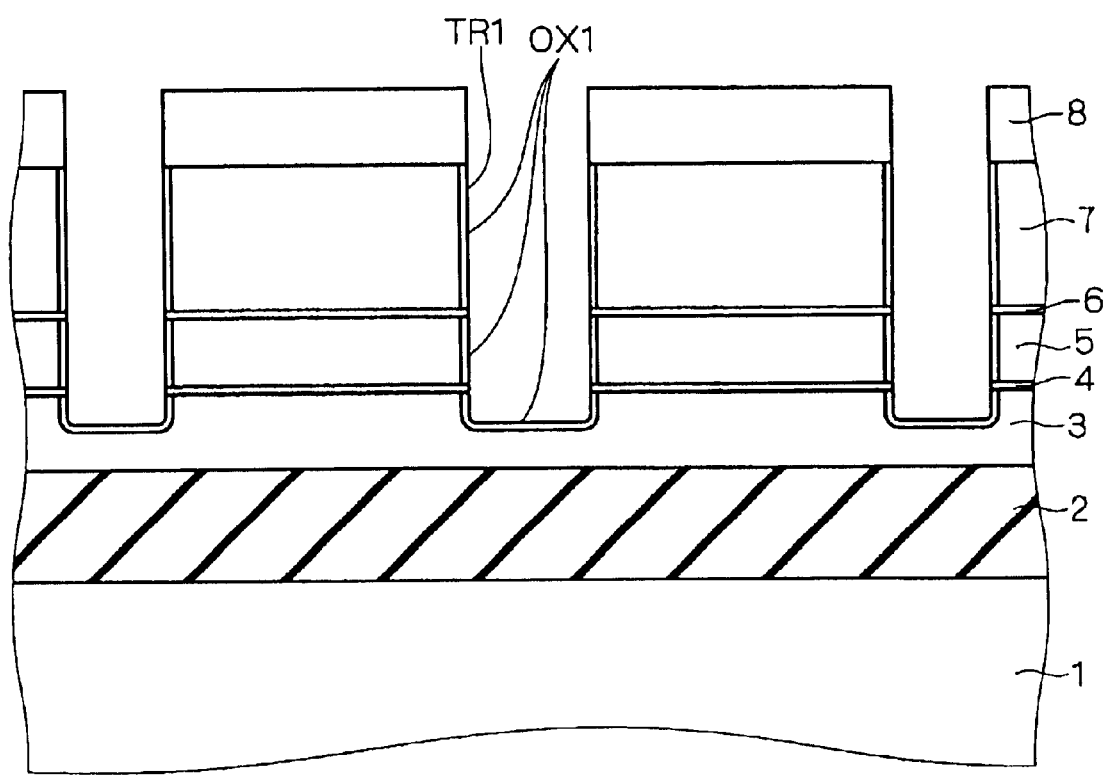
Figure 5:
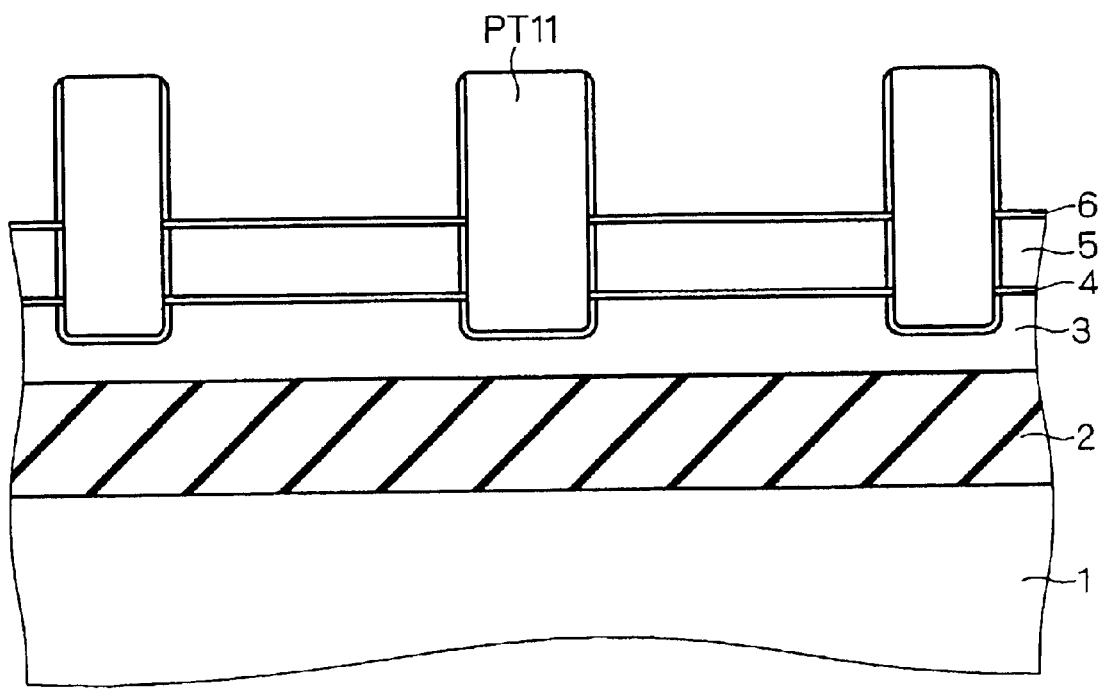

In a process shown in FIG. 3, the inner walls of trench TR1 are oxidized to form an oxide film OX1. In the process shown in FIG. 4, trench TR1 is filled with an oxide film OX2.

It is sufficient to form oxide film OX2 by, for example, HDP (High-Density-Plasma) CVD. The HDP-CVD uses plasma having density higher than that in general plasma CVD by one to two digits and deposits an oxide film while simultaneously performing sputtering and deposition. An oxide film of excellent film quality can be obtained.

After that, oxide film OX2 is patterned with a resist mask RM11 having openings corresponding to active regions in each of which a semiconductor device such as a MOS transistor is to be formed, and etched to a predetermined depth in the pattern of resist mask RM11. After that, resist mask RM11 is removed. The reason why such a process is performed is that, in a following CMP (Chemical Mechanical Polishing) process for removing an oxide film OX11, oxide film OX2 is uniformly removed.

By removing oxide film OX2 by CMP, oxide film OX2 is left only in trench TR1. After that, nitride film 8 is removed by thermal phosphoric acid and, further, polysilicon film 7 is removed, thereby obtaining a partial isolation oxide film PT11 shown in FIG. 5. Polysilicon film 7 may be removed by wet etching using alkaline solution, for example, KOH (potassium hydroxide) solution or a mixture solution of ammonia and hydrogen peroxide or dry etching having selectivity with an oxide film.

Partial isolation oxide film PT11 is projected from the main surface of oxide film 6, and the thickness of the whole is about 600 nm (6000 Å). When the thickness in SOI layer 3 is set to about 100 nm, what is called an isolation step is about 500 nm.

Figure 6:
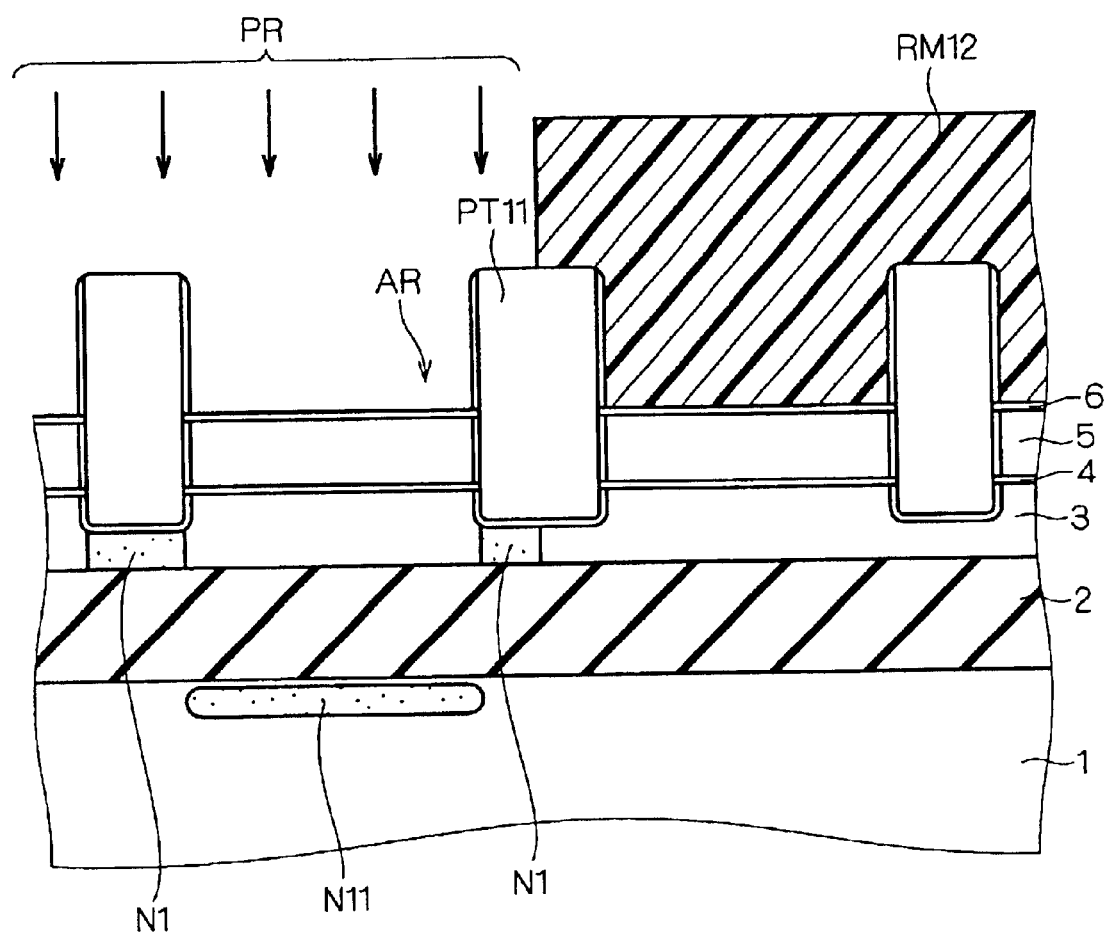

In a process shown in FIG. 6, a resist mask RM12 having an opening over the region PR in which a PMOS transistor is to be formed is formed. By performing channel stop implantation with an energy by which the peak of an impurity profile is generated in SOI layer 3 through partial isolation oxide film PT11, a channel stop layer N1 is formed in SOI layer 3 under partial isolation oxide film PT11, that is, in the isolation region.

The impurities to be implanted are N-type impurities. When phosphorus (P) is used, the implantation energy is, for example, 60 to 120 keV, and the density of channel stop layer N1 is $1 \times 10^{17}$ to $1 \times 10^{19}$/cm$^3$.

In this case, in SOI layer 3 corresponding to active region AR, the impurities of channel stop implantation are not stopped but are implanted into buried oxide film 2 and silicon substrate 1 under buried oxide film 2. FIG. 6 shows an example that an impurity layer N11 is formed in silicon substrate 1.

Figure 7:
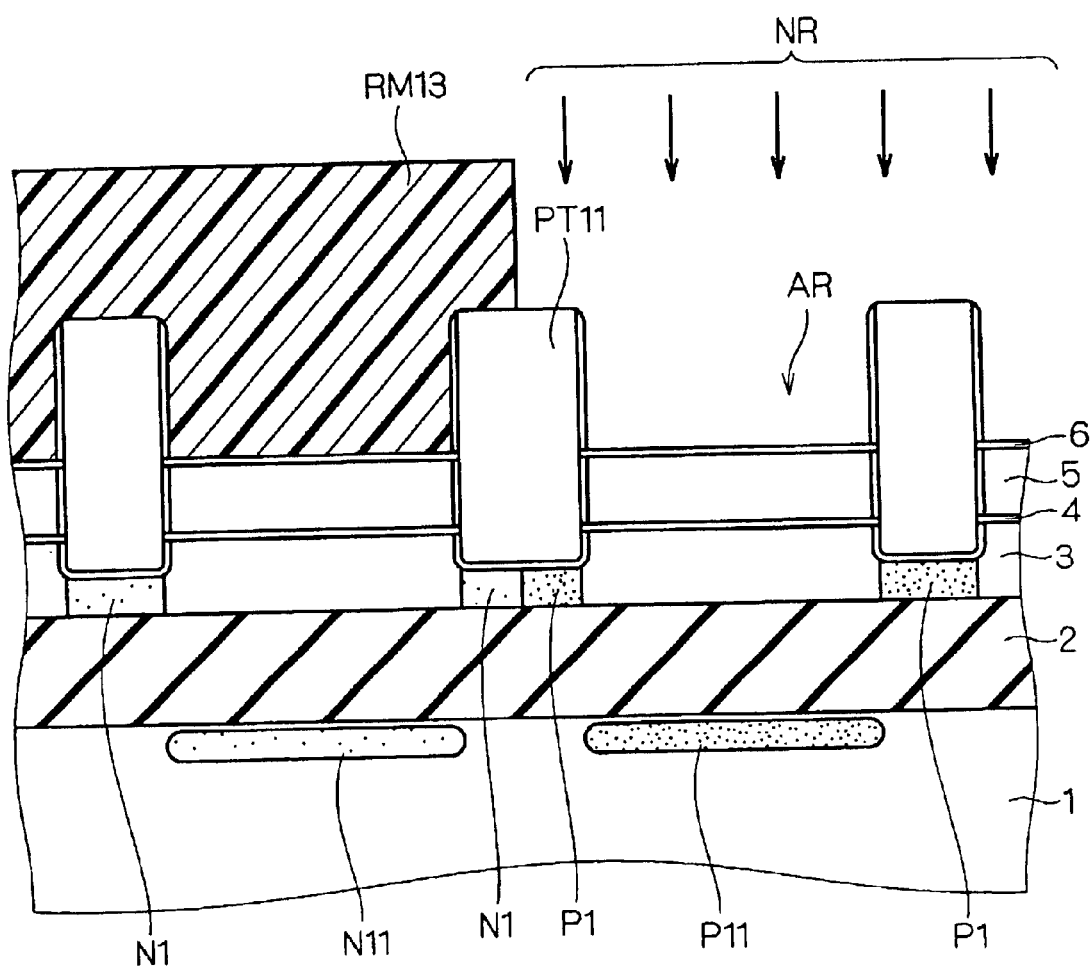

In a process shown in FIG. 7, a resist mask RM13 having an opening above an area NR in which an NMOS transistor is to be formed is formed. Channel stop implantation is performed with an energy by which a peak of an impurity profile is generated in SOI layer 3 through partial isolation oxide film PT11, and a channel stop layer P1 is formed in SOI layer 3 under partial isolation oxide film PT11, that is, in the isolation region.

Impurities to be implanted are P-type impurities. When boron (B) is used, the implantation energy is set to, for example, 30 to 60 keV, and the density of channel stop layer P1 is set to $1 \times 10^{17}$ to $1 \times 10^{19}$/cm$^3$.

At this time, in SOI layer 3 corresponding to active region AR, the impurities of channel stop implantation are not stopped but are implanted into buried oxide film 2 and silicon substrate 1 under buried oxide film 2. FIG. 7 shows an example that impurity layer P11 is formed in silicon substrate 1.

By performing channel stop implantation by using an isolation step as described above, channel stop layers N1 and P1 of high density can be formed in a self aligned manner in the isolation regions.

Figure 8:
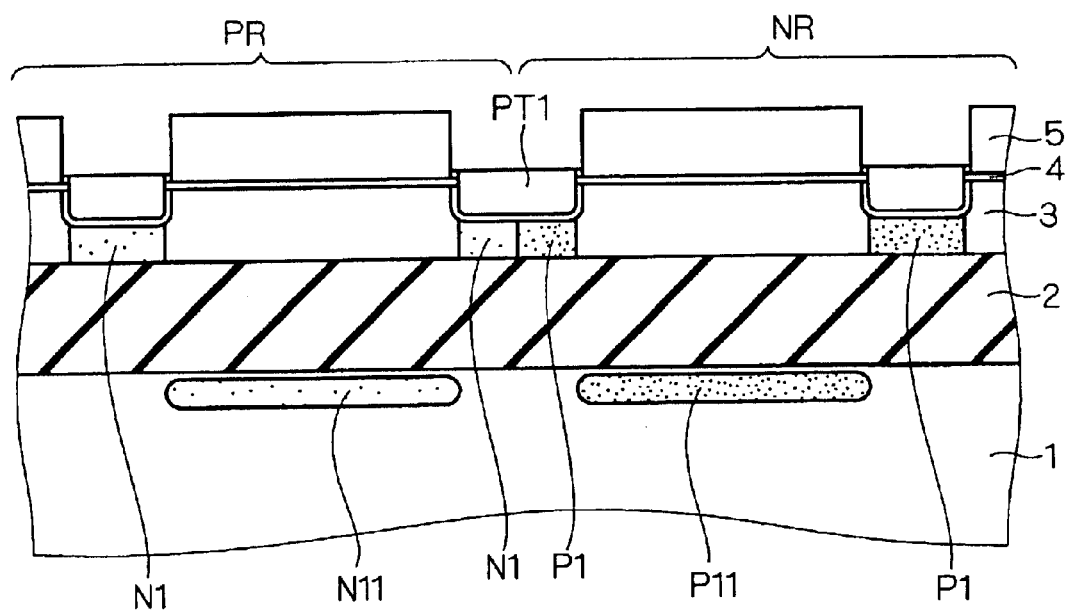

In a process shown in FIG. 8, partial isolation oxide film PT11 and internal-wall oxide film OX1 are etched by a hydrofluoric acid (HF) process, thereby forming a partial isolation oxide film PT1 with reduced an isolation step.

Figure 9:
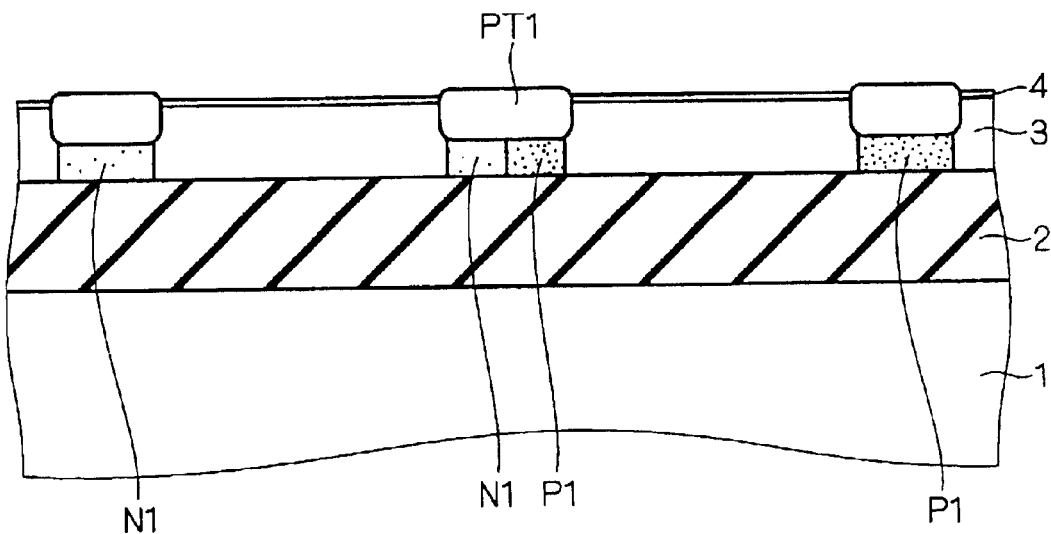

In a process shown in FIG. 9, polysilicon film 5 on oxide film 4 is removed by wet etching or dry etching having selectivity with an oxide film.

Figure 10:
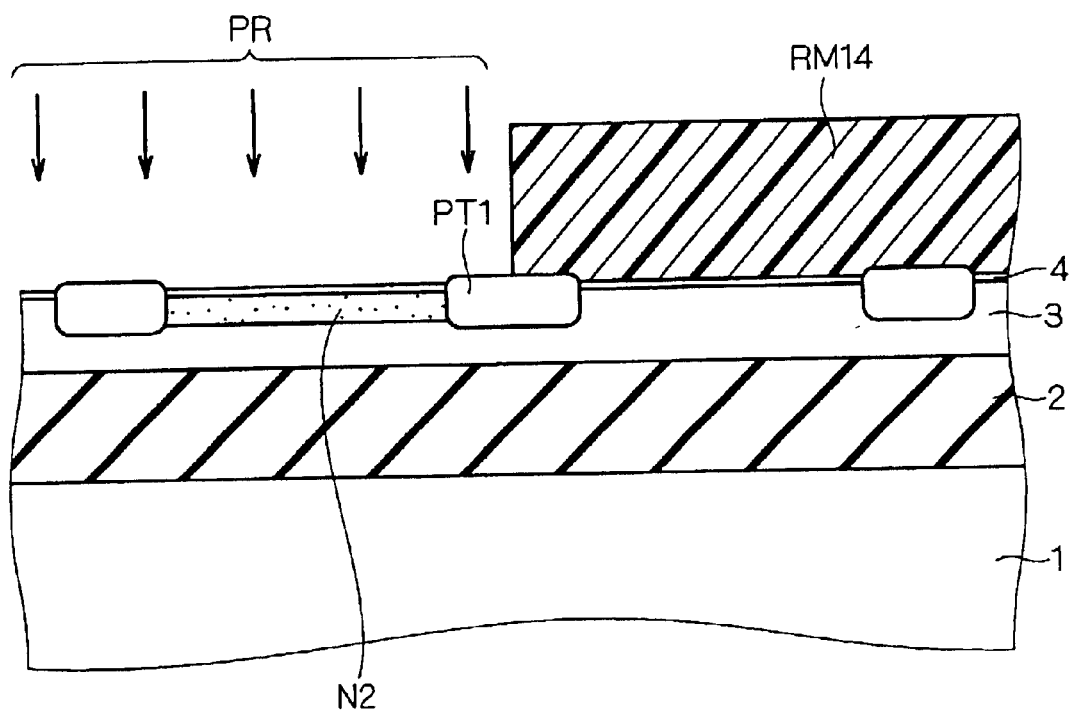

In a process shown in FIG. 10, a resist mask RM14 is formed so that its opening corresponds to a region PR in which a PMOS transistor is to be formed. By implanting an n-type impurity for channel implantation, for example, any of P (phosphorus), As (arsenic), and Sb (antimony), a threshold voltage of a transistor is set.

As an example of impurity parameters at this time, in the case of using phosphorus, implantation energy is 20 to 100 keV, and a dose is $1 \times 10^{10}$ to $1 \times 10^{14}$/cm$^2$.

Figure 11:
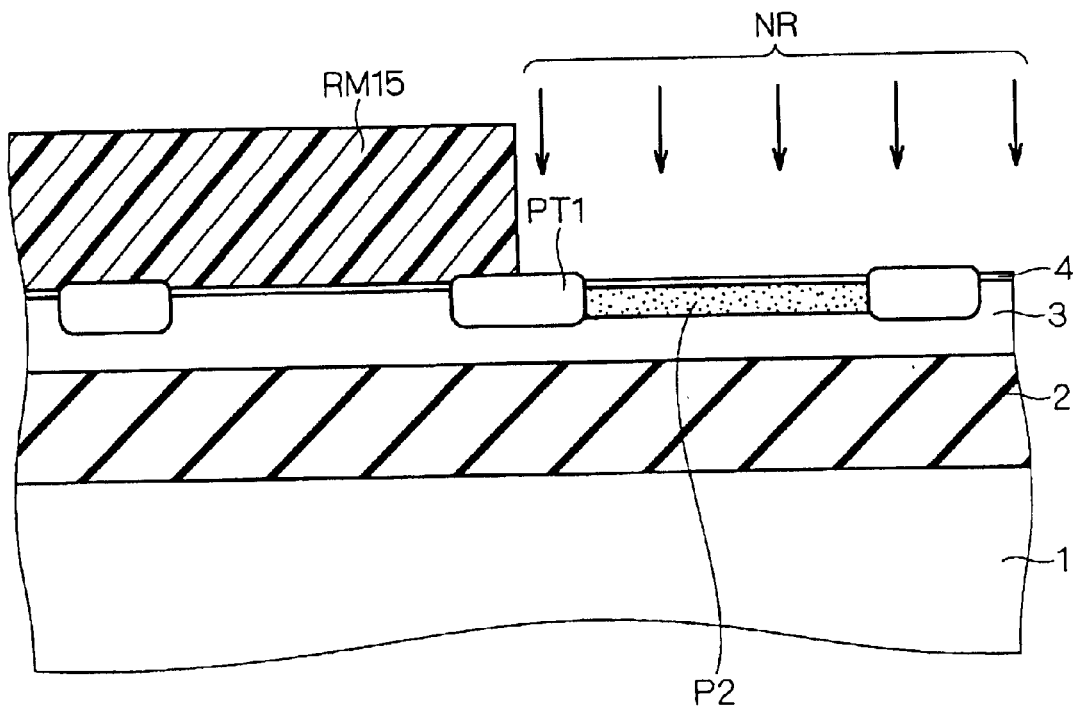

In a process shown in FIG. 11, a resist mask RM15 is formed so that its opening corresponds to region NR in which an NMOS transistor is formed. By implanting a p-type impurity for channel implantation, for example, B (boron) or In (indium), a threshold voltage of a transistor is set.

As an example of impurity parameters at this time, in the case of using boron, implantation energy is 5 to 40 keV, and a dose is $1 \times 10^{10}$ to $1 \times 10^{14}$/cm$^2$. To set the threshold voltage to a lower value, it is sufficient to reduce the dose. After the channel implantation, heat treatment of short time is performed for the purpose of recovering damage caused by the implantation.

Figure 12:
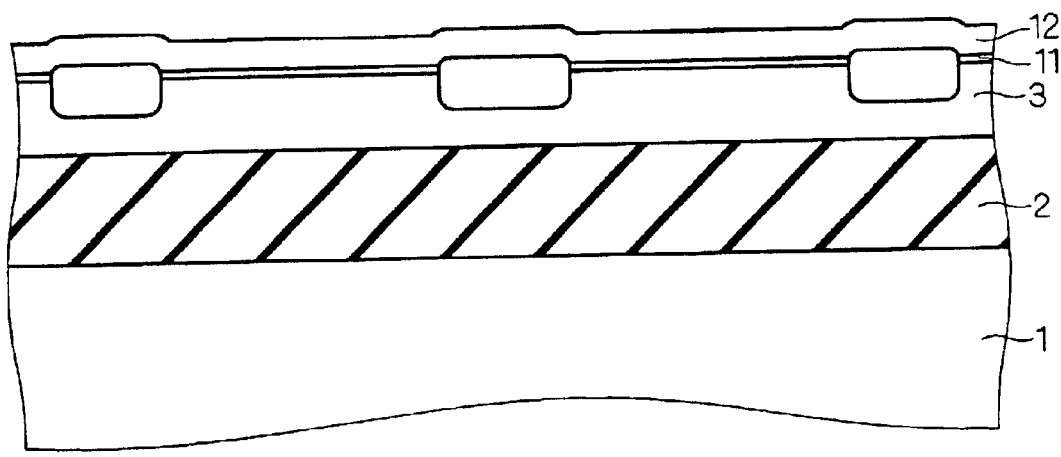

After that, oxide film 4 is removed by wet etching. Instead, as shown in FIG. 12, an insulating film 11 having a thickness of 1 to 4 nm (10 to 40 Å is formed on SOI layer 3. For the formation, rapid thermal oxidation, CVD or the like can be used. Further, a polysilicon film 12 having a thickness of 100 to 400 nm (1000 to 4000 Å) is deposited on insulating film 11 by CVD.

Figure 13:
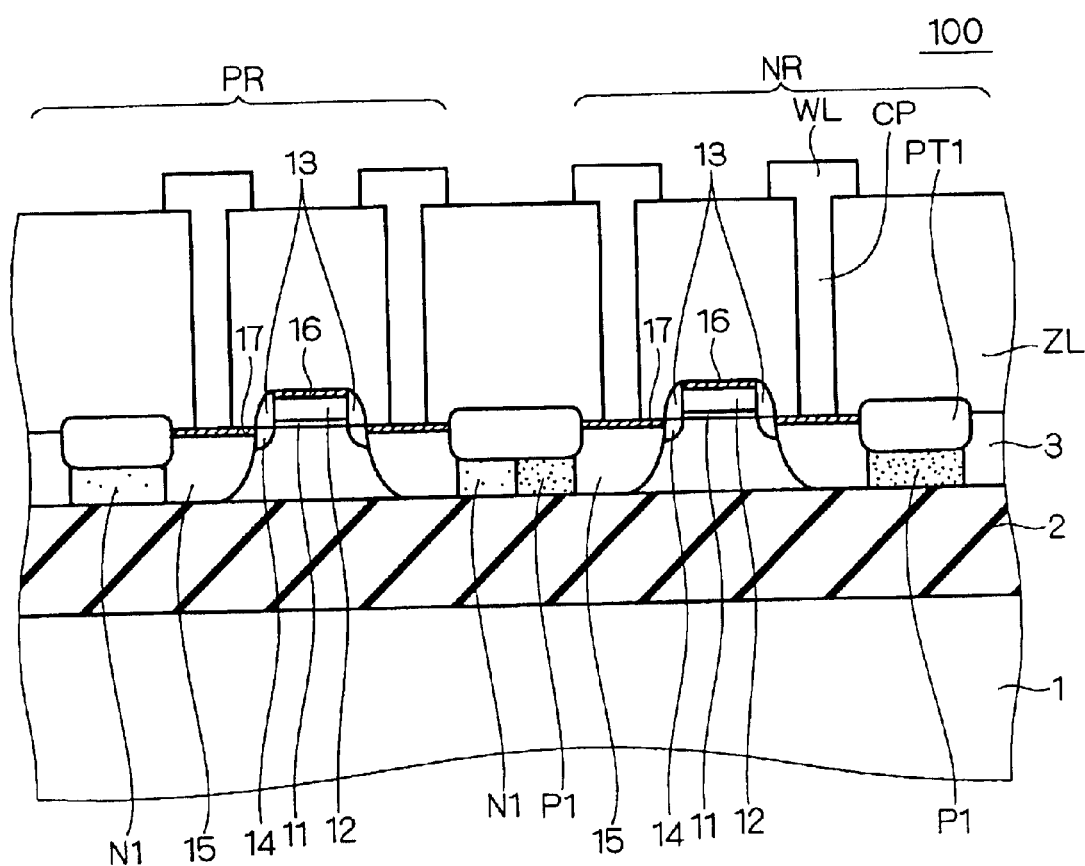

As shown in FIG. 13, in regions PR and NR, insulating film 11 and polysilicon film 12 are patterned to form gate insulating film 11 and gate electrode 12. By performing impurity implantation (LDD implantation) while using gate electrode 12 as an implantation mask, a lightly doped drain layer (or source/drain extension layer) 14 is formed.

After that, a spacer (side wall spacer) 13 of an insulating film is formed on side walls of gate insulating film 11 and gate electrode 12. By performing impurity implantation for forming a source/drain layer (source/drain implantation) while using gate electrode 12 and side wall space 13 as an implantation mask, a source/drain layer 15 is formed.

Further, heat treatment of short time is performed for recovery of an implantation damage and activation of implanted ions.

A refractory metal layer made of Co (cobalt) or the like is formed on the whole face by sputtering. A silicide reaction with silicon is caused by heat treatment, thereby forming a silicide layer. By the silicide reaction, silicide layers 16 and 17 are formed on gate electrode 12 and source/drain layer 15, and the unreacted refractory metal layer is removed.

After that, an interlayer film ZL is formed on the whole face, a contact plug CP penetrating interlayer insulating film ZL and reaching silicide layer 17 is formed. By connecting a wiring layer WL to contact plug CP, an SOI device 100 shown in FIG. 13 is formed.

A-2. Action and Effect

According to the above-described fabricating method of the first embodiment, partial isolation oxide film PT11 having a large isolation step is formed and channel stop implantation is performed through partial isolation oxide film PT11, thereby enabling channel stop layers N1 and P1 of high density to be formed in a self-aligned manner in the isolation regions. In this case, since a channel stop layer is not formed in SOI layer 3 corresponding to active region AR, the threshold value of a MOS transistor can be adjusted without a hitch, the source/drain layer of the MOS transistor or a depletion layer formed around the PN junction of the source/drain layer can be made reach buried oxide film 2. A semiconductor device in which deterioration in the transistor characteristics is prevented can be obtained.

Since partial isolation oxide film PT11 is etched so as to reduce the isolation step after the channel stop implantation to thereby finally obtain partial isolation oxide film PT1 having the isolation step of 20 nm or less, a problem associated with reduction in size of the semiconductor device does not occur.

Since five layers of oxide film 4, polysilicon film 5, oxide film 6, polysilicon film 7, and nitride film 8 are formed on SOI layer 3 and partial isolation oxide film PT11 is formed by using trench TR1 penetrating the five layers, a large isolation step can be formed. Further, nitride film 8 functions as an etching mask used for trench TR1, polysilicon film 7 is a film for forming a large isolation step, oxide film 6 functions as an etching stopper at the time of removing polysilicon film 7, and polysilicon film 5 functions as a protective film of the active region at the time of reducing the isolation step of partial isolation oxide film PT11 by etching. Oxide film 4 is also called a pad oxide film and functions as a protective film for SOI layer 3 at the time of reducing a damage caused at the time of implanting impurities into SOI layer 3 and removing an upper layer.

B. Second Embodiment

Although the configuration of performing the channel stop implantation through the partial isolation oxide film having a large isolation step is used in the first embodiment, channel stop implantation may be also performed by a method described hereinbelow.

B-1. Fabricating Method

With reference to FIGS. 14 to 20 as cross sections for sequentially showing a fabricating process, a fabricating method of a second embodiment according to the present invention will be described. The same components as those in the first embodiment described by referring to FIGS. 1 to 13 are designated by the same reference numerals and their description will not be repeated.

Figure 14:
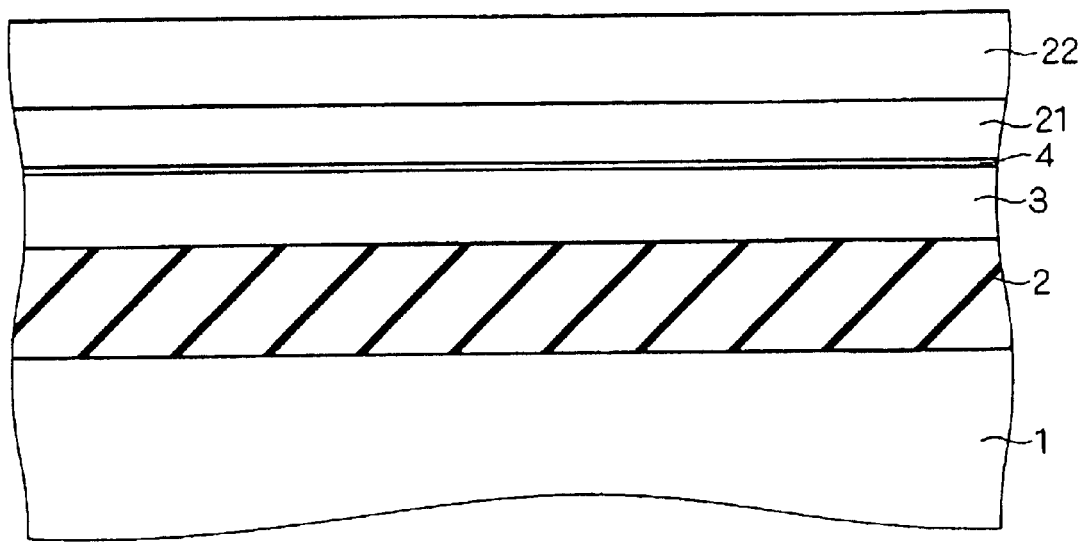
FIGS. 14 through 20 are cross sections showing a method of fabricating a semiconductor device of a second embodiment according to the present invention.

First, as shown in FIG. 14, oxide film 4 is formed on an SOI substrate.

A polysilicon film 21 having a thickness of 5 to 300 nm (50 to 3000 Å) is formed on oxide film 4 by CVD. A nitride film 22 having a thickness of 100 to 200 (1000 to 2000 Å) is formed on polysilicon film 21 by CVD. Oxide film 4, polysilicon film 21, and nitride film 22 function auxiliarily to form an isolation oxide film, so that they may be called auxiliary films.

After that, nitride film 22 and polysilicon film 21 are selectively removed by dry etching or wet etching.

Figure 15:
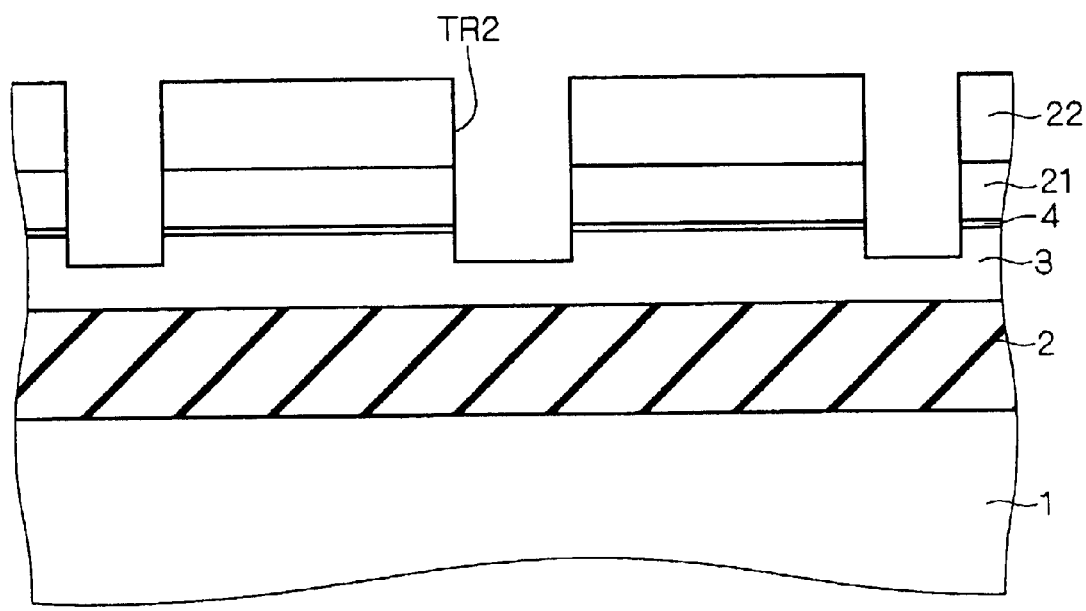

As shown in FIG. 15, patterned nitride film 22 is used as an etching mask, oxide film 4 is penetrated and SOI layer 3 is etched to predetermined depth, thereby forming a trench TR2. The etching parameters of the etching are adjusted so as not to completely etch SOI layer 3 to expose buried oxide film 2 but so as to leave SOI layer 3 having a predetermined thickness on the bottom of the trench.

Figure 16:
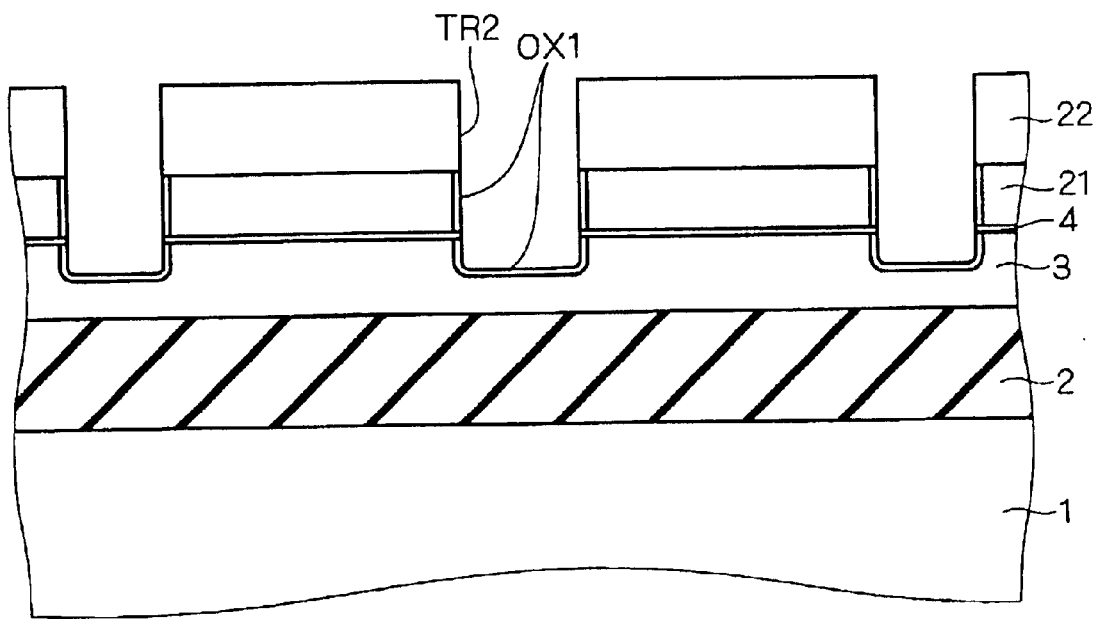

In a process shown in FIG. 16, the inner walls of trench TR2 are oxidized to form internal wall oxide film OX1. In a process shown in FIG. 17, trench TR2 is filled with oxide film OX2.

After that, oxide film OX2 is patterned with a resist mask RM21 having openings corresponding to active regions in each of which a semiconductor device such as a MOS transistor is to be formed, and etched to a predetermined depth in the pattern of resist mask RM21. After that, resist mask RM21 is removed.

Figure 18:
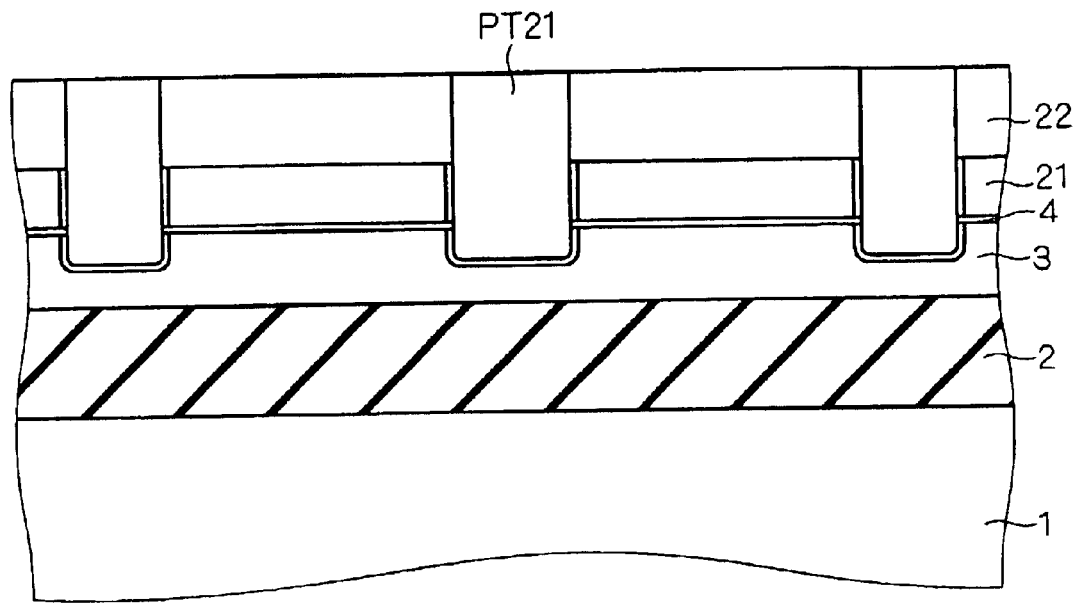

By removing oxide film OX2 on nitride film 22 by CMP, oxide film OX2 is left only in trench TR2. In such a manner, a partial isolation oxide film PT21 shown in FIG. 18 is obtained.

Figure 19:
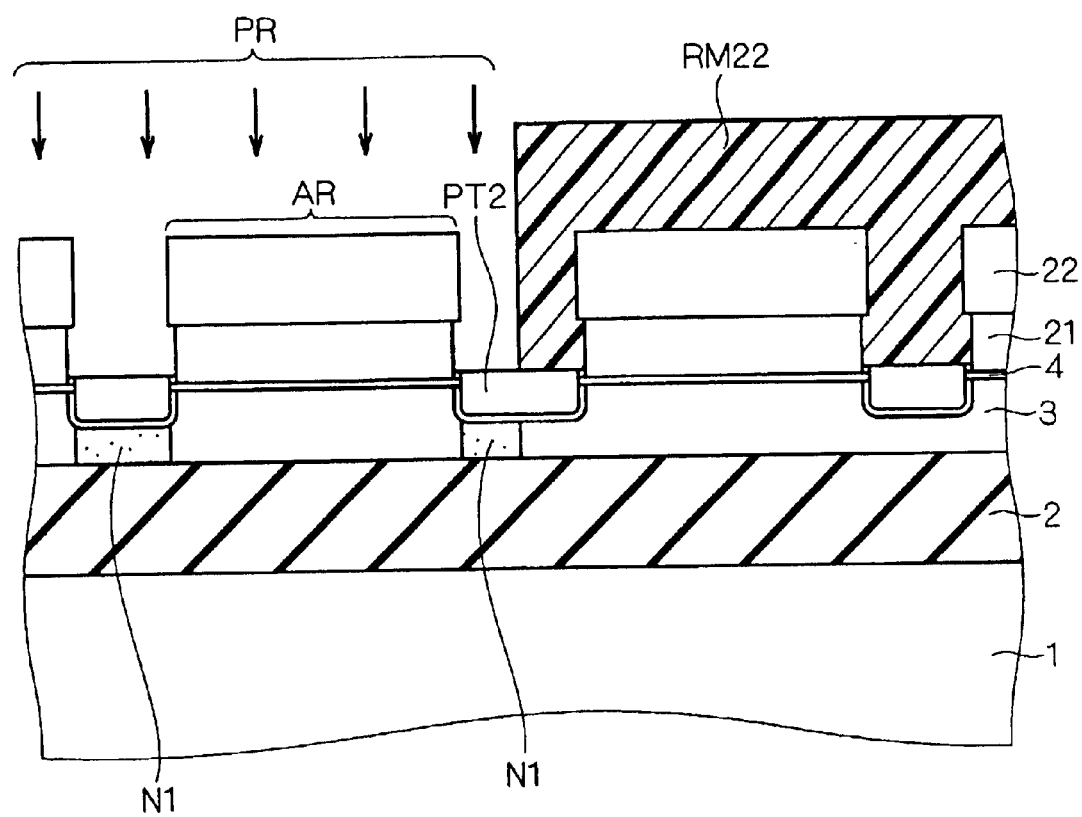

In a process shown in FIG. 19, partial isolation oxide film PT21 and internal-wall oxide film OX1 are etched by a hydrofluoric acid (HF) process, thereby forming a partial isolation oxide film PT2 with reduced an isolation step. It is assumed that the thickness of isolation oxide film PT2 is 100 to 150 nm (1000 to 1500 Å) and the isolation step is about 20 nm.

After that, a resist mask RM22 is formed so that its opening corresponds to region PR in which a PMOS transistor is to be formed. By performing channel stop implantation with an energy by which a peak of an impurity profile is generated in SOI layer 3 through partial isolation oxide film PT2, channel stop layer N1 is formed in SOI layer 3 under partial isolation oxide film PT2, that is, in the isolation region.

An impurity to be implanted here is an N-type impurity. In the case of using phosphorus (P), implantation energy is set to, for example, 100 to 300 keV, and the density of channel stop layer N1 is set to $1 \times 10^{17}$ to $1 \times 10^{19}/cm^3$.

At this time, polysilicon film 21 and nitride film 22 remain on SOI layer 3 corresponding to active region AR, and its thickness is about 400 nm (4000 Å), so that the impurities cannot pass through polysilicon film 21 and nitride film 22 with the above-described energy. The impurities of channel stop implantation cannot be implanted into SOI layer 3 corresponding to active region AR.

Figure 20:
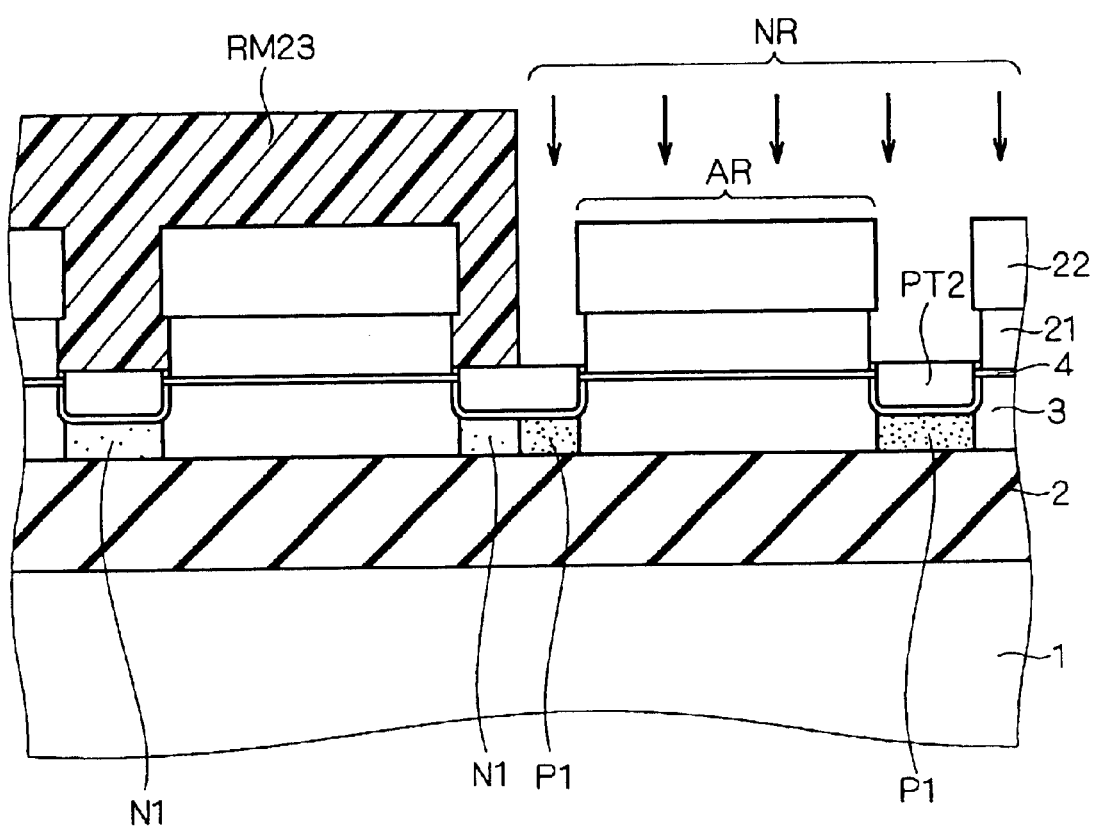

Subsequently, in a process shown in FIG. 20, a resist mask RM23 is formed so that is opening corresponds to region NR in which an NMOS transistor is to be formed. Channel stop implantation is carried out with an energy by which a peak of an impurity profile can be generated in SOI layer 3 through partial isolation oxide film PT2, thereby forming channel stop layer P1 in SOI layer 3 under partial isolation oxide film PT2, that is, the isolation region.

The impurity to be implanted here is a P-type impurity. In the case of using boron (B), implantation energy is set to, for example, 30 to 100 keV, and the density of channel stop layer P1 is set to $1 \times 10^{17}$ to $1 \times 10^{19}/cm^3$.

At this time, the impurity of the channel stop implantation is not implanted into SOI layer 3 corresponding to active region AR.

After that, nitride film 22 is removed by thermal phosphoric acid, and polysilicon film 21 is removed by wet etching or dry etching having selectivity with an oxide film. Subsequently, by performing the processes described with reference to FIGS. 10 to 13, SOI device 100 shown in FIG. 13 is obtained.

B-2. Action and Effect

According to the above-described fabricating method of the second embodiment, by performing channel stop implantation with an energy by which the channel stop layer is formed in SOI layer 3 through partial isolation oxide film PT2 having a small isolation step while leaving polysilicon film 21 and nitride film 22 on active region AR, channel stop layers N1 and P1 of high density can be formed in a self-aligned manner in the isolation regions. In this case, since a channel stop layer is not formed in SOI layer 3 corresponding to active region AR, the threshold value of a MOS transistor can be adjusted without a hitch, the source/drain layer of the MOS transistor or a depletion layer formed around the PN junction of the source/drain layer can be made reach buried oxide film 2. A semiconductor device in which deterioration in the transistor characteristics is prevented can be obtained.

By leaving polysilicon film 21 and nitride film 22 on SOI layer 3 corresponding to active region AR, the impurity ions used at the time of channel stop implantation remain in polysilicon film 21 and/or nitride film 22 and the possibility that the impurity ions reach SOI layer 3 is low. Consequently, the impurity ions are not vulnerable to a damage caused when passed through SOI layer 3, and the reliability of the gate insulating film to be formed on SOI layer 3 can be improved.

B-3. Modification

In the above description, the configuration of forming partial isolation oxide film PT2 with a reduced isolation step by a hydrofluoric acid (HF) process has been described. There may be a case that it is difficult to perform an accurate film thickness control by wet etching.

Figure 21:
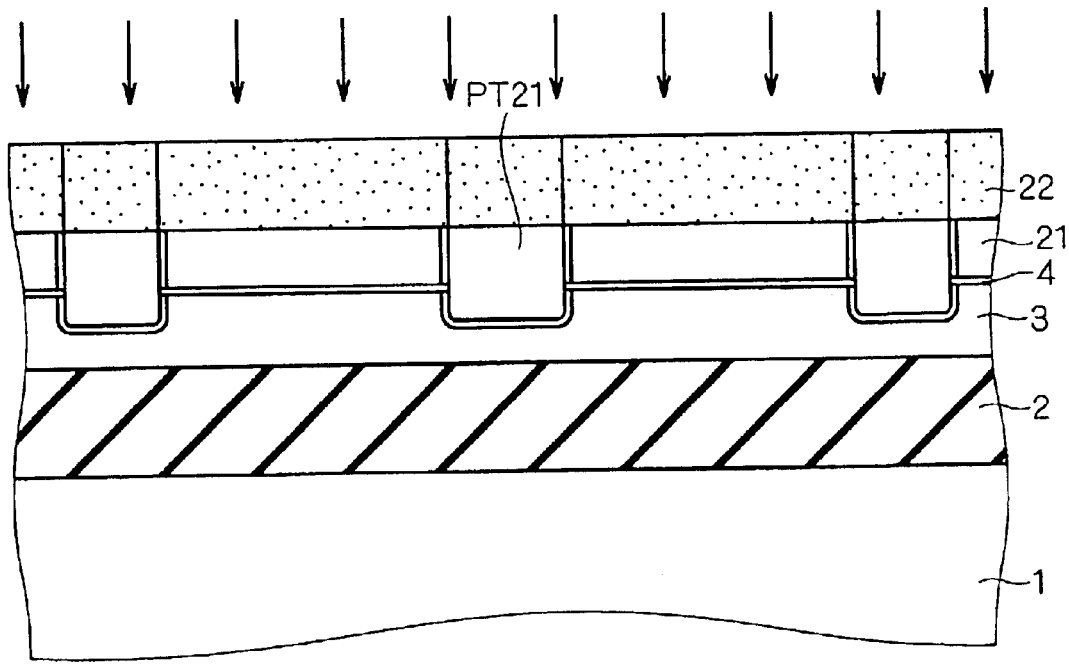
FIG. 21 is a cross section showing a method of fabricating a semiconductor device of a modification of the second embodiment according to the present invention.

As described above by referring to FIG. 18, in a state where oxide film OX2 on nitride film 22 is removed by CMP to form partial isolation oxide film PT21 in trench TR2, ions of an impurity such as B or As are implanted into partial isolation oxide film PT2. The implantation energy at this time is relatively low so that the range becomes 100 to 200 nm and a dose of $4\times10^{14}/cm^2$ or more. FIG. 21 shows a process of performing the ion implantation and a state where impurities are implanted into an upper part of partial isolation oxide film PT2 and also into nitride film 22.

By implanting impurities into partial isolation oxide film PT2, an etching rate to HF in the oxide film changes. In the HF process for setting an isolation step, the controllability of film thickness of the isolation oxide film can be improved.

Impurities may be diffused by performing heat treatment at 900 to 1200° C. for 5 to 60 seconds after the ion implantation.

C. Third Embodiment

In the second embodiment, the configuration of performing channel stop implantation in a state where polysilicon film 21 and nitride film 22 are left on active region AR has been described. The channel stop implantation may be also carried out by a method described hereinbelow.

C-1. Fabricating Method

With reference to FIGS. 22 to 27 as cross sections for sequentially showing a fabricating process, a fabricating method of a third embodiment according to the present invention will be described. The same components as those in the first and second embodiments described by referring to FIGS. 1 to 13 and FIGS. 14 to 20 are designated by the same reference numerals and their description will not be repeated.

Figure 22:
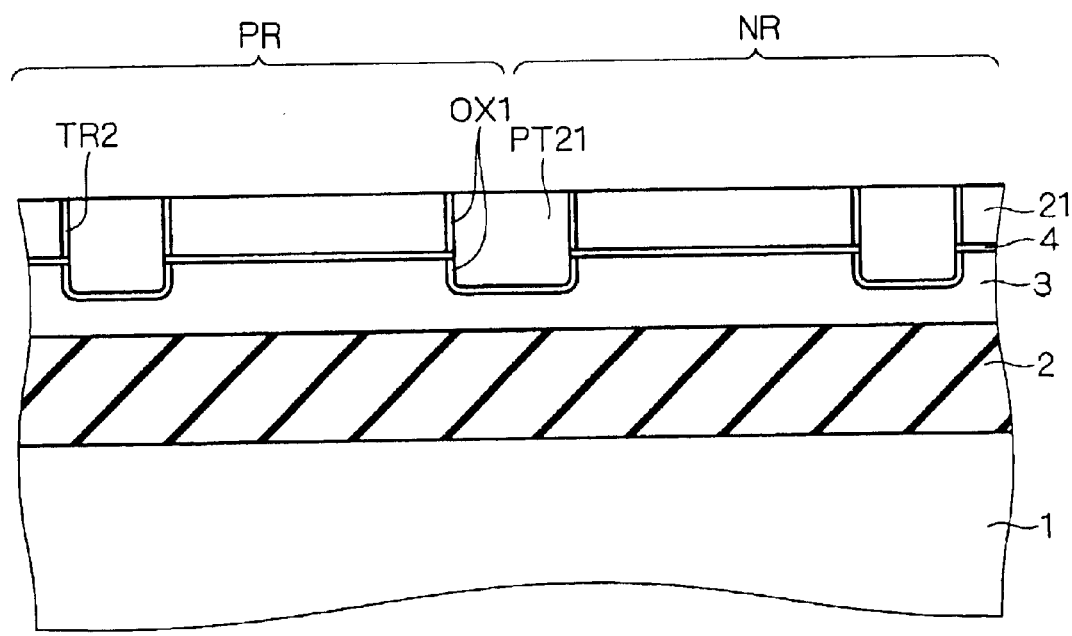
FIGS. 22 through 27 are cross sections showing a method of fabricating a semiconductor device of a third embodiment according to the present invention.

First, by performing the processes described with reference to FIGS. 14 to 17, oxide film OX2 in trench TR2 and removing oxide film OX2 on nitride film 22 and nitride film 22 by CMP. As shown in FIG. 22, the main surface of polysilicon film 21 can be exposed.

Figure 23:
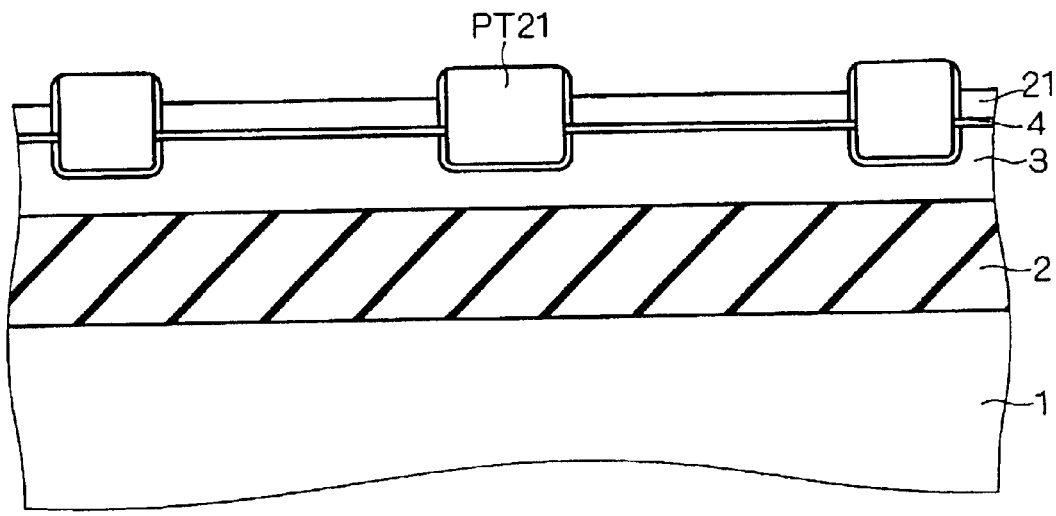

After that, etching is performed so that the thickness of polysilicon film 21 becomes 5 to 20 nm in the process shown in FIG. 23. By the etching, the level of the main surface of polysilicon film 21 becomes lower than that of the top face of partial isolation oxide film PT2, so that an isolation step is generated.

In this state, a resist mask RM31 is formed so that its opening corresponding to region PR in which a PMOS transistor is to be formed. By performing channel stop implantation with an energy by which a peak of an impurity profile is generated in SOI layer 3 through partial isolation oxide film PT21, channel stop layer N1 is formed in SOI layer 3 under partial isolation oxide film PT21, that is, in the isolation region.

An impurity to be implanted here is an N-type impurity. In the case of using phosphorus (P), implantation energy is set to, for example, 100 to 300 keV, and the density of channel stop layer N1 is set to $1\times10^{17}$ to $1\times10^{19}/cm^3$.

Figure 24:
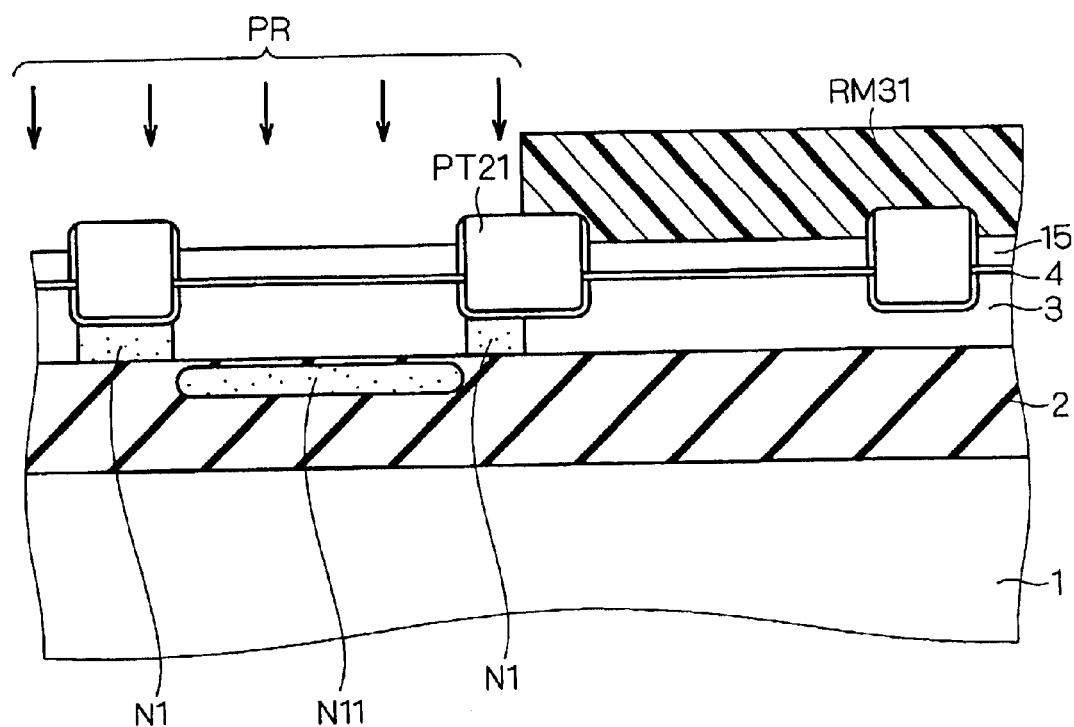

At this time, the thickness of polysilicon film 21 is set so that the impurities of channel stop implantation do not stop in SOI layer 3 corresponding to active region AR but are implanted into buried oxide film 2. FIG. 24 shows an example where impurity layer N11 is formed in buried oxide film 2 near the junction with SOI layer 3.

Figure 25:
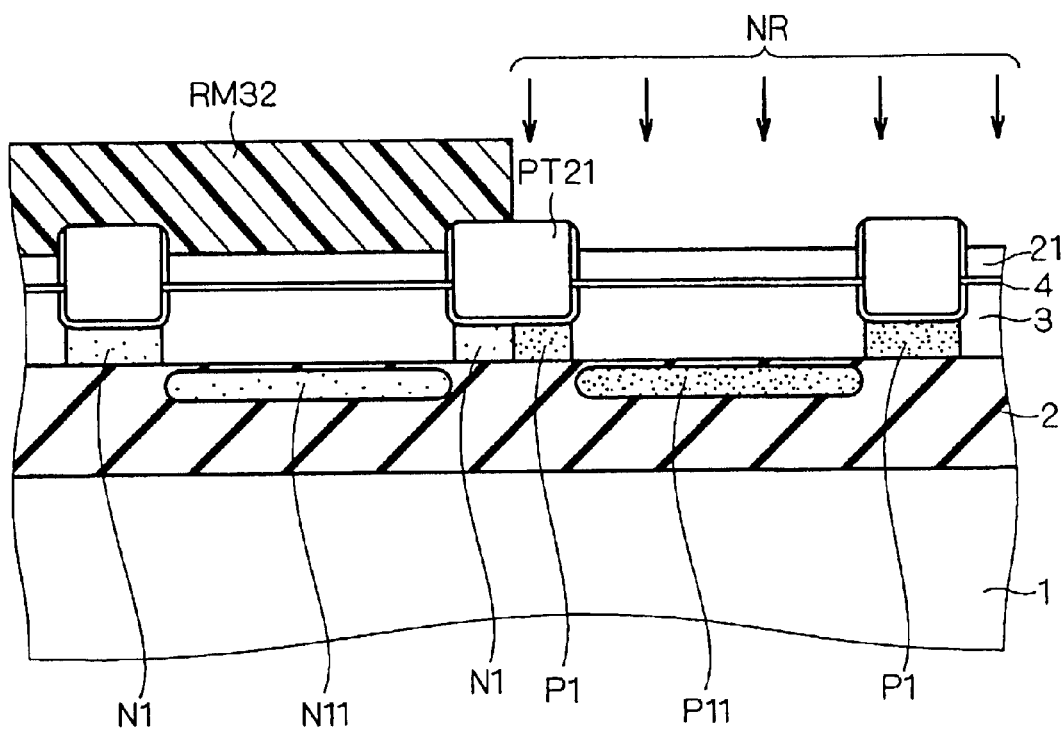

Subsequently, in a process shown in FIG. 25, a resist mask RM32 is formed so that is opening corresponds to region NR in which an NMOS transistor is to be formed. Channel stop implantation is carried out with an energy by which a peak of an impurity profile can be generated in SOI layer 3 through partial isolation oxide film PT2, thereby forming channel stop layer P1 in SOI layer 3 under partial isolation oxide film PT21, that is, the isolation region.

The impurity to be implanted here is a P-type impurity. In the case of using boron (B), implantation energy is set to, for example, 30 to 100 keV, and the density of channel stop layer P1 is set to $1\times10^{17}$ to $1\times10^{19}/cm^3$.

At this time, the thickness of polysilicon film 21 is set so that the impurities of channel stop implantation do not stop in SOI layer 3 corresponding to active region AR but are implanted into buried oxide film 2. FIG. 25 shows an example where impurity layer P11 is formed in buried oxide film 2 near the junction with SOI layer 3.

Figure 26:
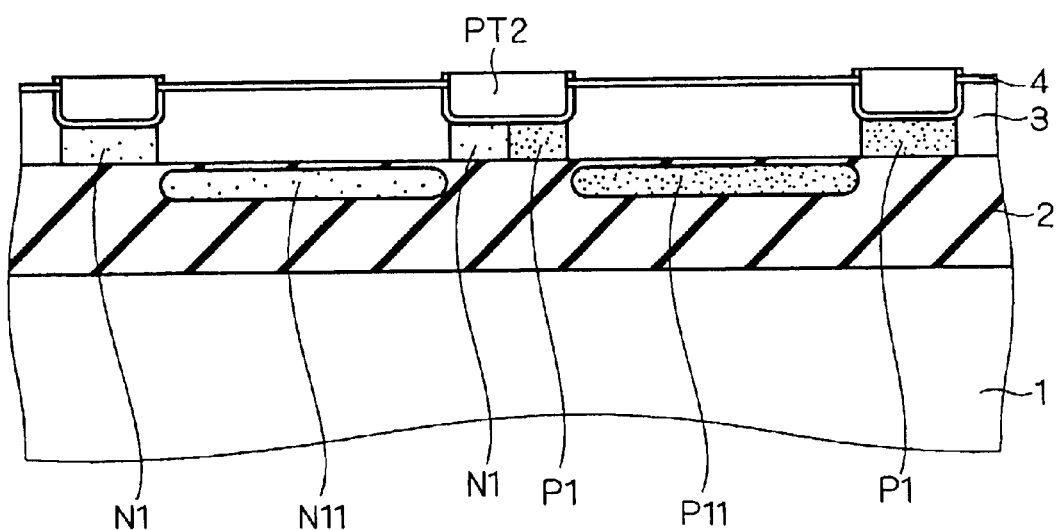

In a process shown in FIG. 26, partial isolation oxide film PT21 and internal-wall oxide film OX1 are etched by a hydrofluoric acid (HF) process, thereby forming a partial isolation oxide film PT2 with a reduced isolation step. After that, polysilicon film 21 on oxide film 4 is removed by wet etching or dry etching having selectivity with an oxide film.

Figure 27:
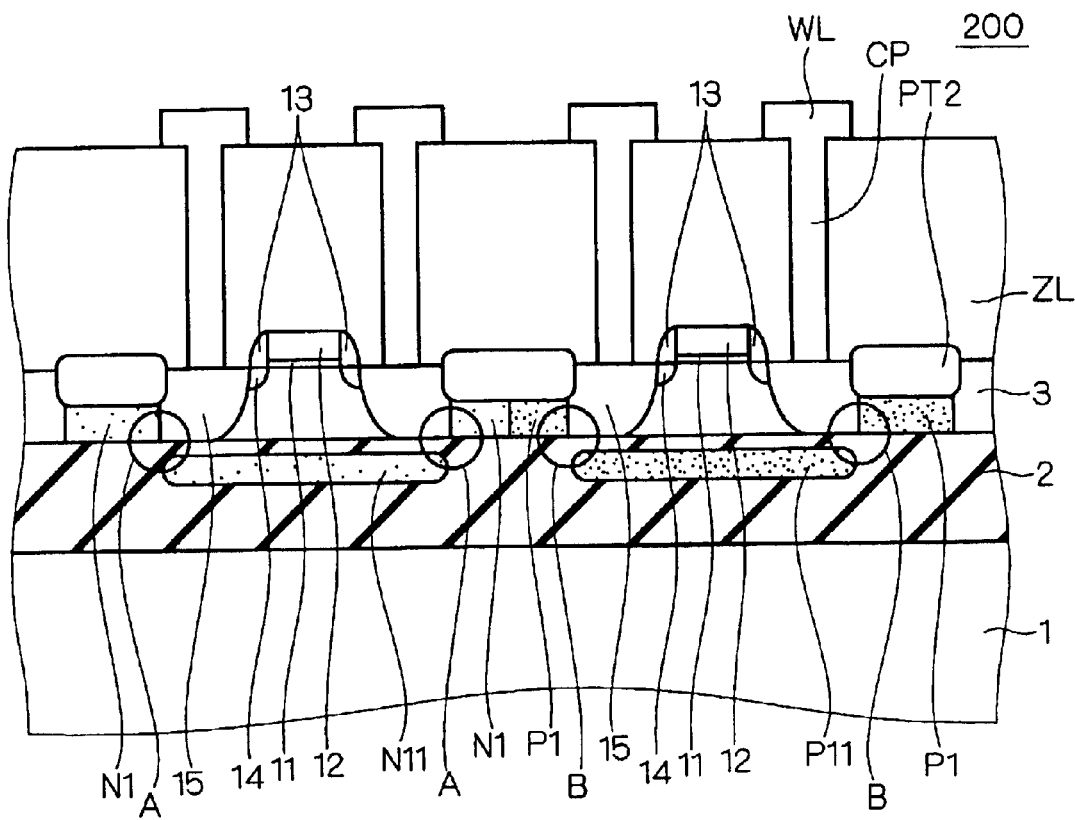

Subsequently, by performing the processes described with reference to FIGS. 10 to 13, an SOI device 200 shown in FIG. 27 is obtained.

C-2. Action and Effect

According to the above-described fabricating method of the third embodiment, by performing channel stop implantation with an energy by which the channel stop layer is formed in SOI layer 3 through partial isolation oxide film PT21 having a relatively small isolation step while leaving thin polysilicon film 21 on active region AR, channel stop layers N1 and P1 of high density can be formed in a self-aligned manner in the isolation regions. In this case, since a channel stop layer is not formed in SOI layer 3 corresponding to active region AR, the threshold value of a MOS transistor can be adjusted without a hitch, the source/drain layer of the MOS transistor or a depletion layer formed around the PN junction of the source/drain layer can be made reach buried oxide film 2. A semiconductor device in which deterioration in the transistor characteristics is prevented can be obtained.

By the impurities passed through SOI layer 3, in buried oxide film 2 of regions PR and NR, impurity layers N11 and P11 are formed, respectively. Both impurity layers N11 and P11 are formed in buried oxide film 2 near the junction with SOI layer 3, and the edges of each of impurity layers N11 and P11 exist near the ends of channel stop layers N1 and N1.

As a result, in portions A as the end portions of channel stop layer N1 and portions B as the end portions of channel stop layer P2 shown in FIG. 27, by various heat treatments in a wafer process, the channel stop impurities can be prevented from being absorbed by buried oxide film 2. Even if the channel stop impurities are absorbed by partial isolation oxide film PT2, the absorbed impurities are compensated by diffusion of impurities in impurity layers N11 and P11. Therefore, the concentration of the impurities in channel stop layers N1 and P1 can be maintained to be high, and generation of a parasite transistor can be suppressed in this portion.

D. Fourth Embodiment

Although the configuration of performing the channel stop implantation in the direction almost perpendicular to the main surface of the SOI substrate has been described in the first to third embodiments, the channel stop implantation which is oblique implantation or oblique rotation implantation may be carried out.

D-1. Fabricating Method

Figure 28:
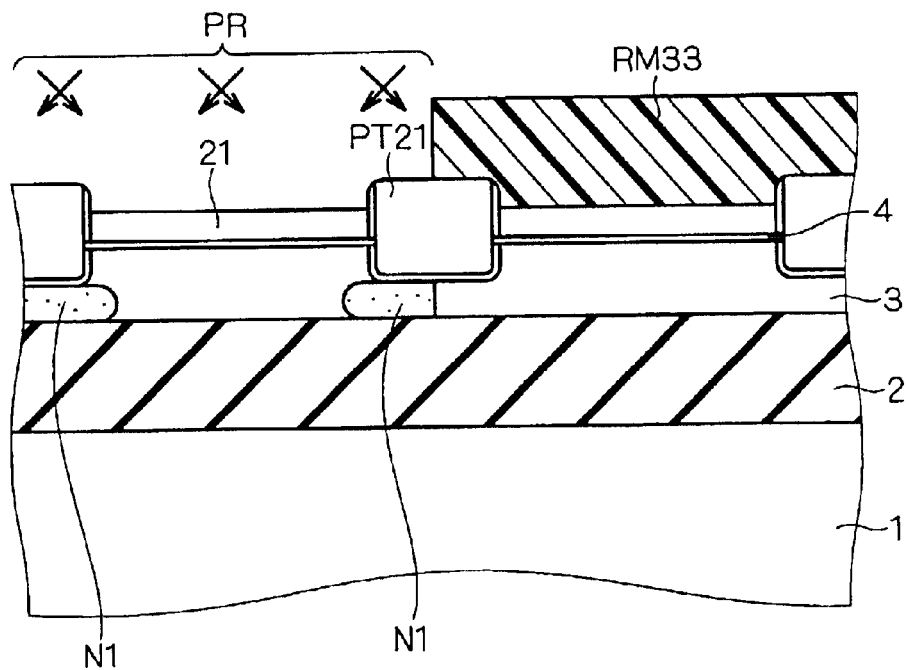
FIGS. 28 through 30 are cross sections showing a method of fabricating a semiconductor device of a fourth embodiment according to the present invention.
Figure 29:
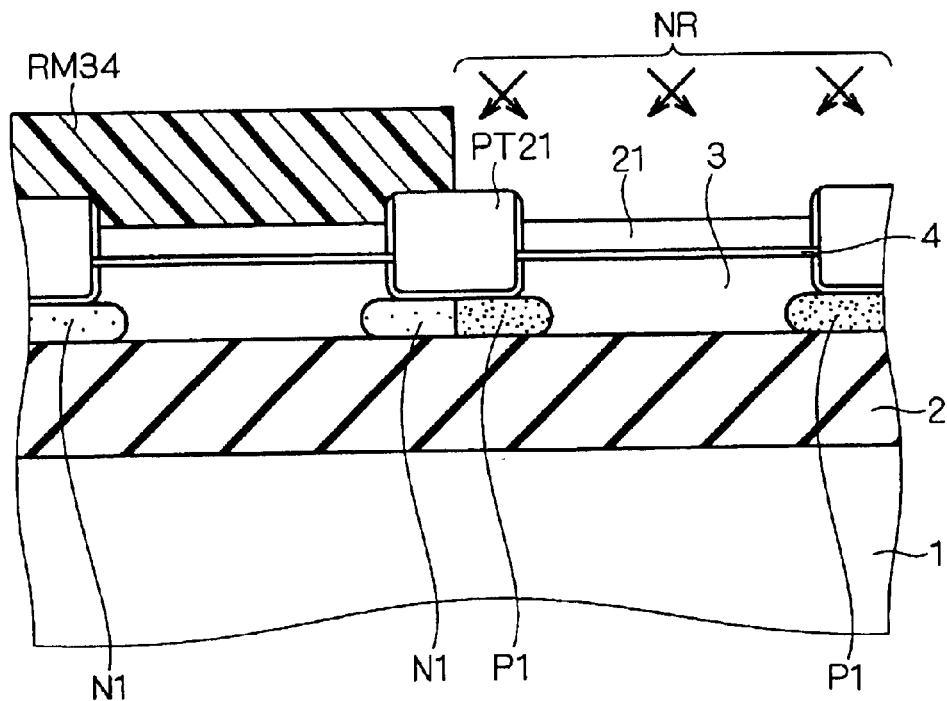
Figure 30:
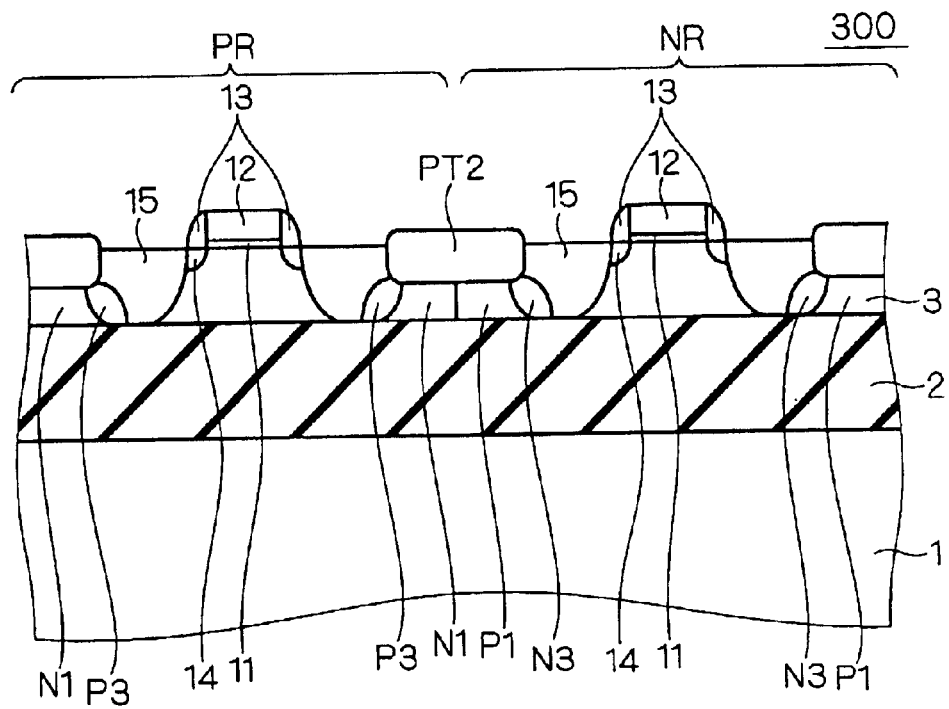

With reference to FIGS. 28 to 30 as cross sections for sequentially showing a fabricating process, a fabricating method of a fourth embodiment according to the present invention will be described. The same components as those in the third embodiment described by referring to FIGS. 22 to 27 are designated by the same reference numerals and their description will not be repeated.

First, by performing the processes described with reference to FIGS. 22 and 23, the configuration is obtained such that the level of the main surface of polysilicon film 21 becomes lower than that of the top face of partial isolation oxide film PT2 and an isolation step is generated.

In this state, a resist mask RM33 is formed so that its opening corresponding to region PR in which a PMOS transistor is to be formed. By performing channel stop implantation with an energy by which a peak of an impurity profile is generated in SOI layer 3 through partial isolation oxide film PT21, a channel stop layer is formed in SOI layer 3 under partial isolation oxide film PT21, that is, in the isolation region. An impurity to be implanted here is an N-type impurity. In the case of using phosphorus (P), implantation energy is set to, for example, 100 to 300 keV, and the density of channel stop layer N1 is set to $1 \times 10^{17}$ to $1 \times 10^{19}/cm^3$.

Subsequently, by implanting the impurity ions in a state where the SOI substrate is tilted, channel stop layer N1 extending not only to a part under partial isolation oxide film PT21 but also into SOI layer 3 in active region AR can be formed. Implantation parameters in this case may be substantially the same as the above-described parameters. The implantation may be also carried out while rotating the impurity ions in a state where the SOI substrate is tilted.

The portion extending into SOI layer 3 in active region AR, of channel stop layer N1 may be very small. The implantation angle is set so that channel stop layer N1 does not extend into the whole area in SOI layer 3 in active region AR.

Subsequently, in a process shown in FIG. 29, a resist mask RM34 is formed so that is opening corresponds to region NR in which an NMOS transistor is to be formed. Channel stop implantation is carried out with an energy by which a peak of an impurity profile can be generated in SOI layer 3 through partial isolation oxide film PT21, thereby forming channel stop layer in SOI layer 3 under partial isolation oxide film PT21, that is, the isolation region.

The impurity to be implanted here is a P-type impurity. In the case of using boron (B), implantation energy is set to, for example, 30 to 100 keV, and the density of channel stop layer P1 is set to $1 \times 10^{17}$ to $1 \times 10^{19}/cm^3$.

Subsequently, by implanting impurity ions in a state where the SOI substrate is tilted, channel stop layer P1 extending not only to the part under partial isolation oxide film PT21 but also into SOI layer 3 in active region AR can be formed. Implantation parameters in this case may be substantially the same as the above-described parameters. The implantation may be also carried out while rotating the impurity ions in a state where the SOI substrate is tilted.

The portion extending into SOI layer 3 in active region AR, of channel stop layer P1 may be very small. The implantation angle is set so that channel stop layer P1 does not extend into the whole area in SOI layer 3 in active region AR.

After that, by performing the processes described with reference to FIGS. 26 and 27, an SOI device 300 shown in FIG. 30 is obtained.

In FIG. 30, in the junction between source/drain layer 15 and channel stop layers N1 and P1 in each of MOS transistors in regions PR and NR, a P-type low-density impurity layer P3 and an N-type low-density impurity layer N3 each having the same conduction type as that of source/drain layer 15 to which channel stop layers N1 and P1 are connected and having impurity concentration lower than that of source/drain layer 15 are formed.

The area is the area formed by compensating the impurity in the extended portions in SOI layer 3 in active region AR, of channel stop layers N1 and P1 with the impurity by source/drain implantation.

D-2 Action and Effect

By providing such low-concentration impurity layers P3 and N3, source/drain layer 15 and channel stop layers N1 and P1 having different conduction types and having high-concentration implantation impurities can be prevented from being in direct contact with each other. Thus, a leak current in the PN junction is lessened and more excellent junction characteristic can be obtained.

When the impurity concentration in each of channel stop layers N1 and P1 is higher than that of source-drain layer 15 with which the layers N1 and P1 are in contact, the conduction type of the low-concentration impurity layer becomes opposite, an n-type low-concentration impurity layer is formed in region PR, and a p-type low-concentration impurity layer is formed in region NR.

Although the configuration in which the channel stop implantation performed in a direction almost perpendicular to the main surface of the SOI substrate and oblique implantation or oblique rotating implantation performed in a state where the SOI substrate is tilted are combined has been described in the foregoing fourth embodiment, the channel stop implantation may be carried out only by oblique implantation or oblique rotating implantation in a state where the SOI substrate is tilted.

E. Fifth Embodiment

Although the configuration of thinly leaving polysilicon film 21 on active region AR and performing channel stop implantation via partial isolation oxide film PT21 having a relatively small isolation step has been described in the third embodiment, channel stop implantation may be performed by a method described hereinbelow.

E-1 Fabricating Method

Figure 31:
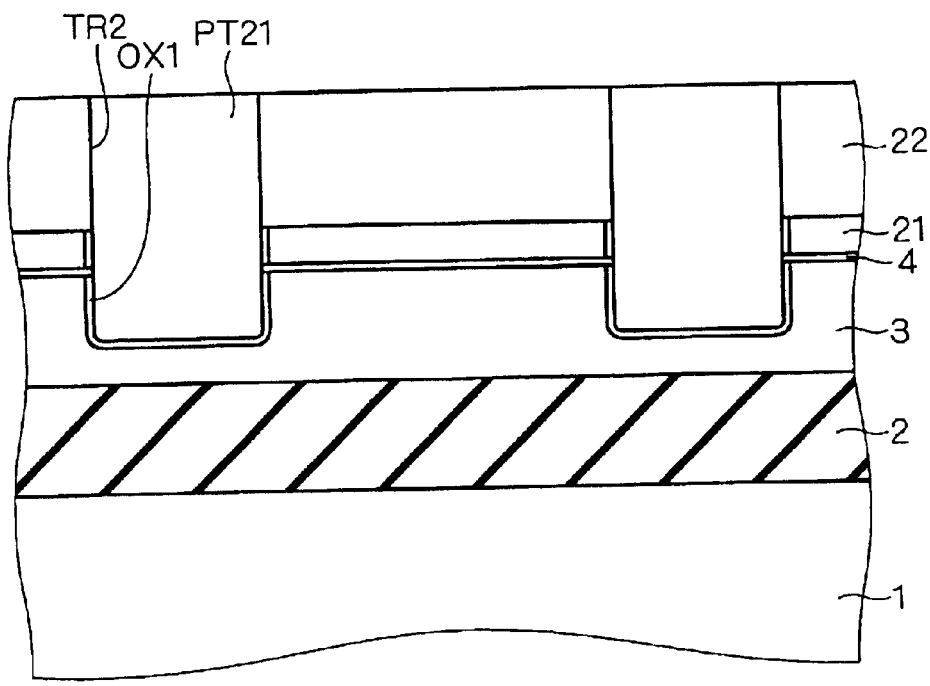
FIGS. 31 and 32 are cross sections showing a method of fabricating a semiconductor device of a fifth embodiment according to the present invention.
Figure 32:
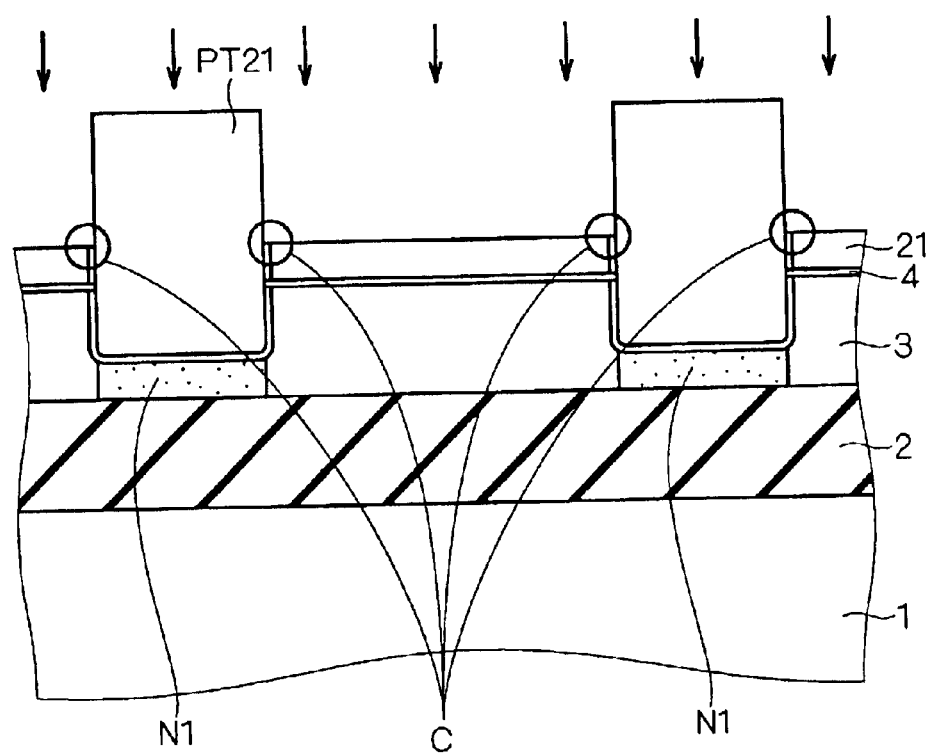

With reference to FIGS. 31 and 32 as cross sections for sequentially showing a fabricating process, a fabricating method of a fifth embodiment according to the present invention will be described. The same components as those in the second embodiment described by referring to FIGS. 14 to 20 are designated by the same reference numerals and their description will not be repeated. In the fifth to ninth embodiments described hereinbelow, for simplicity, only region PR in which a PMOS transistor is formed will be described.

First, by performing the processes described with reference to FIGS. 14 to 17, trench TR2 is field with oxide film OX2, and oxide film OX2 on nitride film 22 is removed by CMP, thereby exposing the principal face of nitride film 22 as shown in FIG. 31.

In a process shown in FIG. 32, nitride film 22 is removed by thermal phosphoric acid, and a configuration is obtained such that partial isolation oxide film PT21 is projected from the main surface of polysilicon film 21 is obtained. An isolation step almost equal to the thickness of nitride film 22 is generated.

By performing channel stop implantation with an energy by which a peak of an impurity profile is generated in SOI layer 3 through partial isolation oxide film PT21, channel stop layer N1 is formed in SOI layer 3 under partial isolation oxide film PT21, that is, in the isolation region.

An impurity to be implanted here is an N-type impurity. In the case of using phosphorus (P) (in the case of forming a PMOS transistor), implantation energy is set to, for example, 150 to 500 keV. In the case of using boron (B) (in the case of forming an NMOS transistor), the implantation energy is set to, for example, 60 to 250 keV, and the density of channel stop layer N1 is set to $1 \times 10^{17}$ to $1 \times 10^{19}/cm^3$.

In SOI layer 3 corresponding to active region AR at this time, the thickness of polysilicon film 21 is set so that the impurities of channel stop implantation are not stopped but implanted into buried oxide film 2 and silicon substrate 1 under buried oxide film 2.

E-2. Action and Effect

According to the above-described fabricating method of the fifth embodiment, partial isolation oxide film PT21 having a large isolation step is formed and channel stop implantation is performed through partial isolation oxide film PT21, thereby enabling channel stop layer N1 of high density to be formed in a self-aligned manner in the isolation region. In this case, since a channel stop layer is not formed in SOI layer 3 corresponding to active region AR, the threshold value of a MOS transistor can be adjusted without a hitch, the source/drain layer of the MOS transistor or a depletion layer formed around the PN junction of the source/drain layer can be made reach buried oxide film 2. A semiconductor device in which deterioration in the transistor characteristics is prevented can be obtained.

E-3. Modification 1

In the fabricating method of the above-described fifth embodiment, as described by referring to FIG. 32, partial isolation oxide film PT21 is projected from the main surface of polysilicon film 21. In this case, the boundary portion (portion C in FIG. 32) of polysilicon film 21, inner wall oxide film OX1, and partial isolation oxide film PT21 is influenced by dry etching performed for removing partial isolation oxide film PT21. In some cases, inner wall oxide film OX1 and partial isolation oxide film PT21 in the portion are excessively removed, and the edge of partial isolation oxide film PT2 finally obtained is recessed. The more the phenomenon is conspicuous, the more the side wall of partial isolation oxide film PT21 becomes perpendicular. On the contrary, when the side wall of partial isolation oxide film PT21 is tapered so as to be widened upward, a recess is not easily caused. However, it is difficult to form partial isolation oxide film PT21 in the tapered shape intentionally with high reproducibility.

Figure 33:
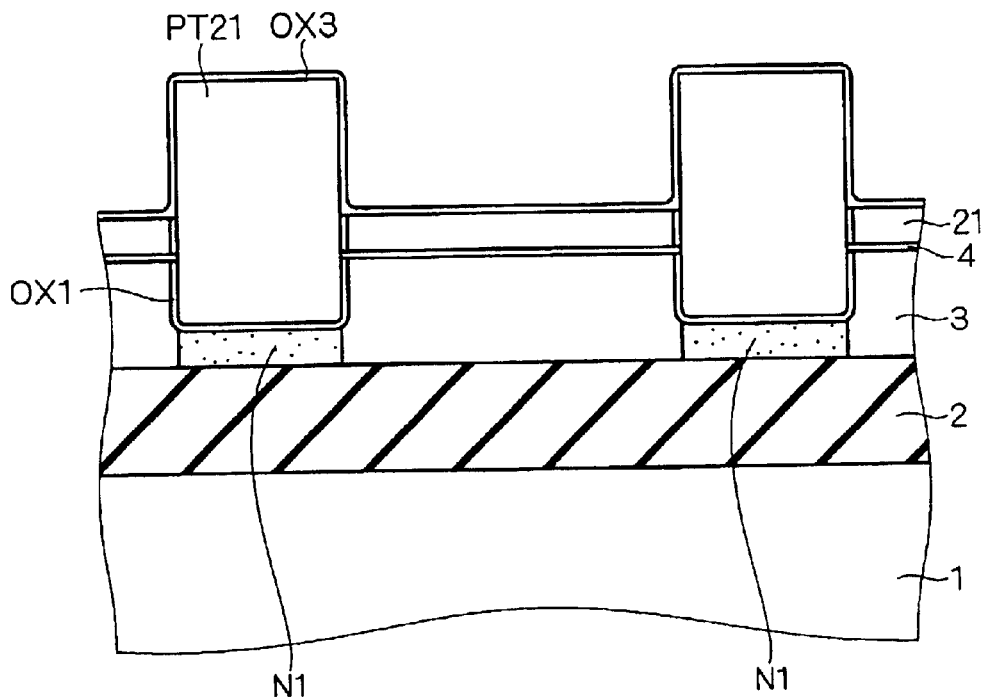
FIGS. 33 through 48 are cross sections showing a method of a modification of the fifth embodiment according to the present invention.
Figure 34:
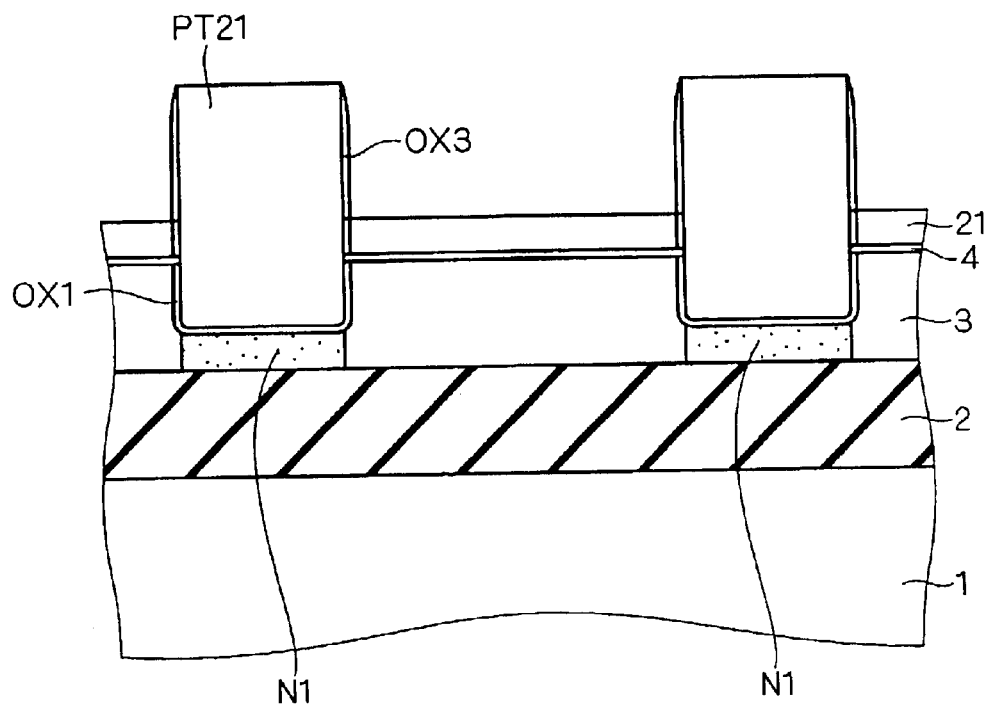
Figure 35:
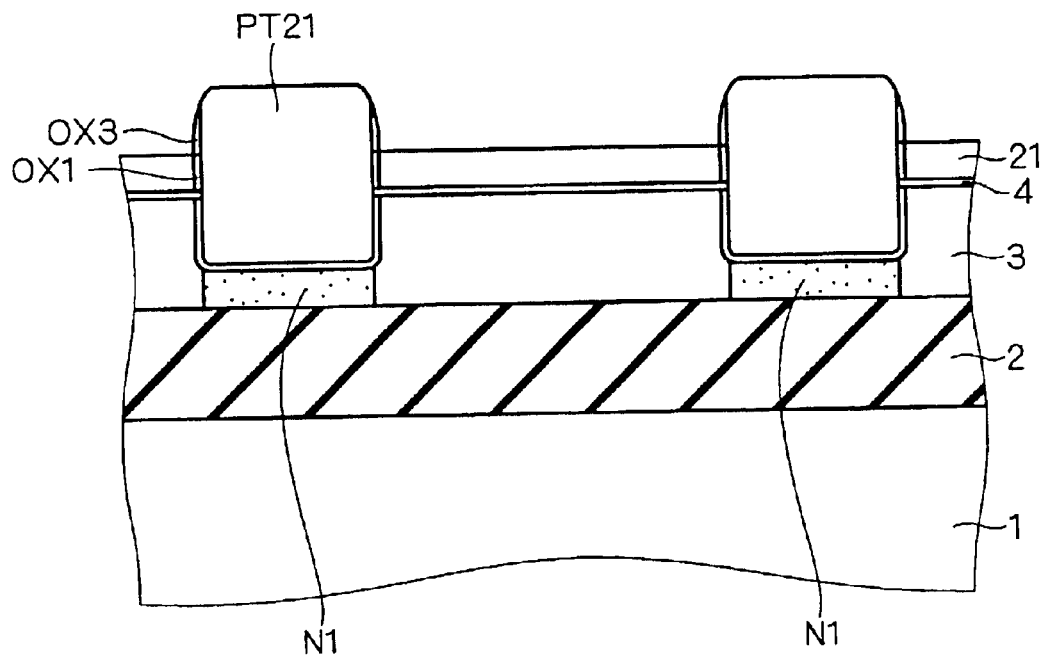
Figure 36:
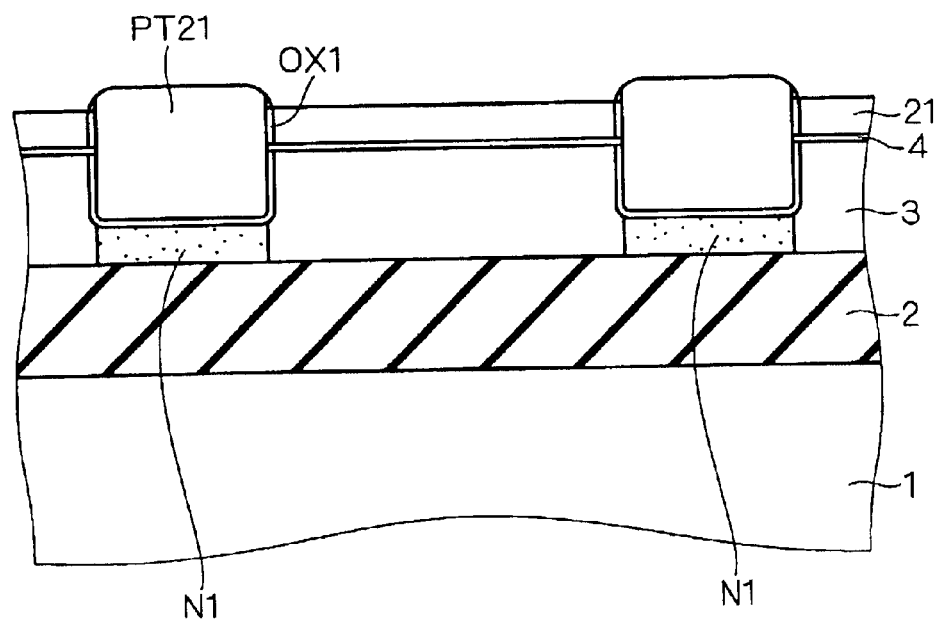
Figure 37:
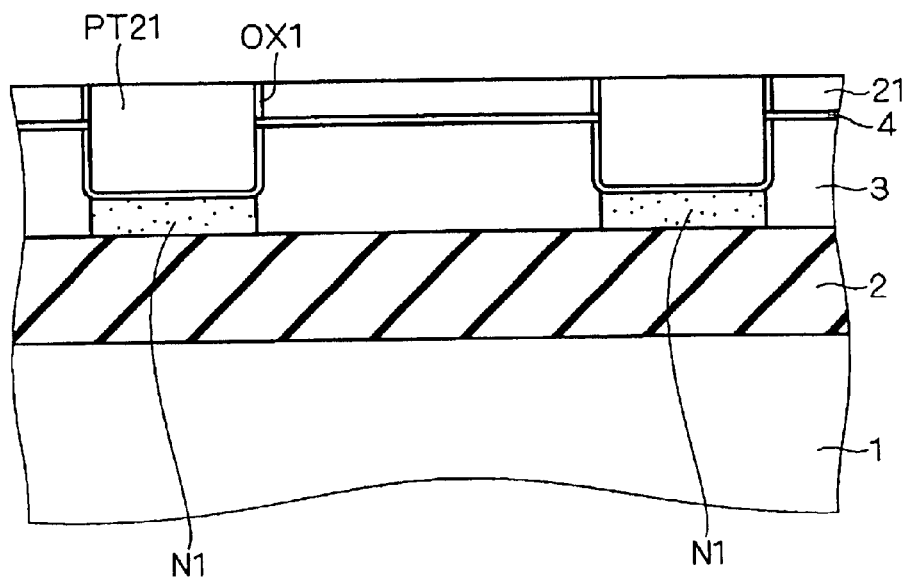

Alternately, as shown in FIG. 33, the excessive etching on the portion C in FIG. 32 may be prevented by forming an oxide film OX3 having a thickness of 20 nm so as to cover the whole face of polysilicon film 21 and covering the portion projected from the main surface of polysilicon film 21 of partial isolation oxide film PT21. Oxide film OX3 may be formed by, for example, using TEOS (tetra ethyl orthosilicate) by CVD.

FIGS. 34 to 37 sequentially show the process of removing the projected portion of partial isolation oxide film PT21 covered with oxide film OX3 by dry etching, and clearly show the mechanism that because of the existence of oxide film OX3 formed on the projected portion of partial isolation oxide film PT21, the boundary portion of polysilicon film 21, inner wall oxide film OX1, and partial isolation oxide film PT21 is protected, and the portion is prevented from being excessively etched.

As a result, the peripheral portion of partial isolation oxide film PT2 finally obtained is prevented from being recessed.

When the peripheral portion of partial isolation oxide film PT2 is recessed, at the time of forming a gate electrode and a gate insulating film so as to be engaged with partial isolation oxide film PT2, the gage electrode and gate insulating film are formed in the portion. The sectional shape becomes complicated and the threshold value of a transistor deteriorates due to a narrow channel effect. The thickness of the gate insulating film in the peripheral portion of partial isolation oxide film PT4 becomes thin, and a problem such that the withstand voltage characteristic of the gate electrode deteriorates occurs.

However, according to the fabricating method of Modification 1, the peripheral portion of partial isolation oxide film PT2 is prevented from being recessed. Consequently, occurrence of problems as described above can be prevented, and the manufacturing yield of the semiconductor device can be improved.

E-4. Modification 2

Figure 38:
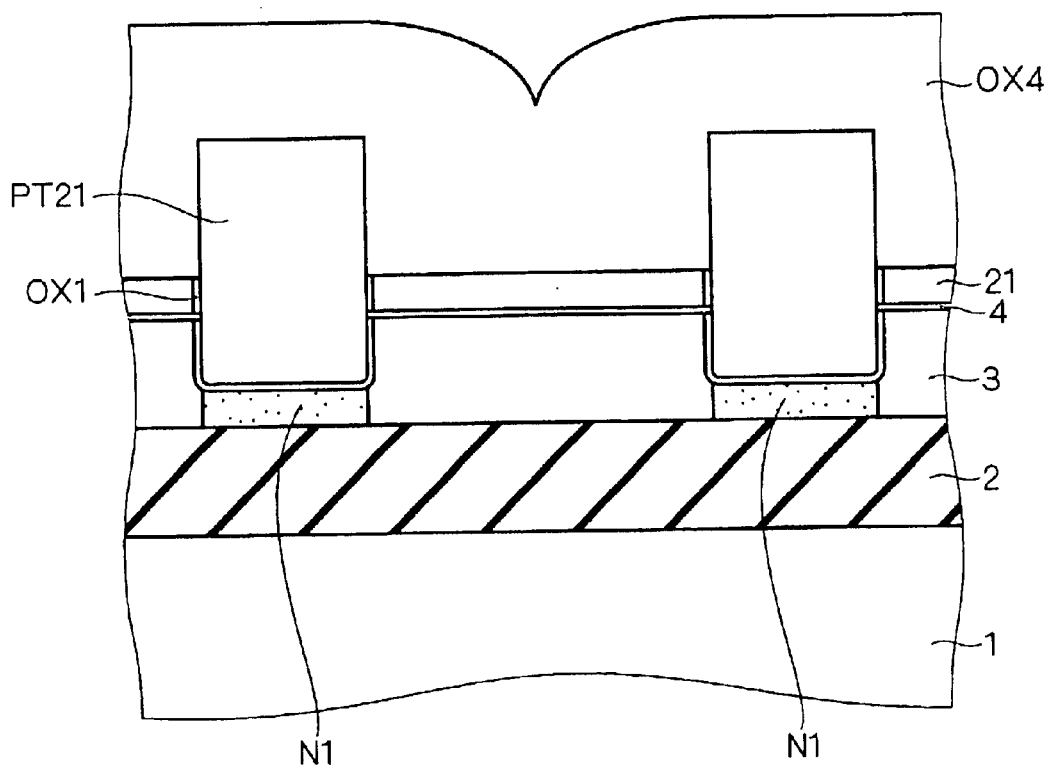

As the configuration for preventing excessive etching on the portion C shown in FIG. 32, a configuration as shown in FIG. 38 may be also employed.

Specifically, as shown in FIG. 38, by forming oxide film OX4 having a thickness almost equal to the height of the projected portion of partial isolation oxide film PT21 on the whole face of polysilicon film 21, partial isolation oxide film PT21 is completely covered. The height of the projected portion of partial isolation oxide film PT21 is almost equal to the thickness of nitride film 22 removed in the process shown in FIG. 32 and is 100 to 200 nm. It is sufficient to form oxide film OX4 by using TEOS by CVD.

Figure 39:
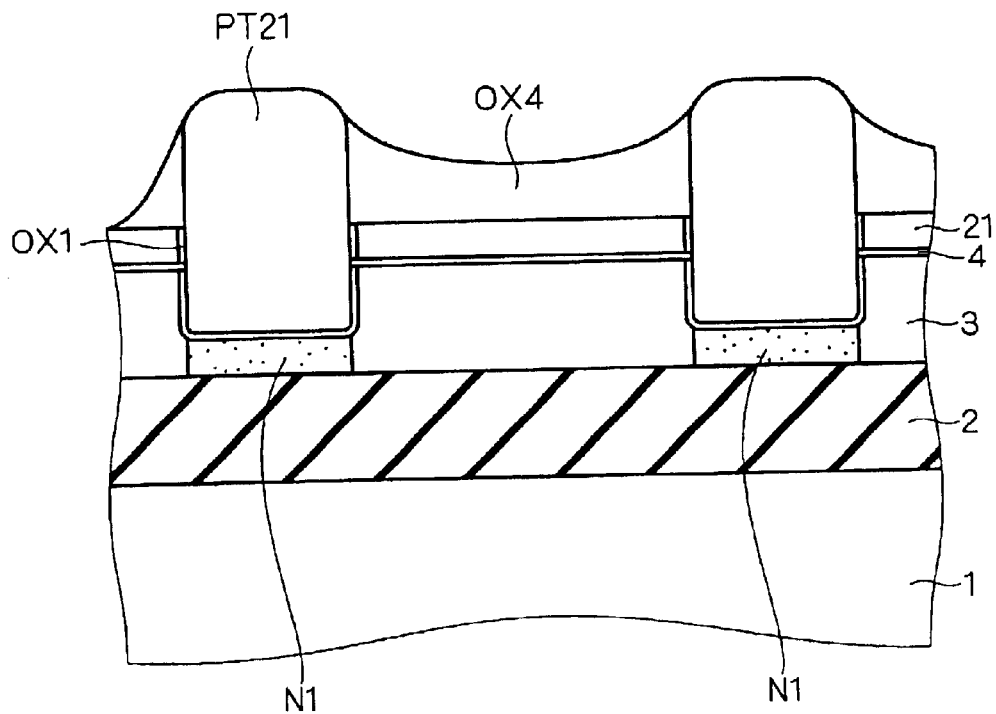
Figure 40:
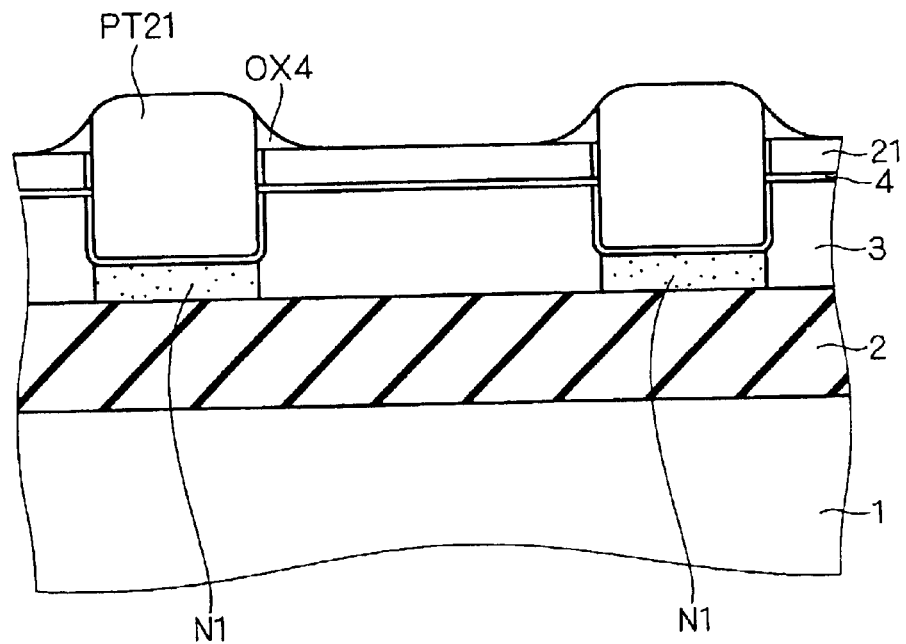
Figure 41:
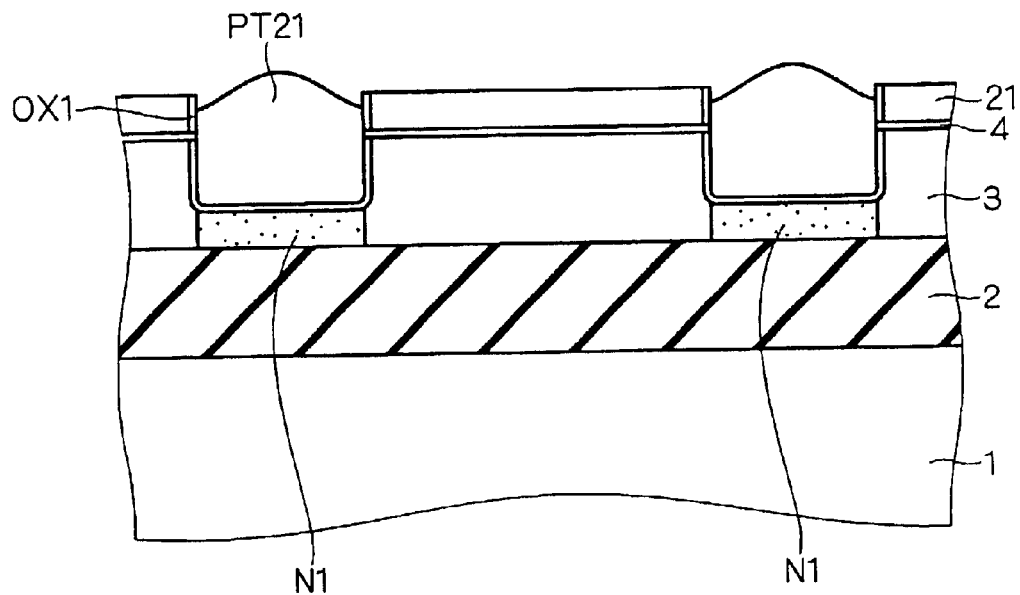

FIGS. 39 to 41 sequentially show the process of removing oxide film OX4 and the projected portion of partial isolation oxide film PT21 covered with oxide film OX4 and clearly show the mechanism that because of the existence of oxide film OX4, the boundary portion of polysilicon film 21, inner wall oxide film OX1, and partial isolation oxide film PT21 is protected, and the portion is prevented from being excessively etched.

In FIG. 41, the center portion of partial isolation oxide film PT21 gently rises, and the peripheral portion is gently recessed. Such a shape may be canceled by a subsequent etching process. Even if a very small recess occurs in the peripheral portion of partial isolation oxide film PT2 finally obtained, since the contour is smooth, no problem occurs.

E-5. Modification 3

After forming oxide film OX4 having a thickness almost equal to the height of the projected portion of partial isolation oxide film PT21 on the whole face of polysilicon film 21 to completely cover partial isolation oxide film PT21 as shown in FIG. 38, it is also possible to shape the counter of oxide film OX4 by dry etching and remove oxide film OX4 and partial isolation oxide film PT21 by wet etching.

Figure 42:
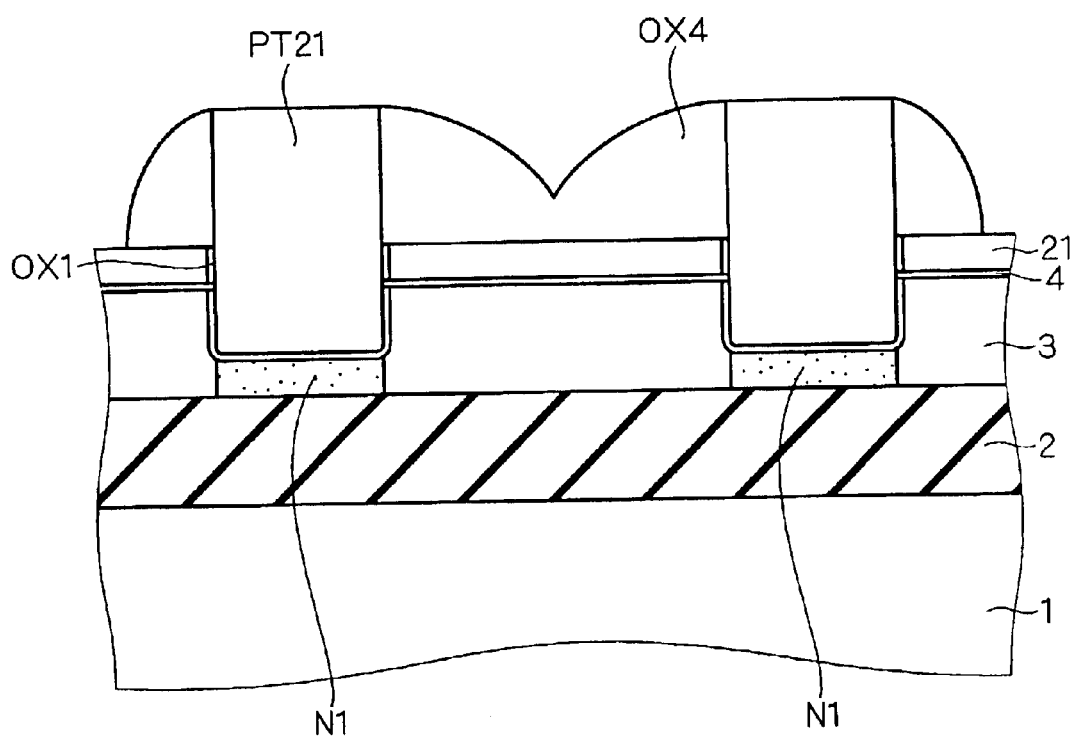

FIG. 42 shows a state where oxide film OX4 covering the whole face of polysilicon film 21 is subjected to dry etching to thereby expose the top face of partial isolation oxide film PT21. This structure corresponds to the structure (side wall structure) of forming a side wall space of oxide film OX4 on the side faces of partial isolation oxide film PT21. By performing wet etching in such a state, etching is carried out uniformly.

Figure 43:
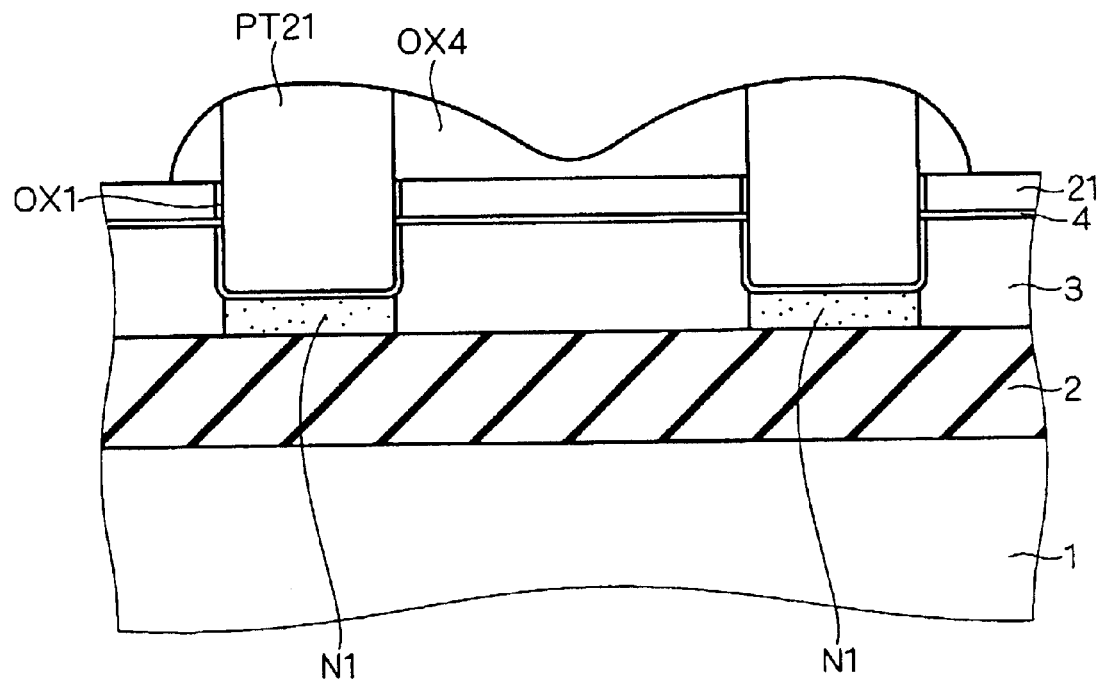
Figure 44:
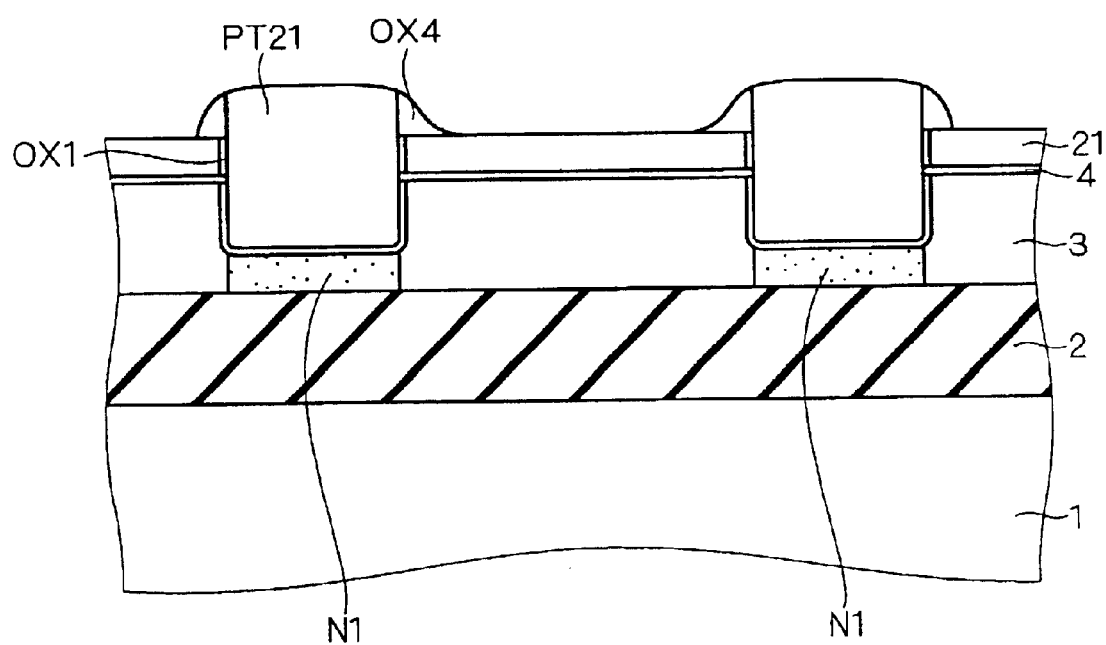
Figure 45:
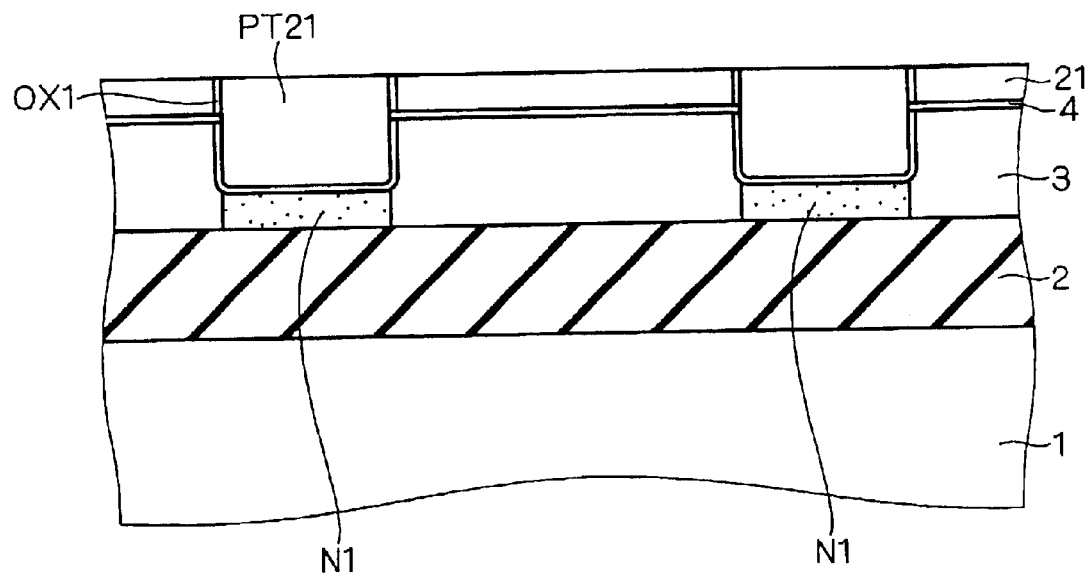

FIGS. 43 to 45 sequentially show the process of removing oxide film OX4 and the projected portion of partial isolation oxide film PT21 covered with oxide film OX4 by wet etching and clearly show the mechanism that because of the existence of oxide film OX4, the boundary portion of polysilicon film 21, inner wall oxide film OX1, and partial isolation oxide film PT21 is protected, and the portion is prevented from being excessively etched.

By employing the side wall structure, etching is performed uniformly, and the peripheral portion of partial isolation oxide film PT21 can be prevented from being recessed even a little.

E-6. Modification 4

Figure 46:
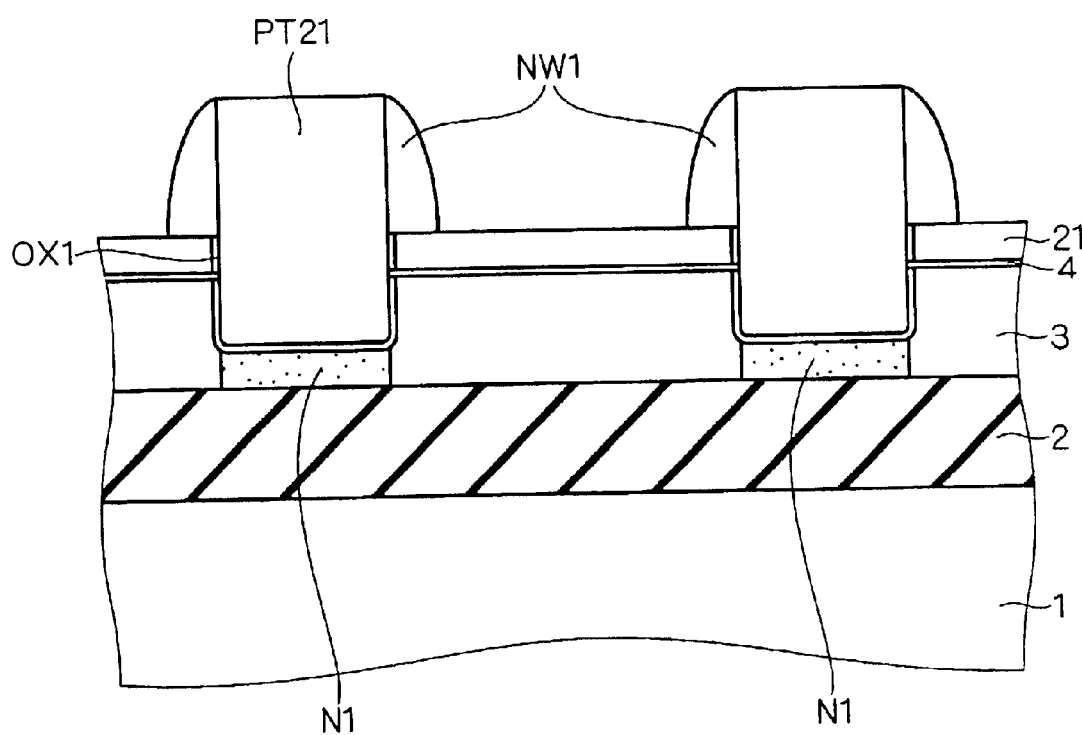

As a configuration for preventing excessive etching on the portion C shown in FIG. 32, a configuration as shown in FIG. 46 may be employed.

Specifically, as shown in FIG. 46, a side wall spacer NW1 of a nitride film is formed on side faces of partial isolation oxide film PT21, and partial isolation oxide film PT21 may be subjected to wet etching in such a state.

Figure 47:
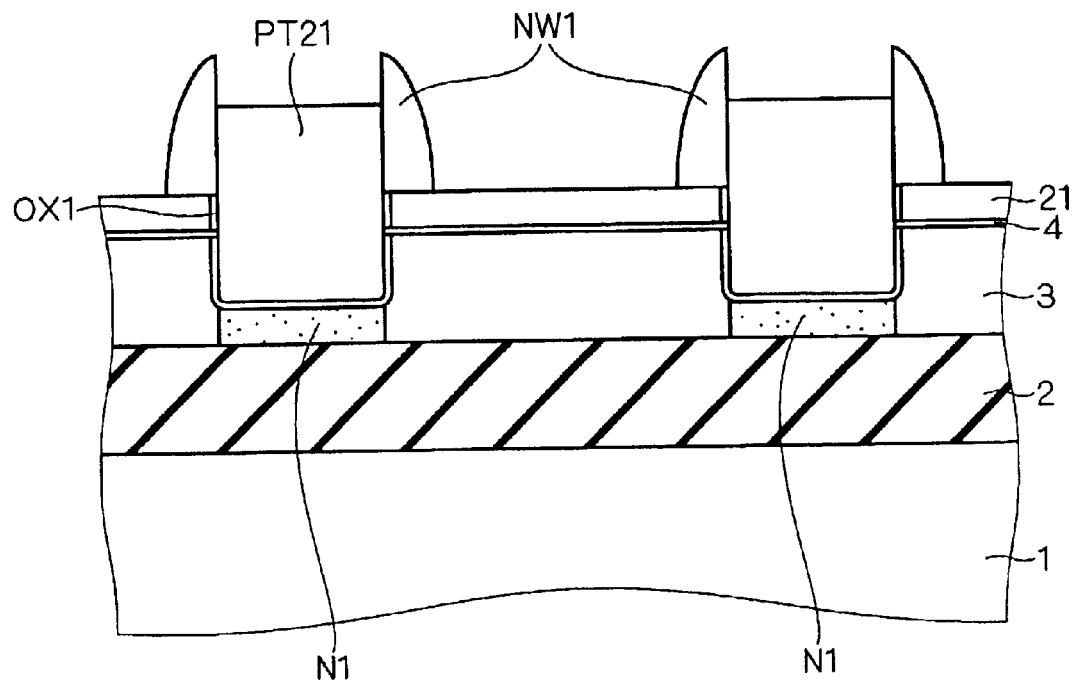
Figure 48:
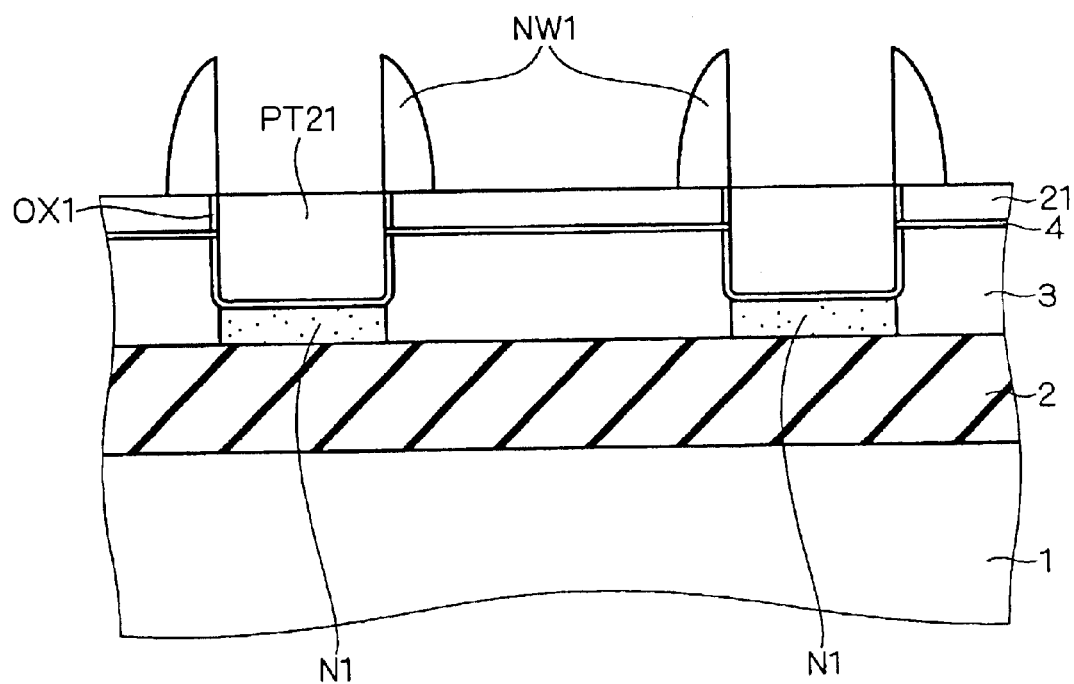

FIGS. 47 and 48 sequentially show the process of removing partial isolation oxide film PT21 surrounded by side wall spacer NW1 by wet etching using hydrofluoric acid or the like and clearly show the mechanism that because of the existence of side wall spacer NW1, the boundary portion of polysilicon film 21, inner wall oxide film OX1, and partial isolation oxide film PT21 is protected, and the portion is prevented from being excessively etched.

As shown in FIG. 48, at the time point when all the portion projected from the polysilicon film 21 of partial isolation oxide film PT21 is removed, etching is stopped and, subsequently, side wall spacer NW1 is removed by thermal phosphoric acid.

By employing such a configuration, partial isolation oxide film PT21 is uniformly etched, and the peripheral portion of partial isolation oxide film PT21 is prevented from being recessed even a little.

To prevent occurrence of a recess by excessive etching on the portion C shown in FIG. 32, a method of removing the projected portion of partial isolation oxide film PT21 by CMP may be also employed.

F. Sixth Embodiment

F-1. Fabricating Method

With reference to FIGS. 49 to 54 as cross sections for sequentially showing a fabricating process, a fabricating method of a sixth embodiment according to the present invention will be described. The same components as those in the first embodiment described by referring to FIGS. 1 to 13 are designated by the same reference numerals and their description will not be repeated.

Figure 49:
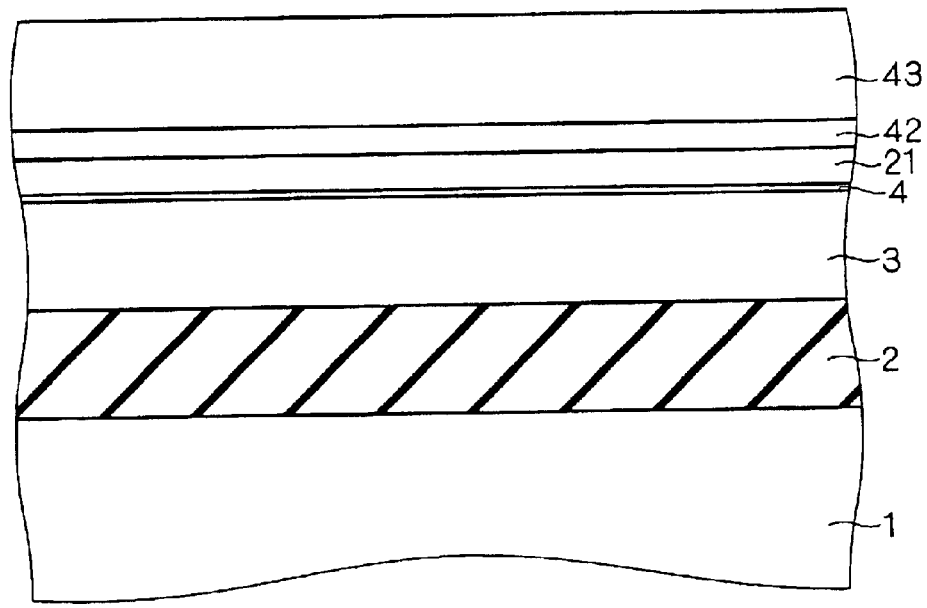
FIGS. 49 through 54 are cross sections showing a method of fabricating a semiconductor device of a sixth embodiment according to the present invention.

First, as shown in FIG. 49, an SOI substrate is prepared and oxide film 4 is formed on the SOI substrate. A polysilicon film 41 having a thickness of 10 to 100 nm (100 to 1000 Å) is formed on oxide film 4 by CVD. An oxide film 42 having a thickness of 10 to 100 (100 to 1000 Å) is formed on polysilicon film 41 by CVD or thermal oxidation. A nitride film 43 having a thickness of 100 to 200 nm (1000 to 2000 Å) is formed on oxide film 42 by CVD. Oxide film 4, polysilicon film 41, oxide film 42, and nitride film 43 function auxiliarily to form an isolation oxide film, so that they may be called auxiliary films.

After that, a resist mask having an opening corresponding to a position in which an isolation oxide film is to be formed is patterned on nitride film 43, and nitride film 43 is selectively removed by dry etching or wet etching.

Figure 50:
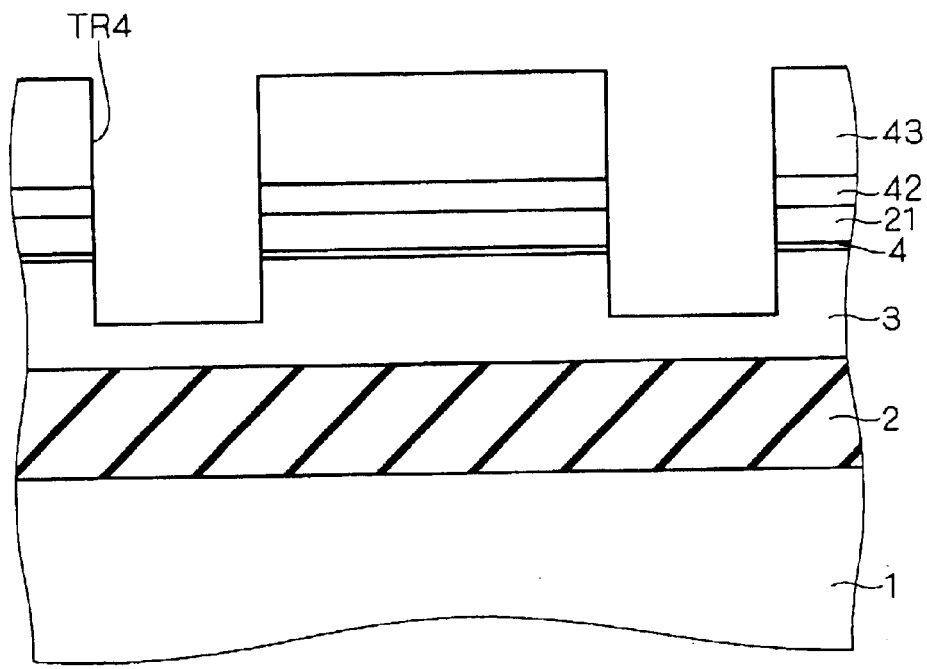
Figure 51:
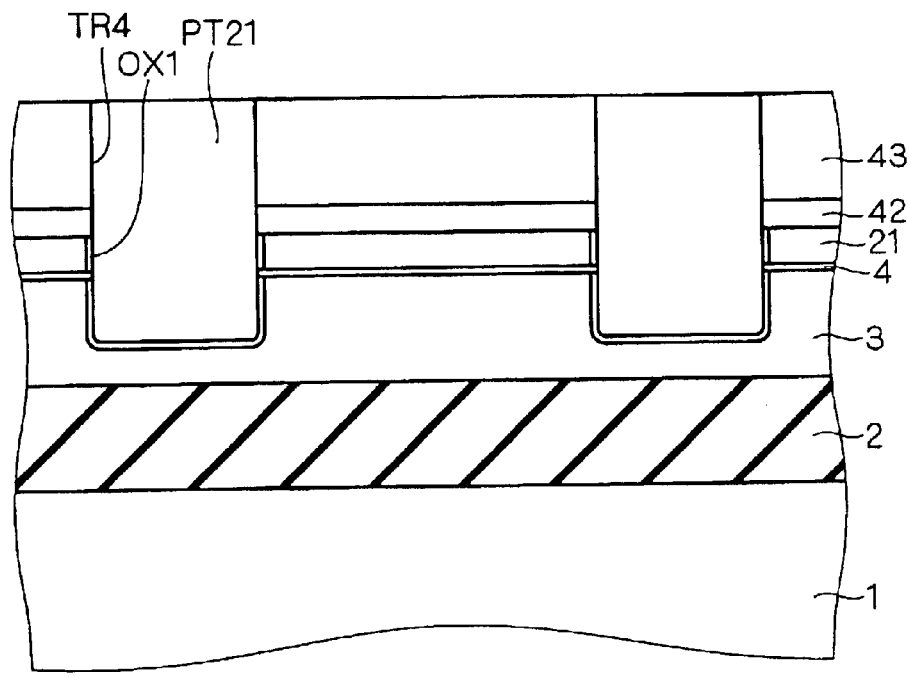

After that, as shown in FIG. 50, patterned nitride film 43 is used as an etching mask, oxide film 42, polysilicon film 41, and oxide film 4 are penetrated and SOI layer 3 is etched to predetermined depth, thereby forming a trench TR4. The etching parameters of the etching are adjusted so as not to completely etch SOI layer 3 to expose buried oxide film 2 but so as to leave SOI layer 3 having a predetermined thickness on the bottom of the trench. After that, the inner walls of trench TR4 are oxidized to form oxide film OX1. The etching depth of SOI layer 3 is set to 50 to 150 nm.

After that, an oxide film is formed by HDP-CVD on the whole face of nitride film 43 so as to bury trench TR4, and the excess oxide film on nitride film 43 is removed by CMP, thereby leaving the oxide film only in trench TR4 to form a partial isolation oxide film PT41.

Figure 52:
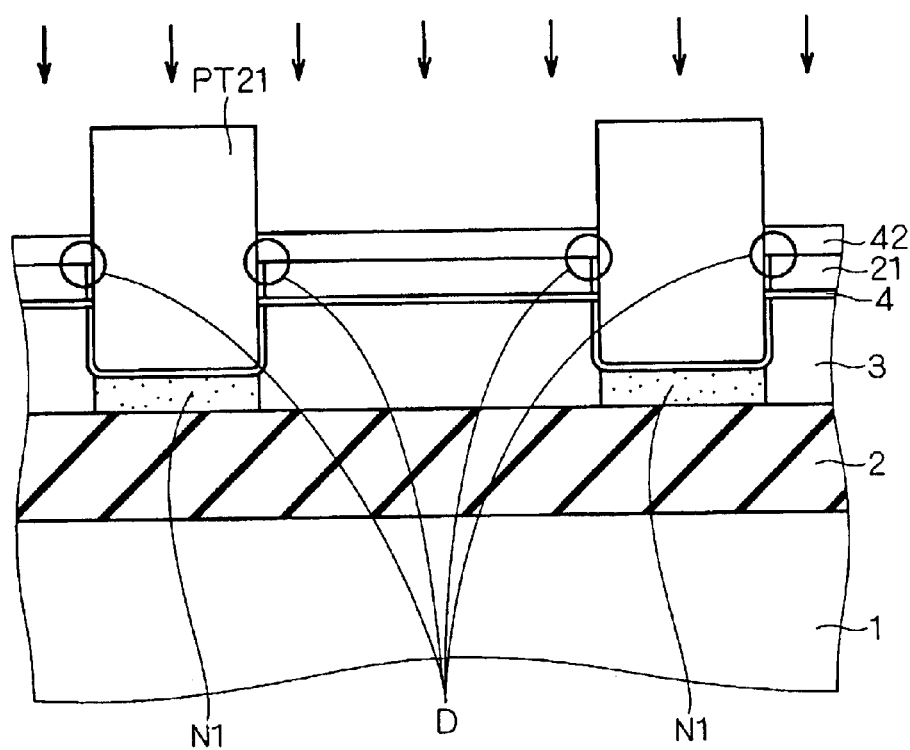

In a process shown in FIG. 52, nitride film 43 is removed by thermal phosphoric acid, and a configuration such that partial isolation oxide film PT41 is projected from the main surface of oxide film 42 is obtained. An isolation step almost equal to the thickness of nitride film 43 is generated.

In such a state, channel stop implantation is performed with an energy by which a peak of an impurity profile is generated in SOI layer 3 through partial isolation oxide film PT41, channel stop layer N1 is formed in SOI layer 3 under partial isolation oxide film PT41, that is, in the isolation region.

An impurity to be implanted here is an N-type impurity. In the case of using phosphorus (P) (in the case of forming a PMOS transistor), implantation energy is set to, for example, 150 to 500 keV. In the case of using boron (B) (in the case of forming an NMOS transistor), implantation energy is set to, for example, 60 to 250 keV and the density of channel stop layer N1 is set to $1 \times 10^{17}$ to $1 \times 10^{19}/cm^3$.

At this time, the thickness of oxide film 42 and polysilicon film 41 is set so that impurities of channel stop implantation are not stopped but implanted into buried oxide film 2 and silicon substrate 1 under buried oxide film 2.

Figure 53:
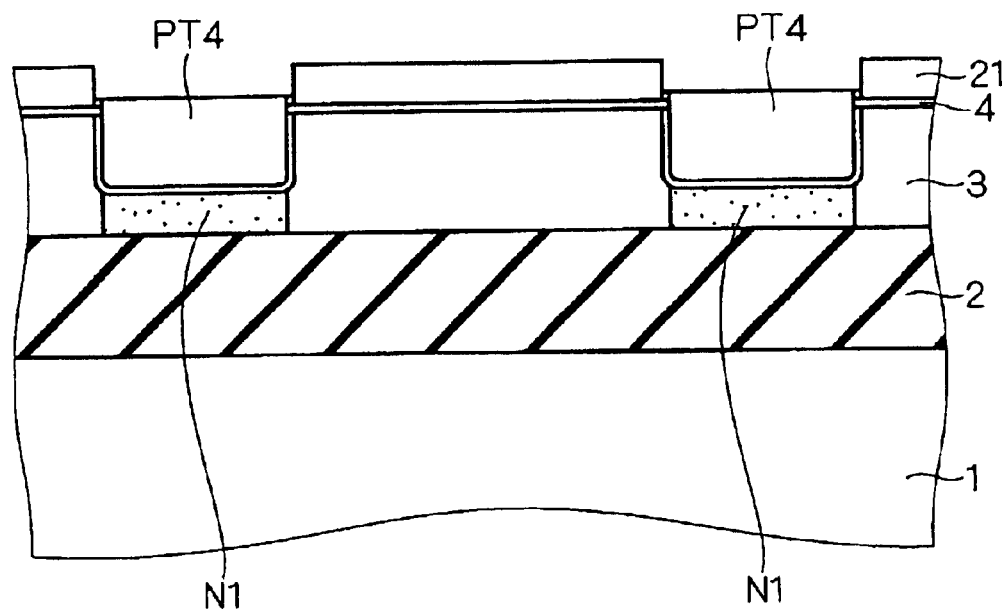

Subsequently, in a process shown in FIG. 53, partial isolation oxide film PT41, internal wall oxide film OX1, and oxide film 42 are etched by dry etching having selectivity with polysilicon film 41, thereby forming a partial isolation oxide film PT4 with a reduced isolation step.

Figure 54:
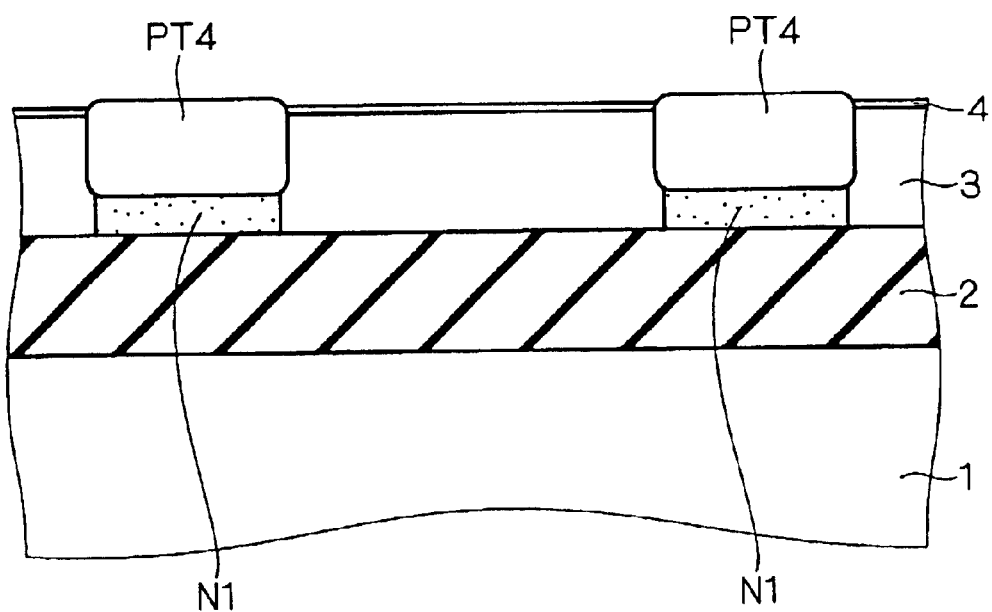

In a process shown in FIG. 54, polysilicon film 41 on oxide film 4 is removed by wet etching or dry etching having selectivity with the oxide film.

Subsequently, by performing the processes described with reference to FIGS. 10 to 13, an MOS transistor is formed in each of active regions, and SOI device 100 as shown in FIG. 13 is obtained.

F-2. Action and Effect

According to the above-described fabricating method of the sixth embodiment, by forming partial isolation oxide film PT41 having a large isolation step and performing channel stop implantation through partial isolation oxide film PT41, channel stop layer N1 having a high density can be formed in the isolation region in a self aligned manner. In this case, no channel stop layer is formed in SOI layer 3 corresponding to active region AR, so that the threshold value of the MOS transistor can be adjusted without a hitch, the source/drain layer of the MOS transistor or a depletion layer formed around the PN junction of the source/drain layer can be made reach buried oxide film 2. A semiconductor device in which deterioration in the transistor characteristics is prevented can be obtained.

Since oxide film 42 is provided on polysilicon film 41 and partial isolation oxide film PT41 is removed together with oxide film 42, the boundary portion (portion D in FIG. 52) of polysilicon film 41, inner wall oxide film OX1, and partial isolation oxide film PT41 is suppressed from being influenced by dry etching performed for removing partial isolation oxide film PT41. Inner wall oxide film OX1 and partial isolation oxide film PT41 in the portion are prevented from being excessively removed, and the peripheral portion of partial isolation oxide film PT4 finally obtained is prevented from being recessed. Decrease in threshold value of a transistor, deterioration in withstand voltage characteristic of the gate electrode, and the like caused by formation of the gate electrode and the gate insulating film in the portion can be prevented.

G. Seventh Embodiment

As the semiconductor device fabricating methods of the foregoing first to sixth embodiments, the method of performing the channel stop implantation via the partial isolation oxide film having a large isolation step and the method of performing the channel stop implantation via the partial isolation oxide film having a small isolation step in a state where the thick polysilicon film and nitride film are left in the active regions have been described. By any of the methods, however, in a completed MOS transistor, the source/drain layer and the channel stop layer exist close to each other.

Figure 55:
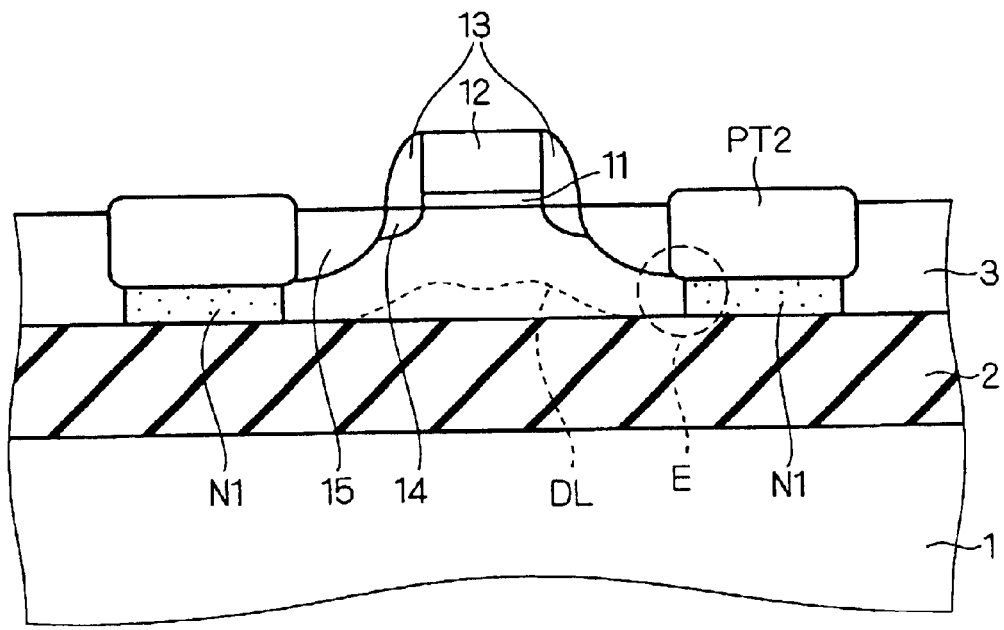
FIG. 55 is a cross section for explaining an effect of a method of fabricating a semiconductor device of a seventh embodiment according to the present invention.

FIG. 55 shows an example of a completed MOS transistor. FIG. 55 shows a PMOS transistor formed in active region AR specified by partial isolation oxide film PT2. On the side walls of gate insulating film 11 and gate electrode 12, spacer (side wall spacer) 13 of an insulating film is formed. In the surface of SOI layer 3, lightly-doped drain layer (or source/drain extension layer) 14, and source/drain layer 15 are formed.

Source/drain layer 15 is formed so as to be in contact with the side face of partial isolation oxide film PT2, and channel stop layer N1 made of the N-type impurity is formed in SOI layer 3 of partial isolation oxide film PT2.

Therefore, as shown by a portion E in the drawing, source/drain layer 15 and channel stop layer N1 are close to each other in the portion around the peripheral portion of partial isolation oxide film PT2. It causes problems such that a depletion layer DL becomes thinner and the junction capacitance increases, and a junction leak increases due to concentration of the electric field.

As the seventh embodiment according to the present invention, therefore, a method of controlling the position in which a channel stop layer is to be formed will be described. In the following description, the fabricating method of the second embodiment described by referring to FIGS. 14 to 20 will be described as an example. For simplicity, only region PR in which a PMOS transistor will be described.

G-1. Fabricating Method

By performing the processes described with reference to FIGS. 14 to 17, trench TR2 is filled with oxide film OX2 and oxide film OX2 on nitride film 22 and nitride film 22 are removed by CMP. As shown in FIG. 18, the configuration in which trench TR2 is filled with partial isolation oxide film PT21 is obtained.

Figure 56:
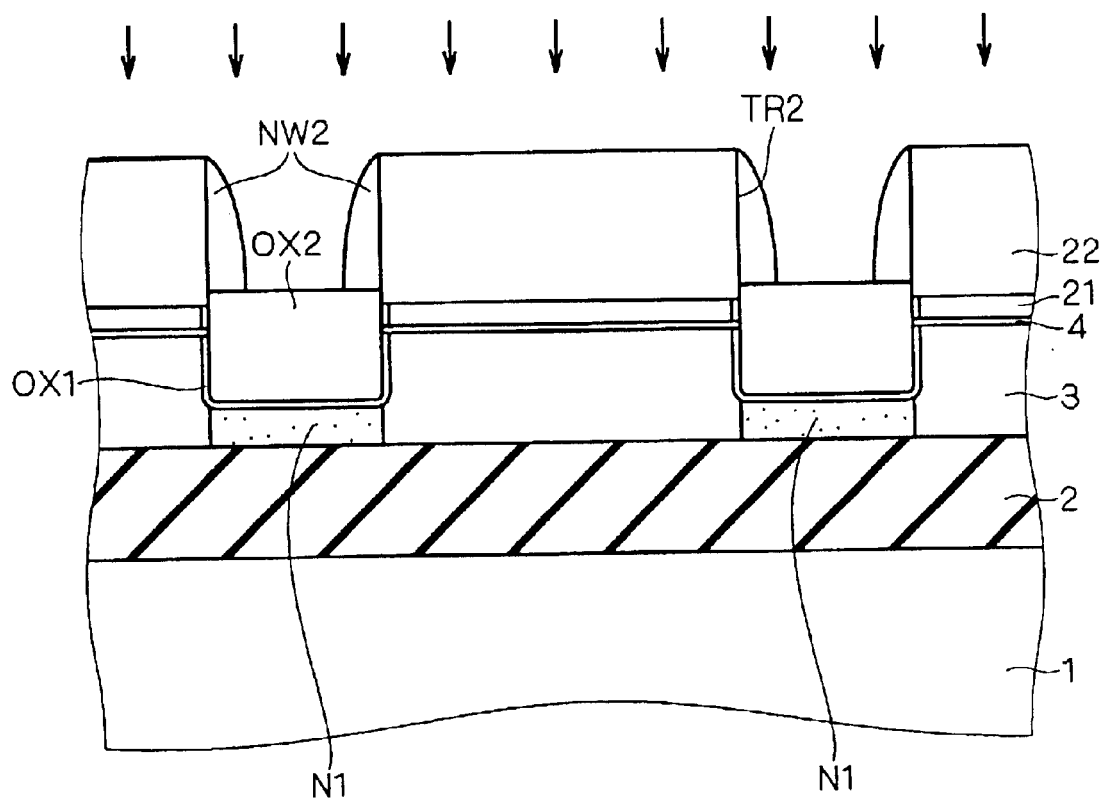
FIG. 56 is a cross section showing the method of fabricating the semiconductor device of the seventh embodiment according to the present invention.

After that, in a process shown in FIG. 56, partial isolation oxide film PT21 in the portion corresponding to nitride film 22 in trench TR2 is etched by, for example, hydrofluoric acid (HF) process, thereby reducing the isolation step of partial isolation oxide film PT21. A side wall spacer NW2 of a nitride film is formed on the inner wall faces of the portion of nitride film 22 in trench TR2 exposed by removing partial isolation oxide film PT2.

In a state where side wall spacer NW2 is provided, N-type impurities are implanted with an energy by which a peak of an impurity profile is generated in SOI layer 3 through partial isolation oxide film PT21, thereby forming channel stop layer N1 in SOI layer 3 under partial isolation oxide film PT21, that is, in the isolation region.

In this case, because of the existence of side wall spacer NW2, each of both ends in the plane direction of channel stop layer N1 is positioned apart from each of both ends of partial isolation oxide film PT21 only by a distance corresponding to thickness T of side wall spacer NW, and channel stop layer N1 is not formed under the ends of partial isolation oxide film PT21.

Since polysilicon film 21 and nitride film 22 remain on SOI layer 3 corresponding to active region AR, the impurities cannot pass through polysilicon film 21 and nitride film 22. Thus, the impurities of channel stop implantation are not implanted into SOI layer 3 corresponding to active region AR.

After that, nitride film 22 and side wall spacer NW2 are removed by thermal phosphoric acid, and partial isolation oxide film PT21 and inner wall oxide film OX1 are etched by a hydrofluoric acid (HF) process, thereby forming partial isolation oxide film PT2 with a reduced isolation step.

G-2. Action and Effect

According to the above-described fabricating method of the seventh embodiment, channel stop layer N1 is not formed under the peripheral portion of the under face of partial isolation oxide film PT2. Consequently, in a state where the MOS transistor is formed, in the vicinity of the peripheral portion of partial isolation oxide film PT2, source/drain layer 14 and channel stop layer N1 exist apart from each other. A depletion layer can be formed thick and the junction capacitance can be reduced. The electric field near the peripheral portion of partial isolation oxide film PT2 is reduced, and a junction leak can be reduced.

G-3. Modification

Although the example of forming nitride film 22 thicker than polysilicon film 21 has been described in the seventh embodiment, nitride film 22 may be thinner than polysilicon film 21.

Figure 57:
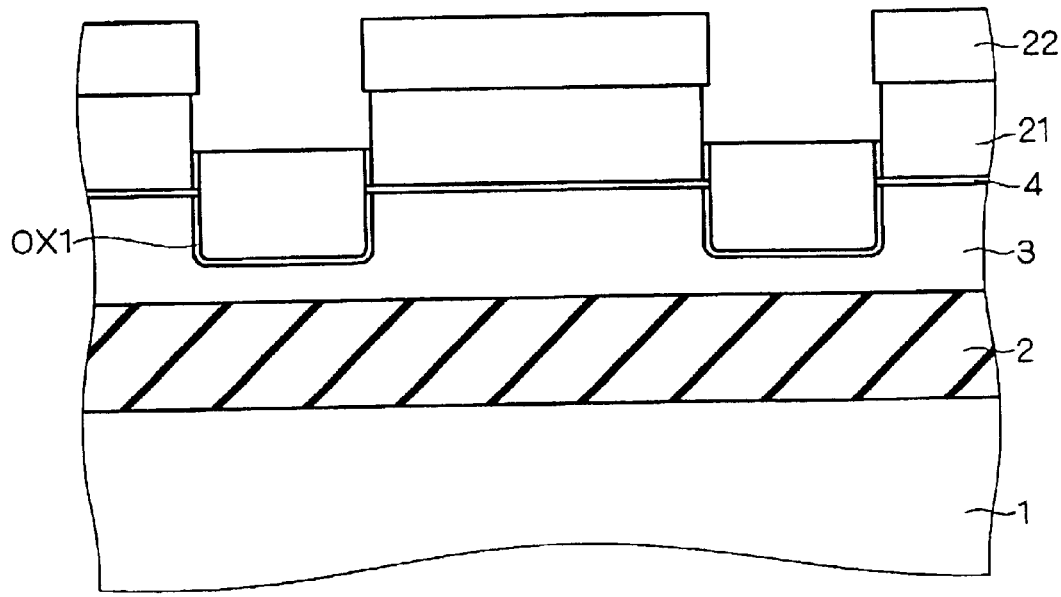
FIG. 57 is a cross section showing a fabricating method of a modification of the seventh embodiment according to the present invention.

FIG. 57 shows a configuration in which nitride film 22 is formed thinner than polysilicon film 21. Since property values such as a coefficient of thermal expansion of nitride film 22 and those of silicon substrate 1 and SOI layer 3 are different from each other, when nitride film 22 is thick, a mechanical stress applied to silicon substrate 1 and SOI layer 3 is high. If oxide film OX2 is formed by HDP-CVD or heat treatment for increasing the density of oxide film OX2 is performed in a state where the mechanical stress is high, the shape of the device is fixed in a state where the stress is applied. Even when nitride film 22 is removed later, the stress is not removed.

By forming nitride film 22 thinly and, instead, forming polysilicon film 21 thickly, the mechanical stress applied to silicon substrate 1 and SOI layer 3 can be reduced.

By forming polysilicon film 21 thickly, an effect as described hereinbelow can be also obtained.

Specifically, the important point of the technique of forming the partial isolation oxide film in the surface of SOI layer 3 is that how to leave SOI layer 3 of a predetermined thickness under the partial isolation oxide film.

However, in etching of the nitride film, the etching selectivity with polysilicon film is low. In the case where polysilicon film 21 is thin in the configuration where nitride film 22 is formed on polysilicon film 21, it is difficult to stop the etching in polysilicon film 21 at the time of patterning nitride film 22 to form a trench.

In the etching of the nitride film, the etching selectivity with an oxide film is also low. If etching does not stop in polysilicon film 21, it is difficult to stop etching in thin oxide film 4 as a pad oxide film. As a result, SOI layer 3 is etched unexpectedly.

In this case, the amount of etching SOI layer 3 largely varies due to an influence of variations in thickness of polysilicon film 21 and nitride film 22 as upper layers. Therefore, the thickness of SOI layer 3 on the bottom of the trench varies and, finally, the thickness of SOI layer 3 under the partial isolation oxide film varies.

On the other hand, when thin polysilicon film 21 exists under nitride film 22, etching of nitride film 22 can be stopped by polysilicon film 21. After that, four-stage etching such that each of polysilicon film 21, oxide film 4, and SOI layer 3 can be removed by etching of high selectivity, and the thickness of SOI layer 3 on the bottom of the trench can be made constant.

To reduce the mechanical stress by nitride film 22, it is sufficient to set the thickness of nitride film 22 to 30 to 200 nm. To enable four-stage etching to be performed, it is sufficient to set the thickness of polysilicon film 21 to 50 to 400 nm.

H. Eighth Embodiment

As the semiconductor device fabricating methods of the foregoing first to seventh embodiments, the method of performing the channel stop implantation via the partial isolation oxide film having a large isolation step and the method of performing the channel stop implantation via the partial isolation oxide film having a small isolation step in a state where the thick polysilicon film and nitride film are left in the active regions have been described. A method described hereinbelow may be also used.

H-1. Fabricating Method

Figure 58:
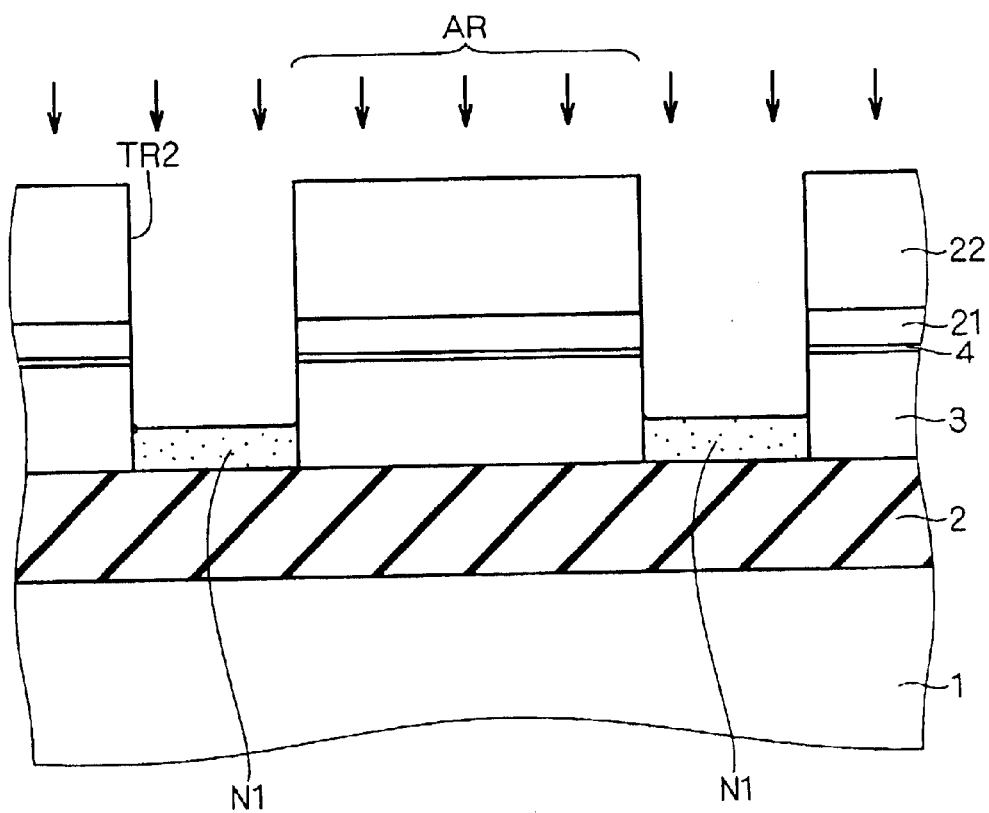
FIG. 58 is a cross section showing a method of fabricating a semiconductor device of an eighth embodiment according to the present invention.

By performing the processes described with reference to FIGS. 14 and 15, trench TR2 penetrating nitride film 22, polysilicon film 21, and oxide film 4 as shown in FIG. 58, in which SOI layer 3 is etched to a predetermined depth is formed.

In FIG. 58, the thickness of polysilicon film 21 is set to about 50 nm, and the thickness of nitride film 22 is set to about 200 nm. This setting is used in the case where the mechanical stress by nitride film 22 is not considered. Obviously, trench TR2 may be formed by making nitride film 22 as thin as possible and, instead, making polysilicon film 21 thick, the four-stage etching described in the seventh embodiment is performed.

In this state, channel stop implantation by which a peak of an impurity profile is formed in SOI layer 3 is performed, thereby forming channel stop layer N1 in SOI layer 3 on the bottom of trench TR2, that is, in the isolation region.

An impurity to be implanted here is an N-type impurity. In the case of using phosphorus (P), implantation energy is set to, for example, 10 to 100 keV, and the density of channel stop layer N1 is set to $1 \times 10^{17}$ to $1 \times 10^{19}/cm^3$.

In the case of implanting a P-type impurity, for example, if boron (B) is used, the implantation energy is set to, for example, 5 to 40 keV, and the density of channel stop layer N1 is set to $1 \times 10^{17}$ to $1 \times 10^{19}/cm^3$.

Since polysilicon film 21 and nitride film 22 remain on SOI layer 3 corresponding to active region AR and the thickness is about 400 nm (4000 Å), with the above-described energy, the impurities cannot pass through polysilicon film 21 and nitride film 22. Thus, the impurities of channel stop implantation are not implanted into SOI layer 3 corresponding to active region AR.

Figure 17:
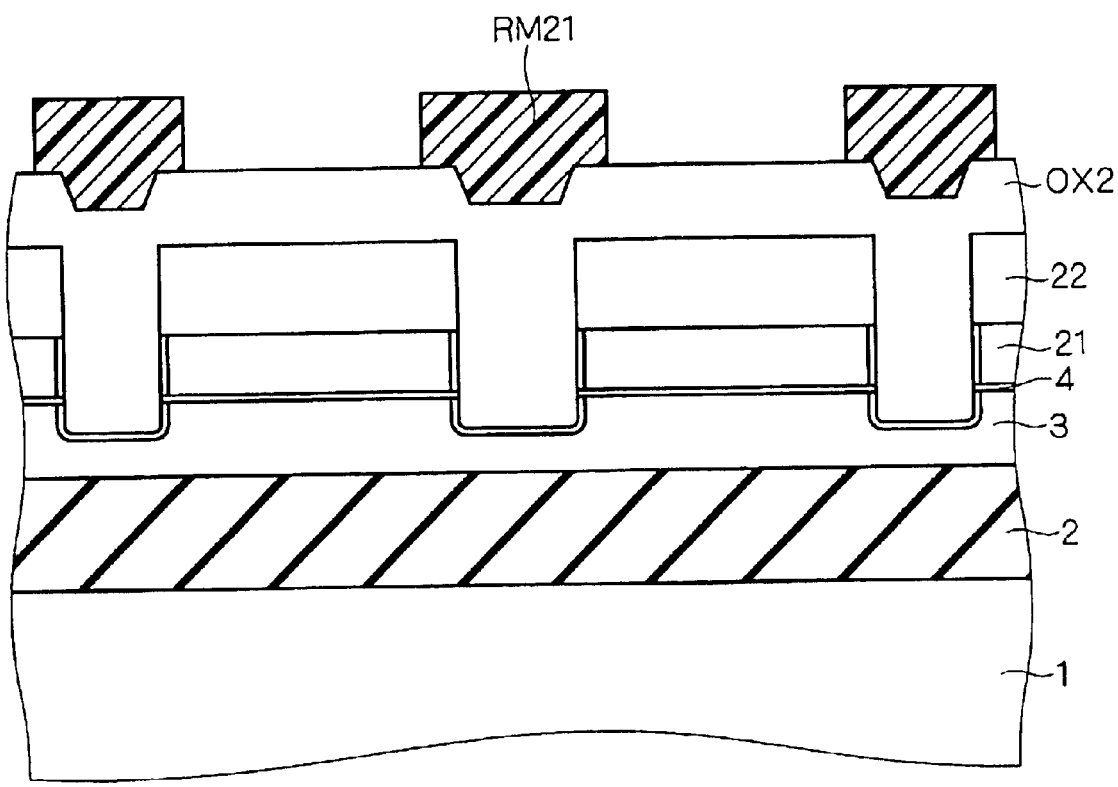

Subsequently, the processes described by referring to FIGS. 16 to 18 are performed to fill trench TR2 with the oxide film formed by HDP-CVD and form partial isolation oxide film PT21. Nitride film 22 and polysilicon film 21 are removed, and the isolation step of partial isolation oxide film PT21 is reduced, thereby forming partial isolation oxide film PT2. After that, by performing the processes described by referring to FIGS. 10 to 13, SOI device 100 shown in FIG. 13 can be obtained.

Although heat treatment is performed to increase the density of the oxide film formed by HDP-CVD in the formation of partial isolation oxide film PT21, since the channel stop implantation has been already performed in the fabricating method of the embodiment, desirable, the temperature in the heat treatment is suppressed.

H-2. Action and Effect

According to the fabricating method of the eight embodiment, the channel stop implantation is performed at the stage of formation of the trench for forming the partial isolation oxide film. Consequently, a small amount of implantation energy is sufficient. With the energy, the impurity cannot pass through polysilicon film 21 and nitride film 22 on SOI layer 3 corresponding to active region AR, so that the impurity of channel stop implantation can be prevented from being implanted into SOI layer 3 corresponding to active region AR with reliability.

H-3. Modification 1

Figure 59:
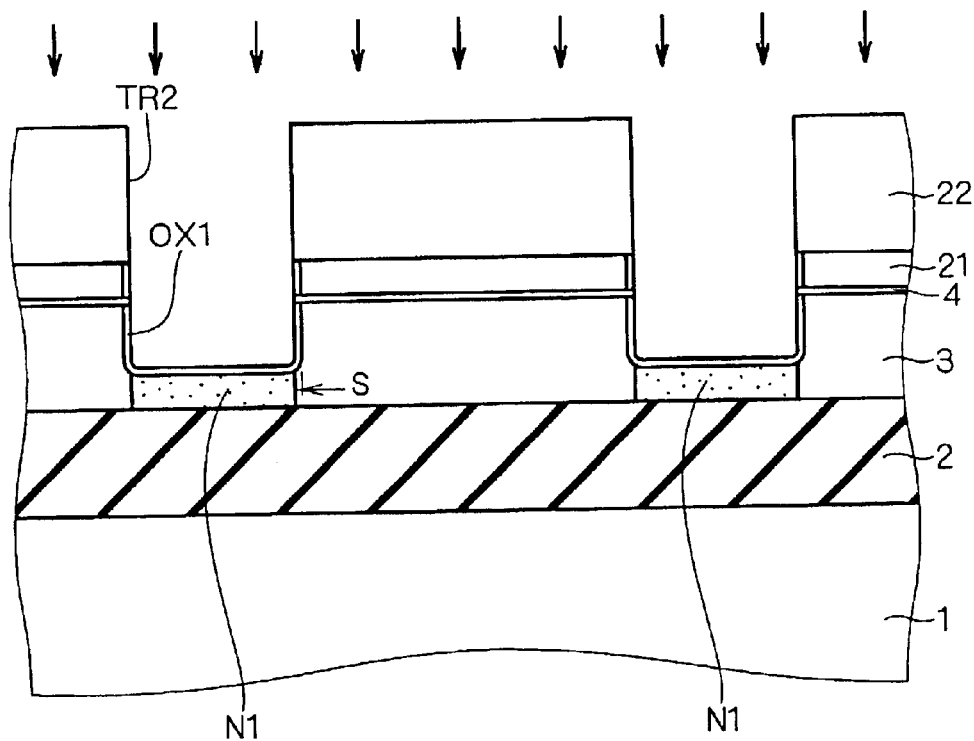
FIGS. 59 through 72 are cross sections showing a fabricating method of a modification of the eighth embodiment according to the present invention.

In the fabricating method of the eighth embodiment described above, after forming trench TR2, the channel stop implantation is performed before inner wall oxide film OX1 is formed. It is also possible to perform the channel stop implantation after inner wall oxide film OX1 is formed as shown in FIG. 59. The thickness of inner wall oxide film OX1 may be 10 to 50 nm.

In this case, because of the existence of inner wall oxide film OX1, each of both ends in the plane direction of channel stop layer N1 is positioned apart from each of both ends of trench TR2 only by a distance corresponding to thickness S of inner wall oxide film OX1, and channel stop layer N1 is not formed under the ends of partial isolation oxide film finally formed.

As a result, in a state where the MOS transistor is formed, in the vicinity of the peripheral portion of the partial isolation oxide film, the source/drain layer and the channel stop layer exist apart from each other. A depletion layer can be formed thick and the junction capacitance can be reduced. The electric field near the peripheral portion of the partial isolation oxide film is reduced, and a junction leak can be reduced.

From the viewpoint of regulating the region in which the channel stop layer is formed, the spacer formed in trench TR2 is not limited to the oxide film, but the nitride film or oxynitride (SiOxNy) film may be used. Those films can be formed by oxidation using $O_2$ in which NO gas is mixed or oxidation using $N_2O$ gas.

In the case of covering the trench inner wall with a nitride film or oxynitride film, there is also an advantage such that in an SOI device finally obtained, a contact plug can be prevented from being in contact with the junction of a source/drain layer and a depletion layer.

Figure 60:
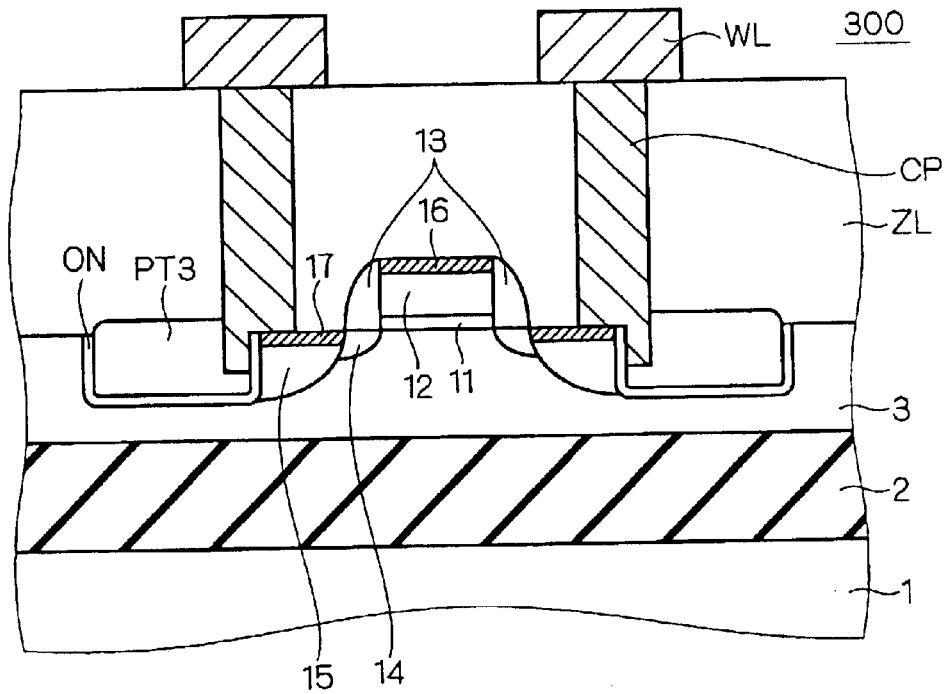
Figure 61:
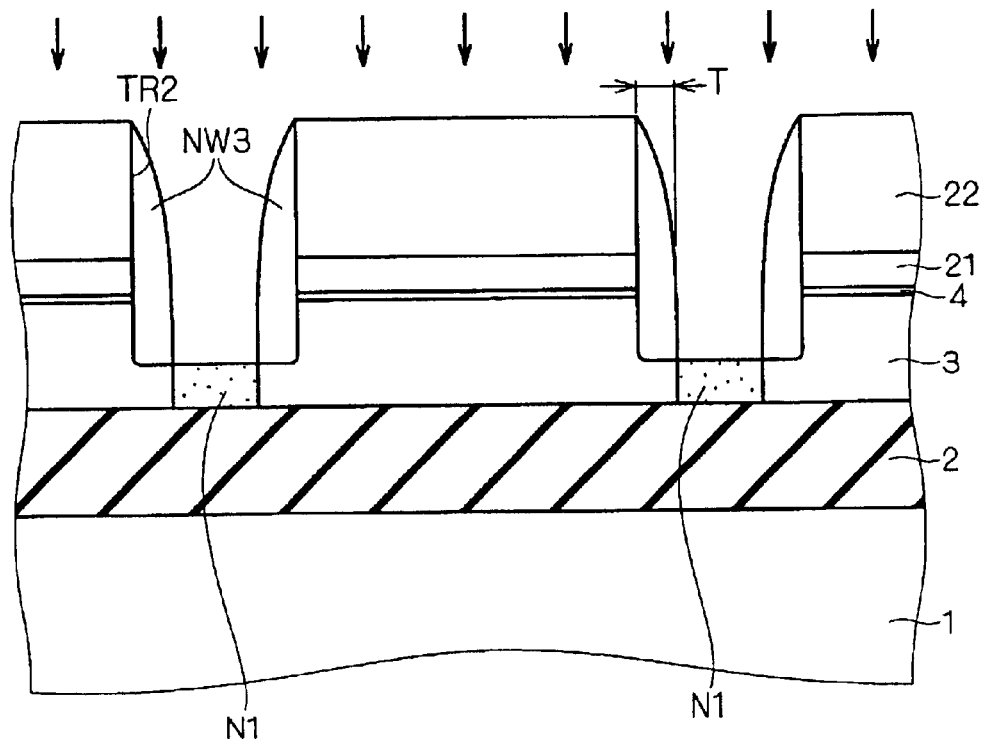

FIG. 60 shows the configuration of SOI device 300 having a partial isolation oxide film PT3 obtained by covering the trench inner wall with an oxynitride film ON. In FIG. 60, the same components as those in SOI device 100 described by referring to FIG. 13 are designated by the same reference numerals and their description will not be repeated.

In FIG. 60, contact plug CP is connected to silicide layer 17 on source/drain layer 15 and also engaged with partial isolation oxide film PT3. In partial isolation oxide film PT3, contact plug CP extends to the inside of partial isolation oxide film PT3 for the following reason. At the time of forming a contact hole penetrating interlayer insulating film ZL to form contact plug CP, since the etching rate of interlayer insulating film ZL and that of partial isolation oxide film PT3 are equal to each other, etching selectivity cannot be obtained, and partial isolation oxide film PT3 is over etched.

Further, since the thickness of the SOI layer is 50 to 250 nm, the depth to the bottom of the trench is 30 to 120 nm and the partial isolation oxide film is extremely thin, there is a possibility that overetching occurs and the partial isolation oxide film PT3 is penetrated, thereby electrically shorting source/drain layer 15 and SOI layer 3.

The contact which is formed so as to be engaged with the partial isolation oxide film is called a borderless contact.

In the case of forming a borderless contact, if the partial isolation oxide film is formed only by an oxide film, there is the possibility that the borderless contact penetrates the partial isolation oxide film and reaches the SOI layer under the partial isolation oxide film. However, when the partial isolation oxide film is covered with oxynitride film ON like partial isolation oxide film PT3, since the etching rate of oxynitride film ON and that of the oxide film are different from each other, at the time of etching interlayer insulating film ZL, the etching selectivity is obtained, and oxynitride film ON functions as an etching stopper. Consequently, contact plug CP is prevented from penetrating partial isolation oxide film PT3 as shown in FIG. 60.

H-4. Modification 2

To regulate the formation region of the channel stop layer, a dedicated spacer may be formed in trench TR2.

Specifically, channel stop implantation may be performed after a side wall spacer SW1 of the oxide film is formed on the side wall faces of trench TR2.

Because of the existence of side wall spacer SW1, each of both ends in the plane direction of channel stop layer N1 are positioned apart from each of both ends of trench TR2 only by a distance corresponding to thickness T of side wall spacer SW2, and channel stop layer N1 is not formed under the ends of partial isolation oxide film finally formed. Thickness T of side wall spacer SW2 may be 10 to 50 nm.

After the channel stop implantation, the inner walls of trench TR2 are oxidized to form inner-wall oxide film OX1 on the bottom of the trench. By performing the processes described with reference to FIGS. 16 to 18, trench TR2 is filled with an oxide film formed by HDP-CVD to form partial isolation oxide film PT21. It is sufficient to remove nitride film 22 and polysilicon film 21 and reduce the isolation step of partial isolation oxide film PT21, thereby forming partial isolation oxide film PT2.

At the time of forming side wall spacer SW2, the oxide film is formed on the whole inner wall of trench TR2 and, after that, anisotropic etching is performed to leave the oxide film only on the side wall faces of trench TR2. Consequently, the oxide film does not exist on the bottom face of trench TR2.

Figure 62:
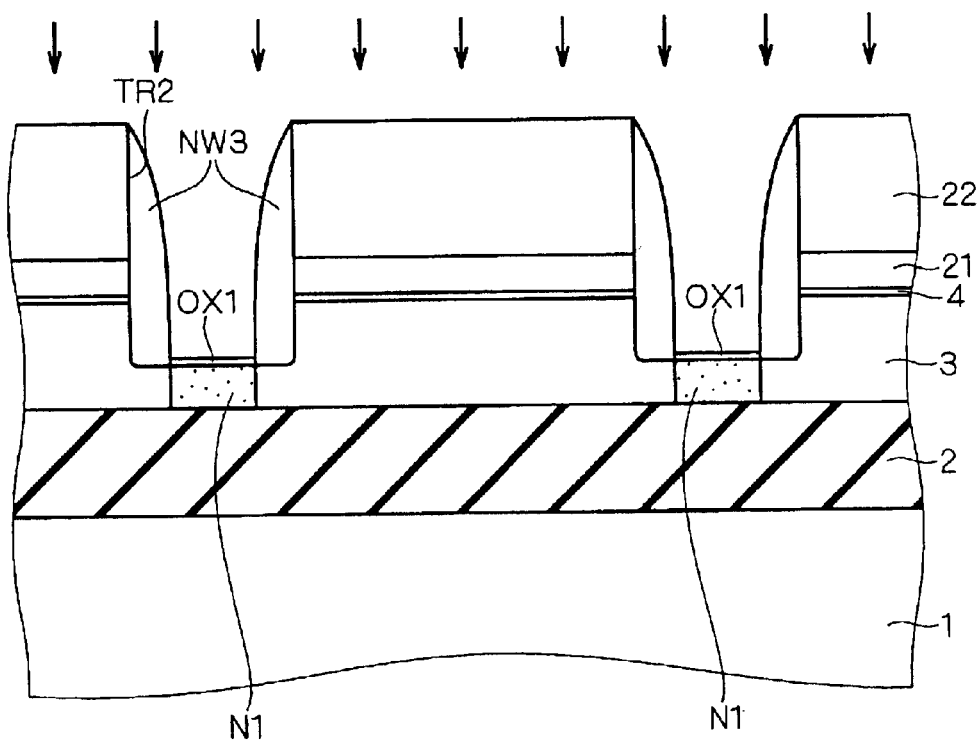

If the channel stop implantation is performed in this state, there is the possibility that SOI layer 3 on the bottom of the trench is damaged. As shown in FIG. 62, after forming side wall spacer SW1, the inner wall may be oxidized. After forming inner-wall oxide film OX1 on the bottom of the trench, the channel stop implantation may be carried out.

Figure 63:
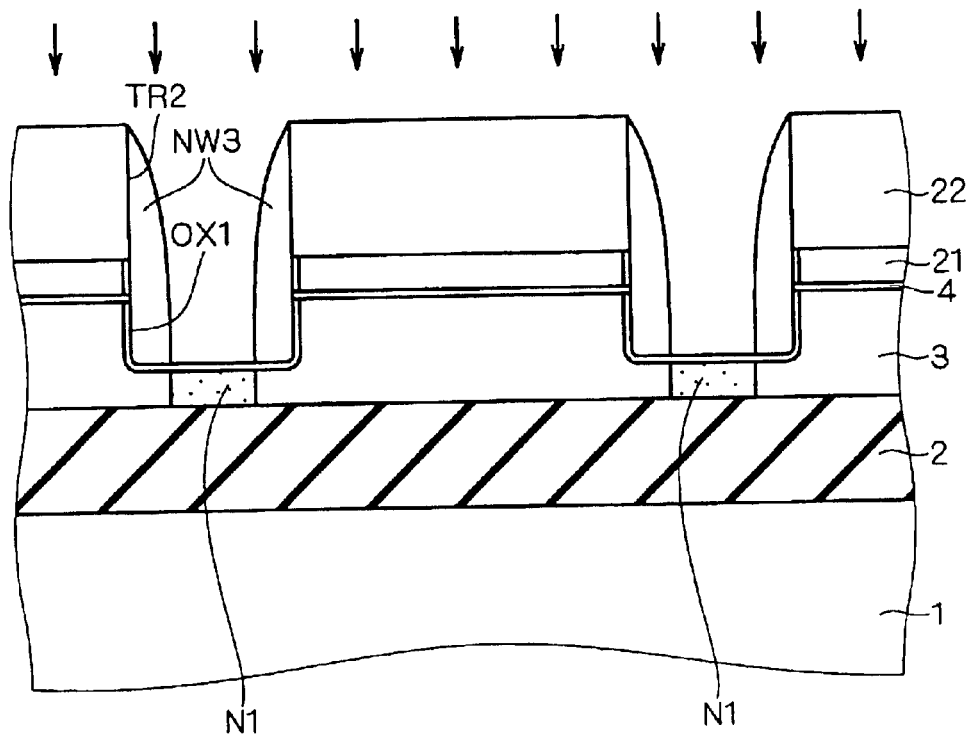

As shown in FIG. 63, it is also possible to form inner-wall oxide film OX1 in trench TR2 first, form side wall spacer SW1, and perform channel stop implantation.

The side wall spacer may be formed by using, in place of the oxide film, a nitride film or oxynitride film. In this case, the formation region of the channel stop layer can be regulated and, moreover, an effect such that occurrence of a problem caused by the borderless contact can be prevented is also produced.

The effect further produced in the case of using the side wall spacer of the nitride film will be described hereinbelow with reference to FIGS. 64 to 67.

Figure 64:
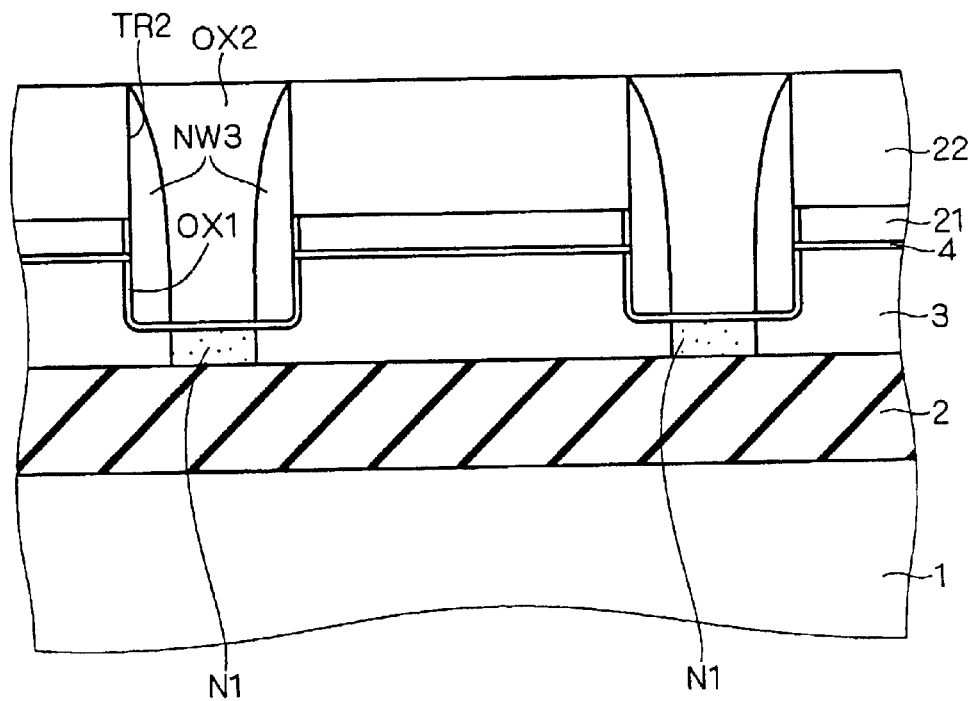

FIG. 64 shows a state where inner-wall oxide film OX1 is formed in trench TR2, side wall spacer NW3 of the nitride film is formed, and the channel stop implantation is performed. Trench TR2 having side wall spacer NW3 is filled with oxide film OX2 formed by HDP-CVD.

Figure 65:
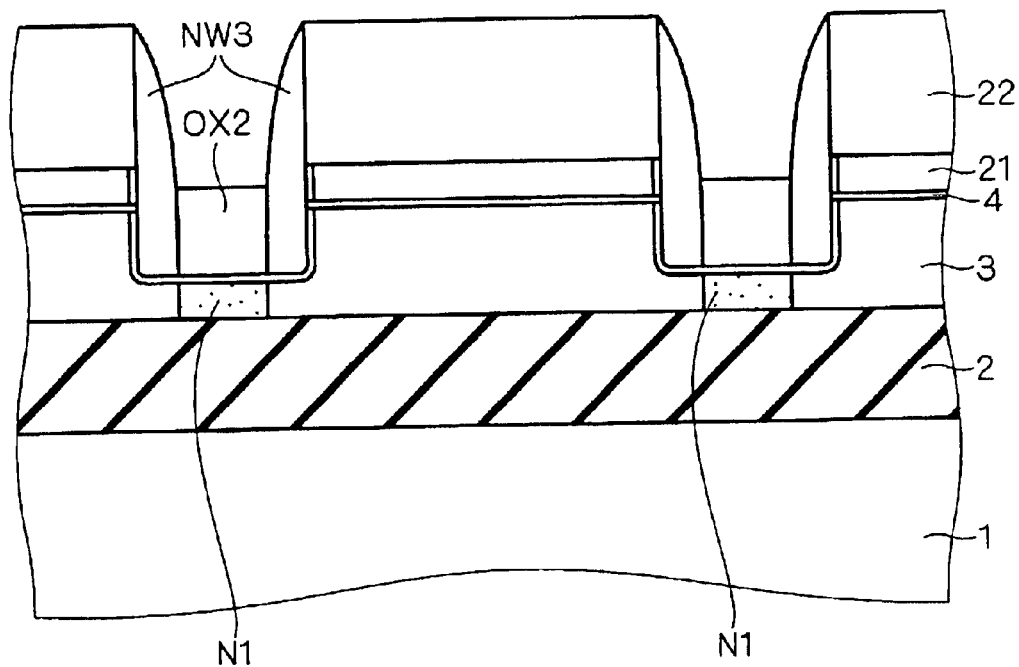

FIG. 65 shows a state where oxide film OX2 is removed by wet etching and an isolation step is reduced. Etching is performed until the top face of oxide film OX2 reaches the inside of polysilicon film 21.

Figure 66:
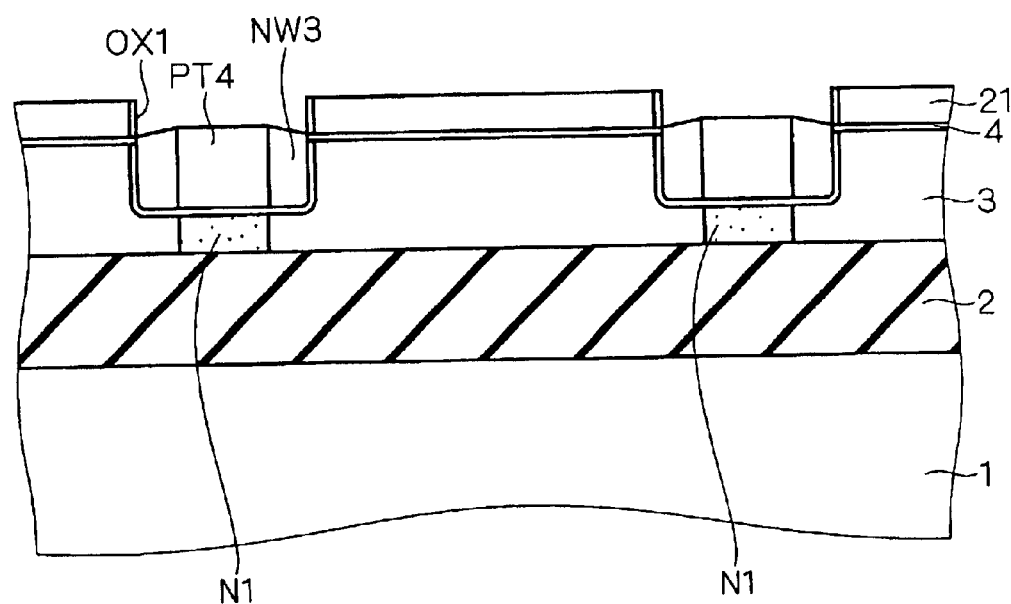

In a process shown in FIG. 66, nitride film 22 and side wall spacer NW3 are removed by thermal phosphoric acid.

Figure 67:
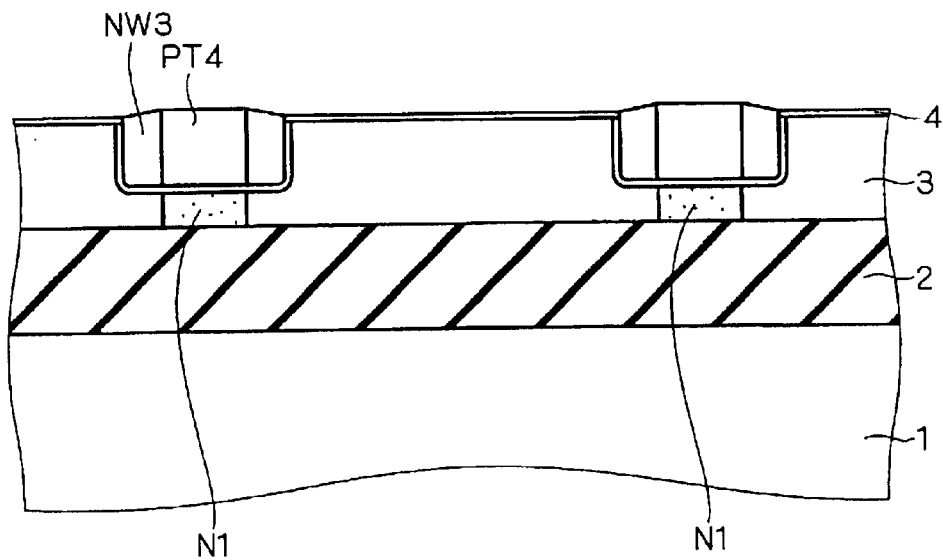

After that, by removing polysilicon film 21 by dry etching or wet etching, as shown in FIG. 67, a partial isolation oxide film PT4 having side wall spacer NW3 on the side walls is obtained.

Figure 68:
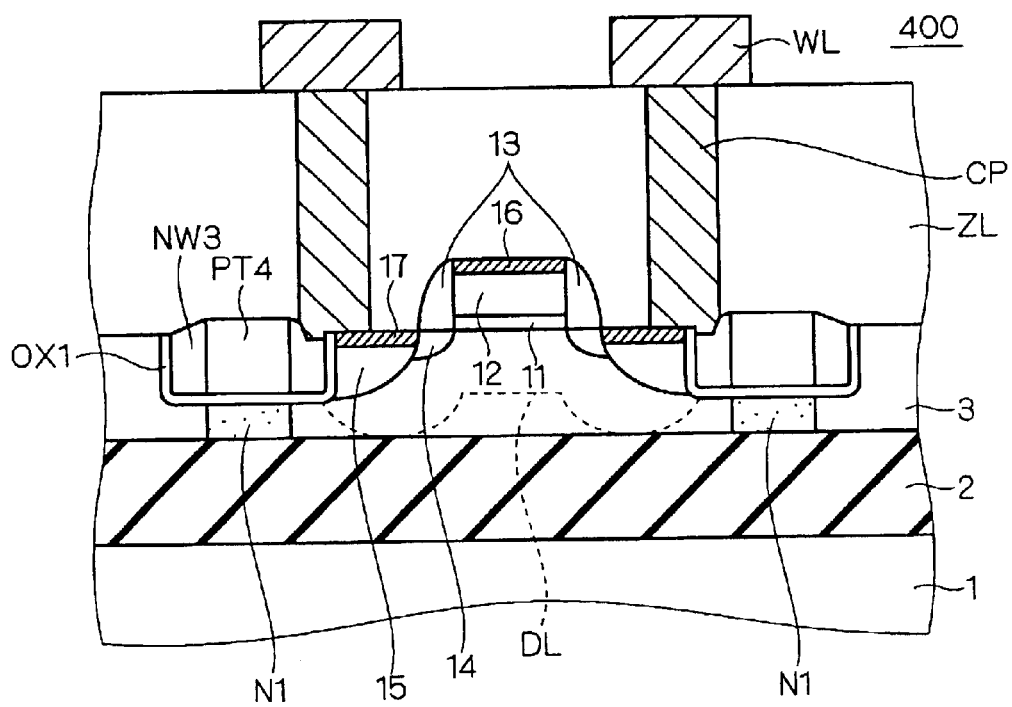

FIG. 68 shows the configuration of an SOI device 400 having partial isolation oxide film PT4. In FIG. 68, the same components as those in SOI device 100 described by referring to FIG. 13 are designated by the same reference numerals and their description will not be repeated.

In FIG. 68, contact plug CP is connected to silicide layer 17 on source/drain layer 15 and also engaged with partial isolation oxide film PT4. In partial isolation oxide film PT4, contact plug CP does not reach the deep inside of partial isolation oxide film PT4.

The reason is that, at the time of forming a contact hole penetrating interlayer insulating film ZL to form contact plug CP, since the etching rate of interlayer insulating film ZL and that of the nitride film constructing side wall spacer NW are different from each other, etching selectivity is obtained, and etching is stopped in side wall spacer NW3.

Since the side faces of partial isolation oxide film PT4 is constructed by the nitride film, contact plug CP is prevented from penetrating partial isolation oxide film PT4. Obviously, side wall spacer NW3 may be constructed by an oxynitride film.

In the case of forming a side wall spacer of the nitride film in trench TR2, after forming the nitride film on the whole inner wall of trench TR2, anisotropic etching is performed to leave the nitride film only on the side wall faces of trench TR2. In this case, the nitride film is formed not only on the inner wall of trench TR2 but also on the main surface of nitride film 22. The nitride film on the main surface of nitride film 22 is removed by the anisotropic etching.

However, by the anisotropic etching, not only the nitride film for forming the side wall spacer but also nitride film 22 may be etched. There is the possibility that nitride film 22 in the portion corresponding to active region AR is etched, and there is the possibility that the thickness of nitride film 22 vary.

When the thickness of nitride film 22 varies, the isolation step in partial isolation oxide film PT4 formed finally by etching in a hydrofluoric acid (HF) process varies accordingly.

By employing the fabricating method shown in FIGS. 69 to 72, variations in the isolation step may be suppressed.

Figure 69:
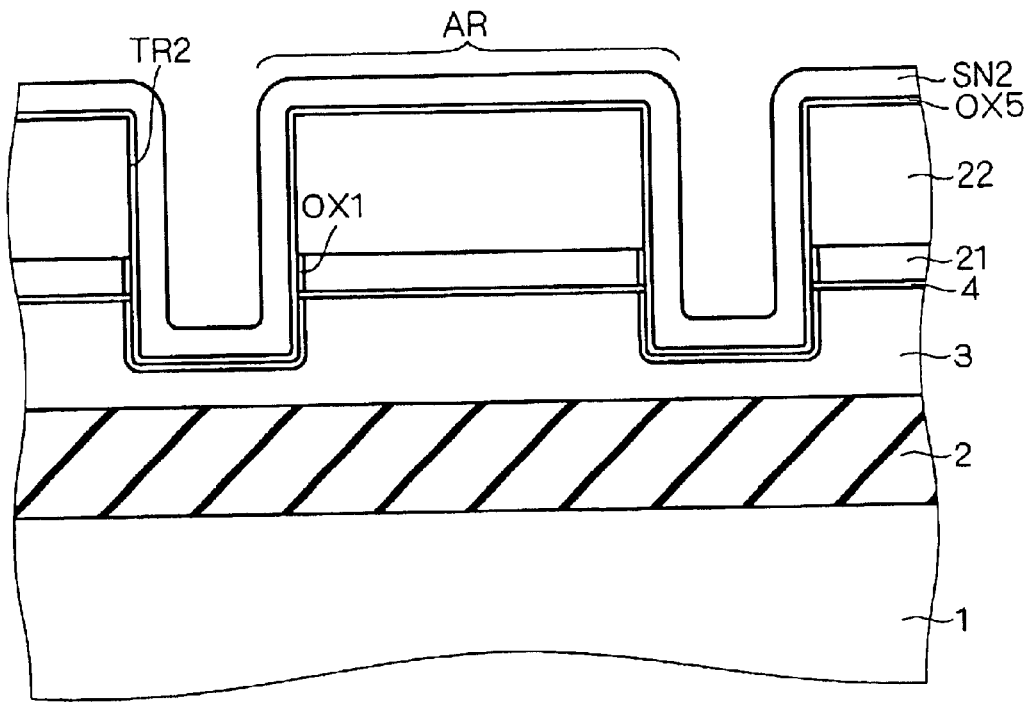

First, as shown in FIG. 69, the inner wall of trench TR2 penetrating nitride film 22, polysilicon film 21, and oxide film 4 and etched to a predetermined depth of SOI layer 3 is oxidized, thereby forming inner-wall oxide film OX1.

After that, by CVD, a protection oxide film OX5 having a thickness of 5 to 20 nm is formed on the whole face of the SOI substrate. Protection oxide film OX5 is formed on inner-wall oxide film OX1 and also on nitride film 22.

Further, by CVD, a nitride film SN2 having a thickness of 10 to 100 nm is formed on the whole face of the SOI substrate.

Figure 70:
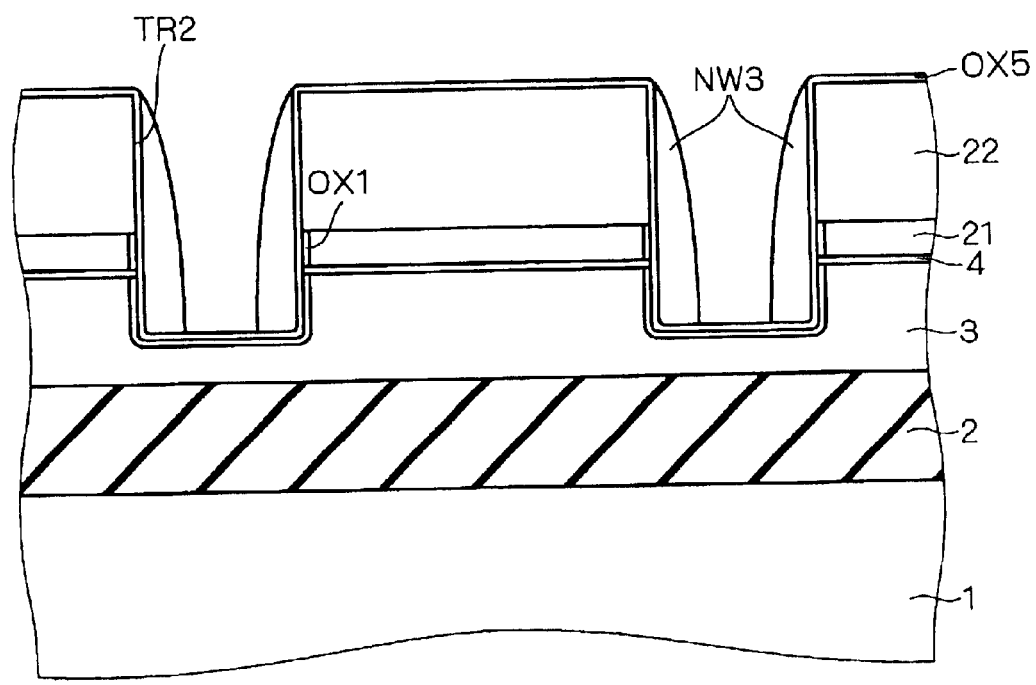

In a process shown in FIG. 70, unnecessary nitride film SN2 is removed by anisotropic etching so that nitride film SN2 remains only on the side wall faces of trench TR2, thereby forming a side wall spacer NW3. The anisotropic etching is performed for the purpose of removing the nitride film. Since the anisotropic etching has selectivity with respect to an oxide film, protection oxide film OX5 covering nitride film 22 is not removed. Therefore, nitride film 22 is not etched and the thickness of nitride film 22 does not vary.

When the thickness of nitride film 22 is constant, an isolation step of partial isolation oxide film PT5 formed finally by etching in a hydrofluoric acid (HF) process also becomes constant.

Figure 71:
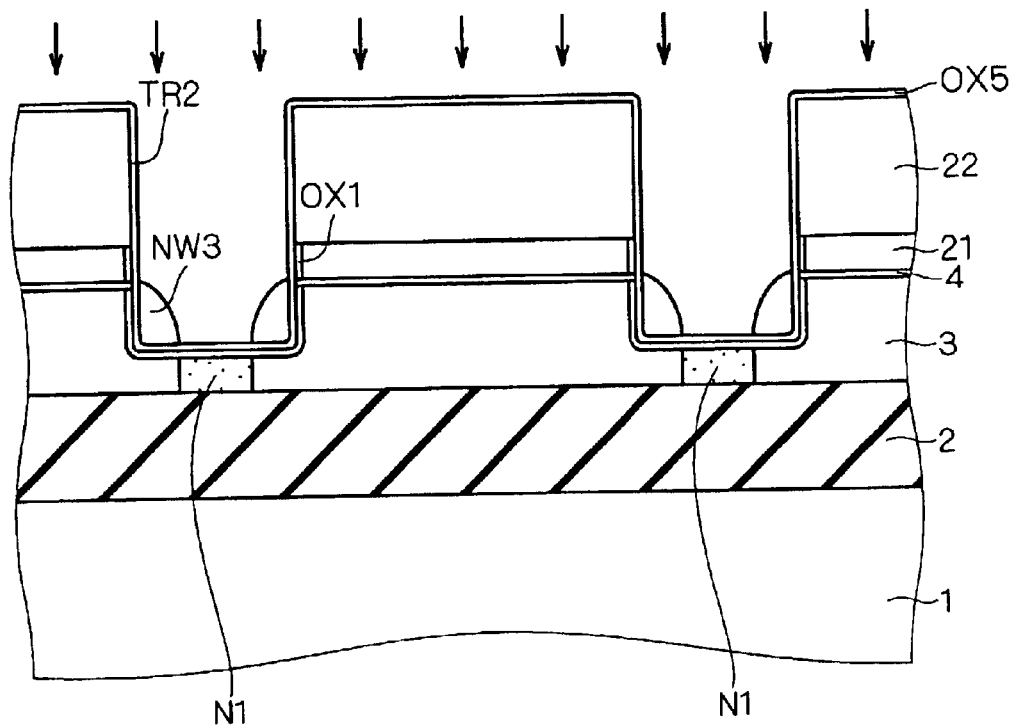

After that, side wall spacer NW3 is removed by thermal phosphoric acid. However, it is not completely removed but, as shown in FIG. 71, side wall spacer NW3 remains in corresponding portions in SOI layer 3 in trench TR2.

In this state, the channel stop implantation is performed with an energy by which a peak of an impurity profile is formed in SOI layer 3 to thereby form channel stop layer N1 in SOI layer 3 under trench TR2, that is, in the isolation region.

After that, trench TR2 having side wall spacer NW3 is filled with an oxide film formed by HDP-CVD, nitride film 22 and polysilicon film 21 are removed, and an isolation step of the oxide film is reduced, thereby obtaining a partial isolation oxide film PT5 whose side faces are formed by side wall spacers NW3 is obtained.

Figure 72:
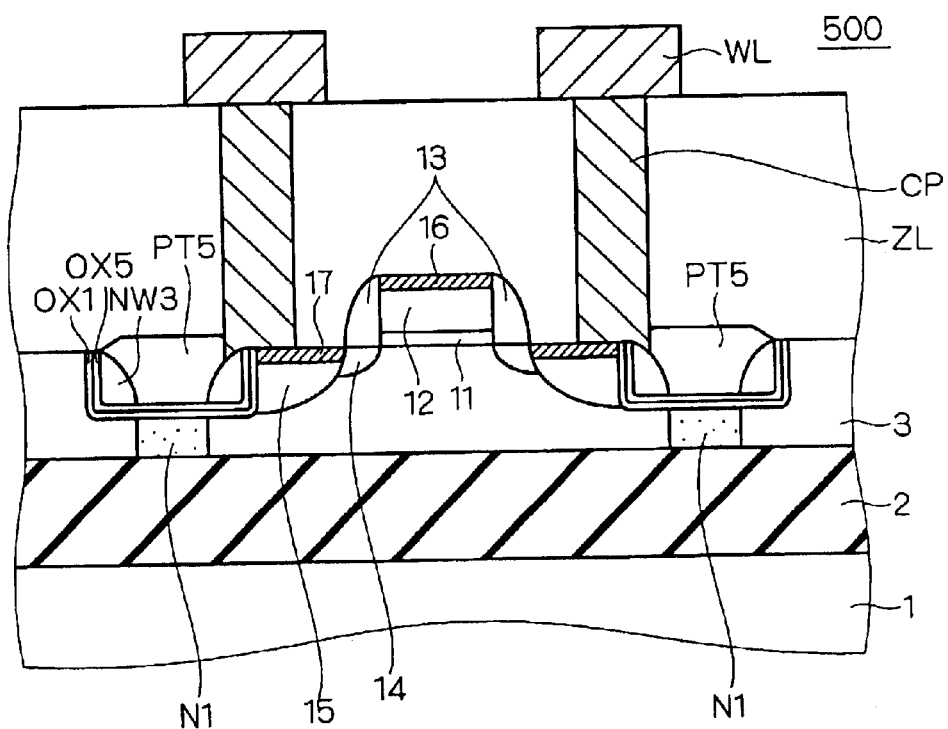

Further, by performing the processes described with reference to FIGS. 10 to 13, an SOI device 500 shown in FIG. 72 can be obtained. In FIG. 72, the same components as those in SOI device 100 described by referring to FIG. 13 are designated by the same reference numerals and their description will not be repeated.

As shown in FIG. 72, contact plug CP is connected to silicide layer 17 on source/drain layer 15 and also engaged with partial isolation oxide film PT5. In partial isolation oxide film PT5, contact plug CP5 is engaged with side wall spacer NW3 but does not penetrate partial isolation oxide film PT5.

I. Ninth Embodiment

As the semiconductor device fabricating methods of the foregoing first to seventh embodiments, the method of performing the channel stop implantation via the partial isolation oxide film having a large isolation step and the method of performing the channel stop implantation via the partial isolation oxide film having a small isolation step in a state where the thick polysilicon film and nitride film are left in the active regions have been described. As the fabricating method of the eighth embodiment, the method of performing the channel stop implantation at the stage the trench for forming the partial isolation oxide film is formed has been described.

The purpose of the methods is to perform the channel stop implantation on the SOI layer under the partial isolation oxide film. By employing a fabricating method of a ninth embodiment described hereinbelow in addition to the methods, the source/drain layer can be easily extended close to buried oxide film 2.

Figure 73:
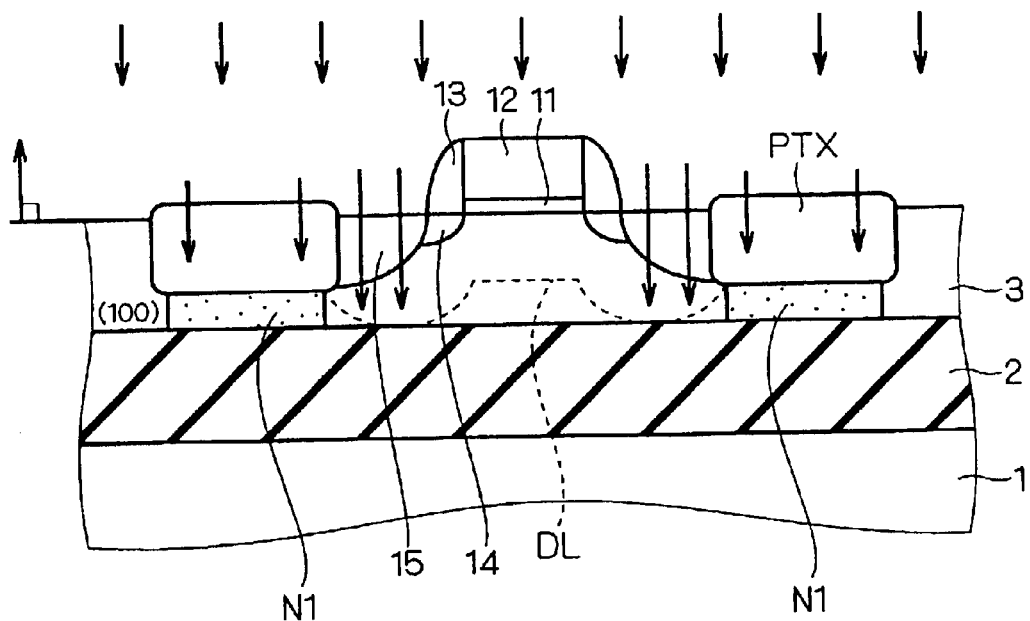
FIG. 73 is a cross section showing a method of fabricating a semiconductor device of a ninth embodiment according to the present invention.

FIG. 73 shows a fabricating process of source/drain layer 15 of a PMOS transistor formed in active region AR specified by a partial isolation oxide film PTX formed by any of the methods of the first to eighth embodiments. On the side walls of gate insulating film 11 and gate electrode 12, side wall spacers 13 are formed. In the surface of SOI layer 3, lightly doped drain layer (or source/drain extension layer) 14 is formed.

Source/drain layer 15 is formed by implanting ions while using gate electrode 12 and side wall spacer 13 as an implantation mask. At the time of ion implantation, ions are implanted perpendicular to the main surface of the SOI substrate, in other words, at an angle of 0 degree with respect to the normal line of the main surface of the SOI substrate.

In SOI layer 3 having crystal orientation of (100), ions are implanted in the direction along the crystallographic axis. What is called a channeling occurs, so that the implanted impurity is introduced deep inside of SOI layer 3 with a low energy (for example, in the case of implanting phosphorus, 10 to 50 keV, and in the case of implanting boron, 5 to 30 keV). Source/drain layer 15 can be extended to a deep position near buried oxide film 2. As a result, by implanting a source/drain impurity with a low density into a deep position, a current leak from the silicide layer can be easily prevented and junction capacity can be easily reduced.

On the other hand, partial isolation oxide film PTX is in an amorphous state which does not have crystallizability. The source/drain impurity hardly reaches SOI layer 3 under partial isolation oxide film PTX, and the concentration of the impurity in channel stop layer N1 is not reduced.

Consequently, a resistance value of SOI layer 3 under partial isolation oxide film PTX can be maintained to be low.

Figure 74:
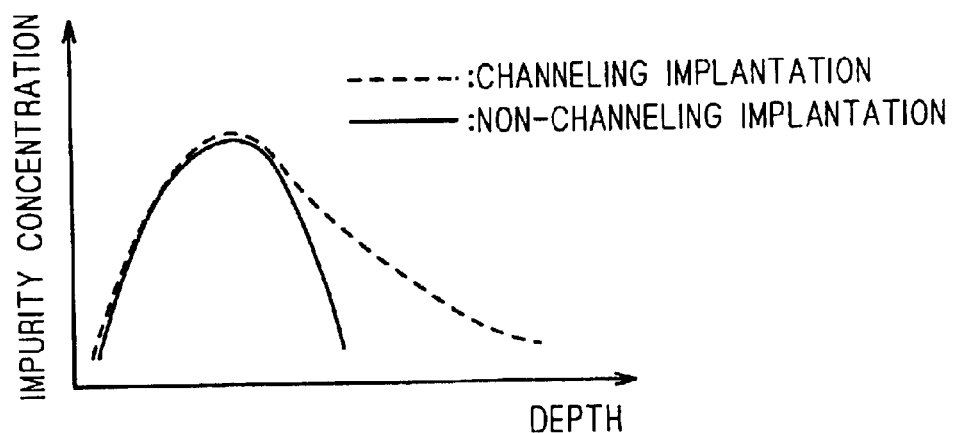
FIG. 74 is a diagram showing an impurity distribution by channeling implantation.

FIG. 74 shows an impurity distribution in the case where channeling implantation is performed and that in the case where non-channel implantation is performed.

In FIG. 74, the horizontal axis denotes the depth in a silicon layer, and the vertical axis indicates the concentration of impurity. An impurity profile obtained by the channeling implantation is shown by a broken line, and that obtained by the non-channeling implantation is shown by a solid line. As understood from the FIG. 74, the impurities are distributed to a deeper position by the channeling implantation.

The case where the crystal orientation of SOI layer 3 is (100) has been described. In this case, the channeling implantation is achieved not only by the implantation of 0 degree but also by implantation at an angle of 45 degrees from the normal line of the main surface of the SOI substrate (45-degree implantation). Similarly, also in the case where the crystal orientation of SOI layer 3 is (110), the channeling implantation can be carried out by the implantation at 0 degree and 45 degrees.

Although the configuration of extending source/drain layer 15 to a deep position by using channeling has been described in the foregoing ninth embodiment, by using channeling, without forming a particularly thick film on an active region, the channel stop implantation can be performed only in the SOI layer under the partial isolation oxide film having a small isolation step.

Figure 75:
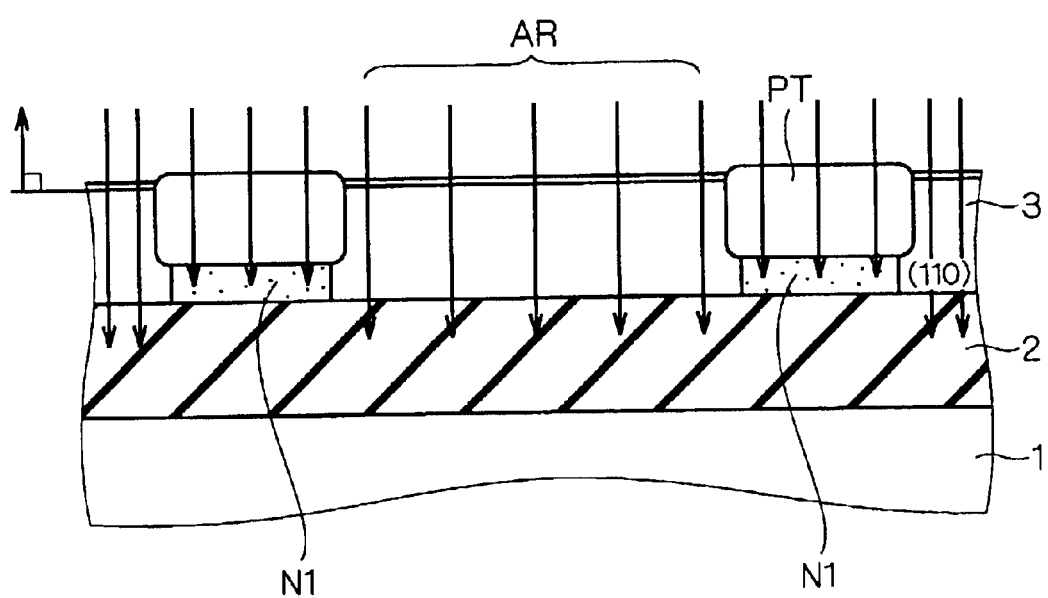
FIG. 75 is a cross section showing the method of fabricating the semiconductor device of the ninth embodiment according to the present invention.

FIG. 75 shows a state where the channel stop implantation is performed by using channeling. On active region AR specified by partial isolation oxide film PT formed by a conventional manner, only oxide film 4 serving as an implantation protection film is formed.

At the time of ion implantation, ions are implanted at an angle of 0 degree from the normal line of the main surface of the SOI substrate with an energy that impurities are implanted through partial isolation oxide film PT and the peak of an impurity profile is formed in SOI layer 3.

Therefore, in SOI layer 3 having the crystal orientation of (100), ions are implanted in the direction along the crystallographic axis, and channeling occurs. Consequently, impurity ions pass through SOI layer 3 and reach buries oxide film 2 or silicon substrate 1, and no channel stop layer of high concentration is not formed in SOI layer 3.

On the other hand, in SOI layer 3 under partial isolation oxide film PT, channel stop layer N1 of high density is formed.

As described above, by using the channeling, the channel stop implantation can be easily performed only in the SOI layer under the partial isolation oxide film having a small isolation step.

J. Tenth Embodiment

In the methods of fabricating a semiconductor device in the foregoing first to eighth embodiments, in addition to the channel stop implantation, channel implantation is performed. According to the methods, four kinds of resist masks are necessary to form two kinds of MOS transistors (refer to FIGS. 1 to 14). When the number of kinds of transistors increases, the number of kinds of implantation masks increases, the fabricating process becomes complicated, and the fabricating cost increases.

J-1. Fabricating Method

As a tenth embodiment according to the present invention, a fabricating method capable of suppressing an increase in the number of kinds of implantation masks in the case where the number of kinds of transistors increases will be described by referring to FIGS. 76 to 82 sequentially showing the fabricating processes.

In the following description, a case of forming PMOS and NMOS transistors having a high voltage, that is, a relatively high gate voltage and PMOS and NMOS transistors having a low voltage, that is, a relative low gate voltage will be described as an example. The same components as those in the second embodiment described by referring to FIGS. 14 to 20 are designated by the same reference numerals, and their description will not be repeated.

Figure 76:
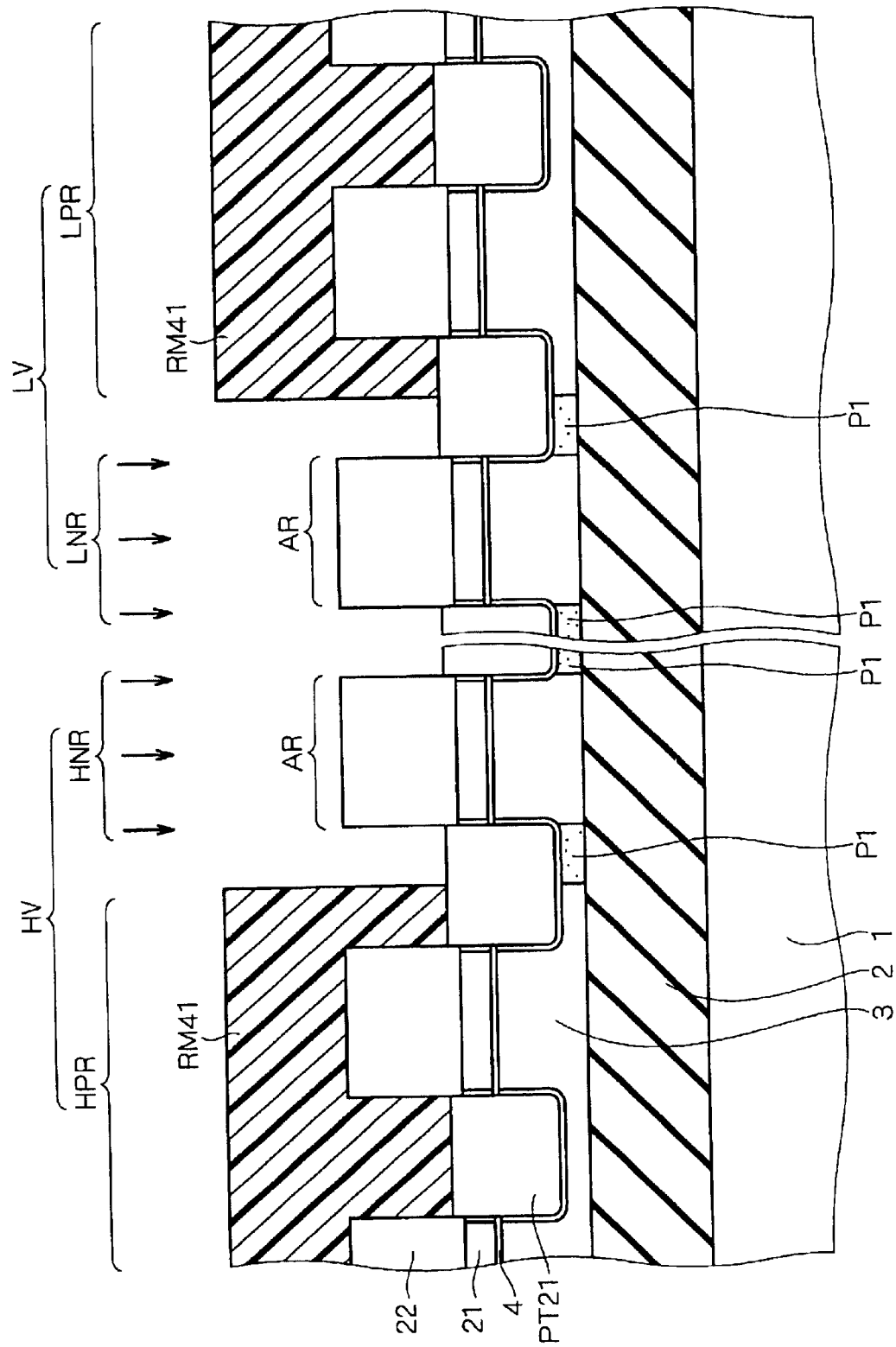
FIGS. 76 through 82 are cross sections showing a method of fabricating a semiconductor device of a tenth embodiment according to the present invention.

As shown in FIG. 76, the SOI substrate is divided into a region HV for forming a MOS transistor of a high voltage and a region LV for forming a MOS transistor of a low voltage. Region HV is divided into a region HPR for forming a PMOS transistor and a region HNR for forming an NMOS transistor. Region LV is divided into a region LPR for forming a PMOS transistor and a region LNR for forming an NMOS transistor.

In each of the regions, active region AR is specified by partial isolation oxide film PT21, and a multilayer film of polysilicon film 21 and nitride film 22 is disposed on active region AR.

In the process shown in FIG. 76, regions HPR and LPR are covered with a resist mask RM41. In regions HNR and LNR as an opening, channel stop implantation of P-type impurities is performed. A channel stop layer P1 of a high impurity concentration is formed in SOI layer 3 under partial isolation oxide film PT21 in the regions.

For example, if boron (B) is used as an impurity to be implanted in this case, its implantation energy is set to 30 to 100 keV, and a dose is set to $1 \times 10^{12}$ to $1 \times 10^{14}/cm^2$.

Figure 77:
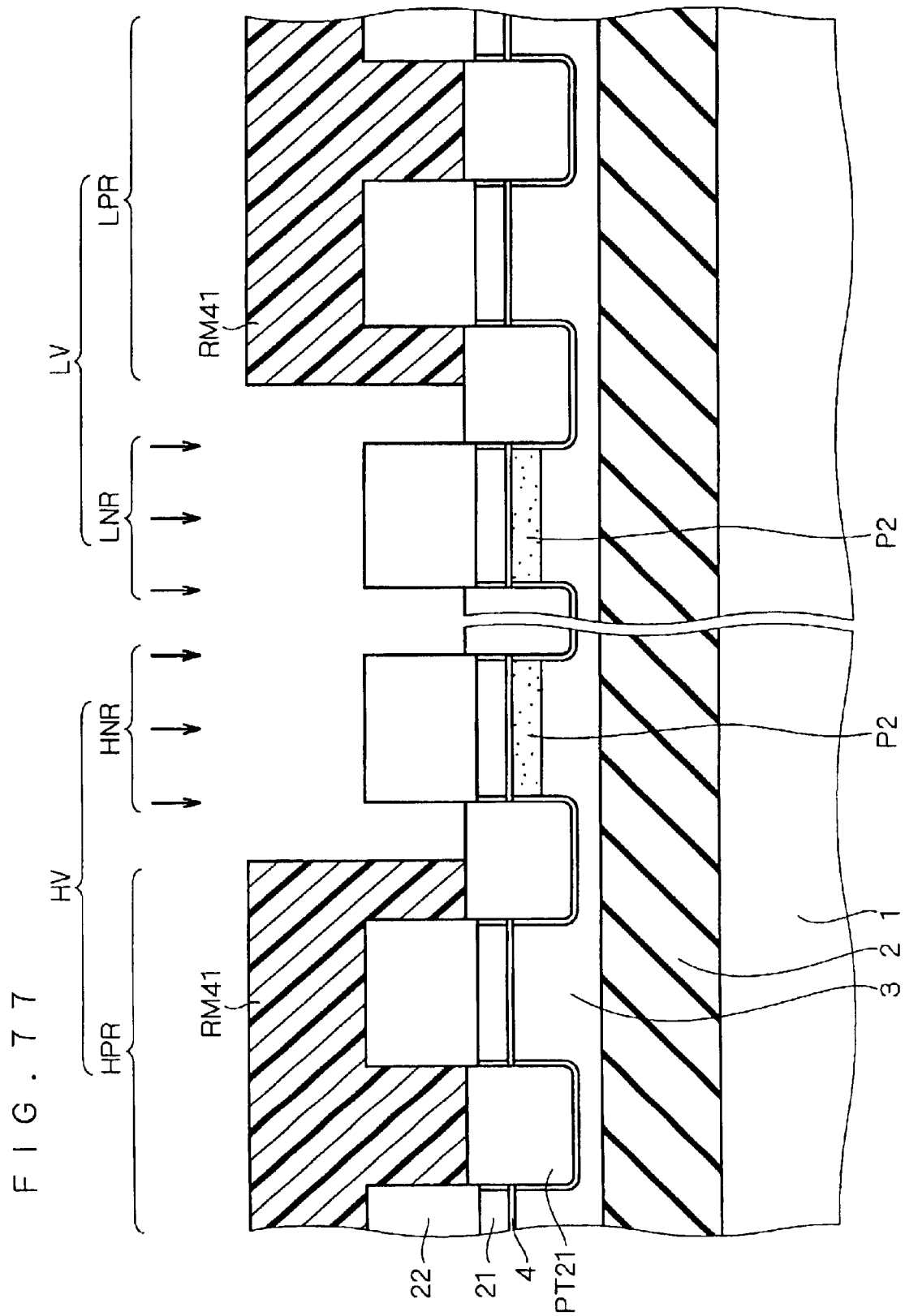

In a process shown in FIG. 77, in regions HNR and LNR, channel stop implantation of P-type impurities is performed by using the same resist mask RM41. A channel implantation layer P2 is formed in SOI layer 3 in active region AR of the regions.

For example, if boron (B) is used as the impurity to be implanted in this case, its implantation energy is set to 50 to 200 keV, and a dose is set to $1 \times 10^{12}$ to $1 \times 10^{14}/cm^2$.

Figure 78:
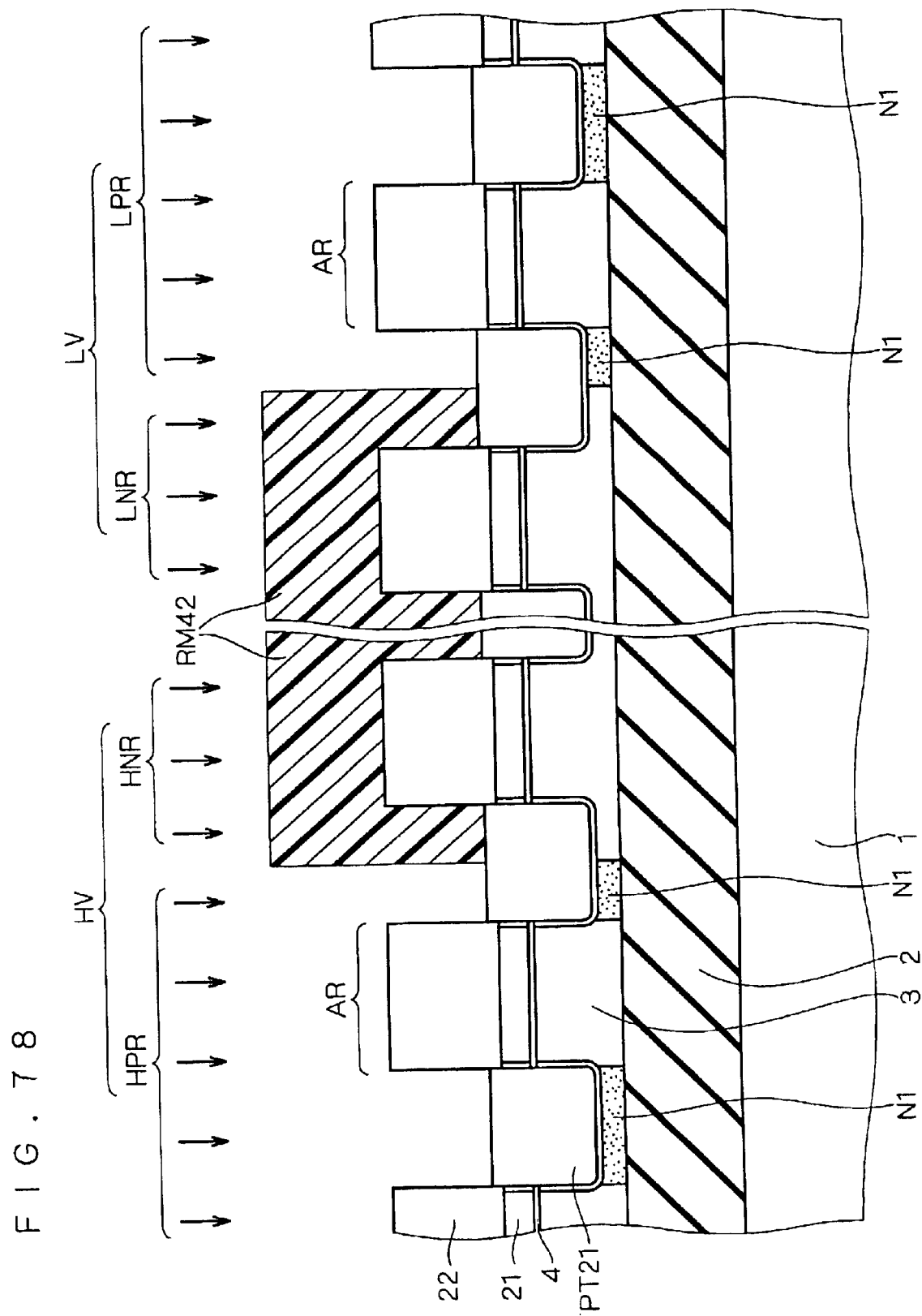

In a process shown in FIG. 78, regions HNR and LNR are covered with resist mask RM42. In regions HPR and LPR as an opening, channel stop implantation of N-type impurities is performed. A channel stop layer N1 of a high impurity concentration is formed in SOI layer 3 under partial isolation oxide film PT21 in the regions.

For example, if phosphorus (P) is used as an impurity to be implanted in this case, its implantation energy is set to 100 to 300 keV, and a dose is set to $1 \times 10^{12}$ to $1 \times 10^{14}/cm^2$.

Figure 79:
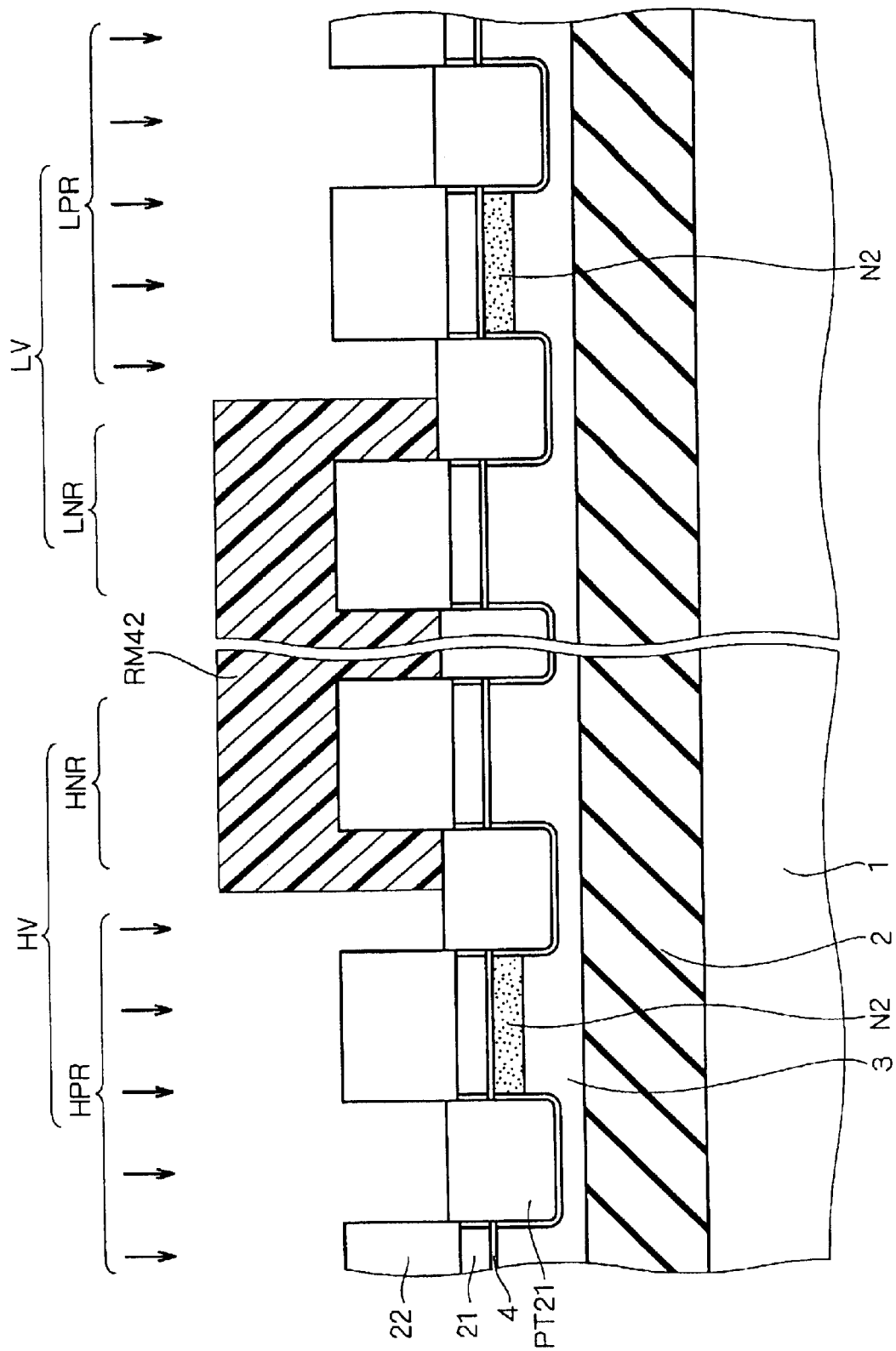

In a process shown in FIG. 79, in regions HPR and LPR, channel stop implantation of N-type impurities is performed by using the same resist mask RM42. A channel implantation layer N2 is formed in SOI layer 3 in active region AR of the regions.

For example, if arsenic (As) is used as the impurity to be implanted in this case, its implantation energy is set to 300 to 1000 keV, and a dose is set to $1 \times 10^{12}$ to $1 \times 10^{14}/cm^2$.

Figure 80:
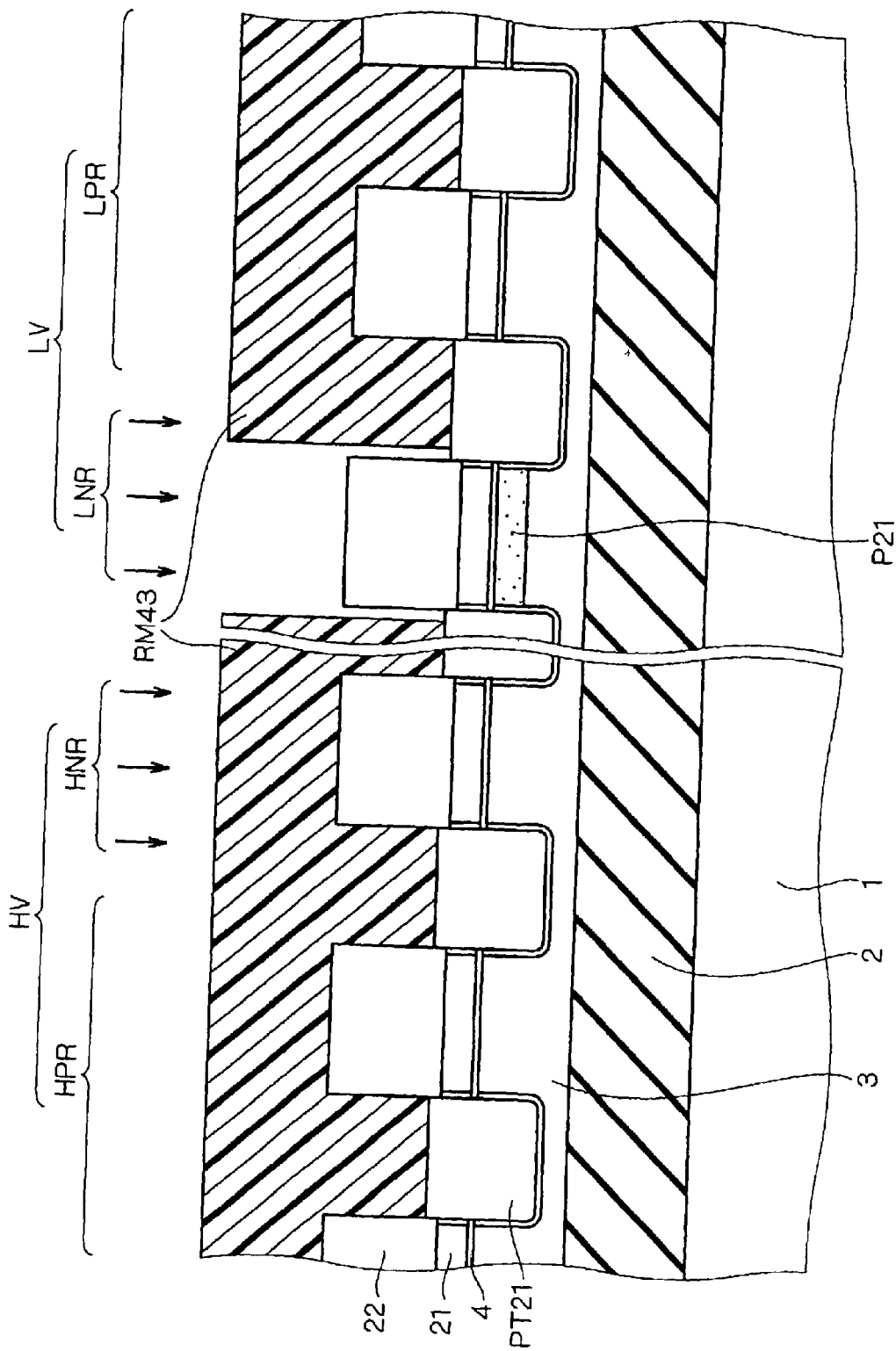

In a process shown in FIG. 80, a resist mask RM43 having an opening only over region LNR is formed. In region LNR as an opening, channel implantation of P-type impurities (additional implantation) is performed. The density of channel implantation layer P2 in SOI layer 3 in active region AR of the region increases, and a channel implantation layer P21 is formed.

For example, if boron (B) is used as the impurity to be implanted in this case, its implantation energy is set to 10 to 40 keV, and a dose is set to $1 \times 10^{11}$ to $1 \times 10^{13}/cm^2$.

Figure 81:
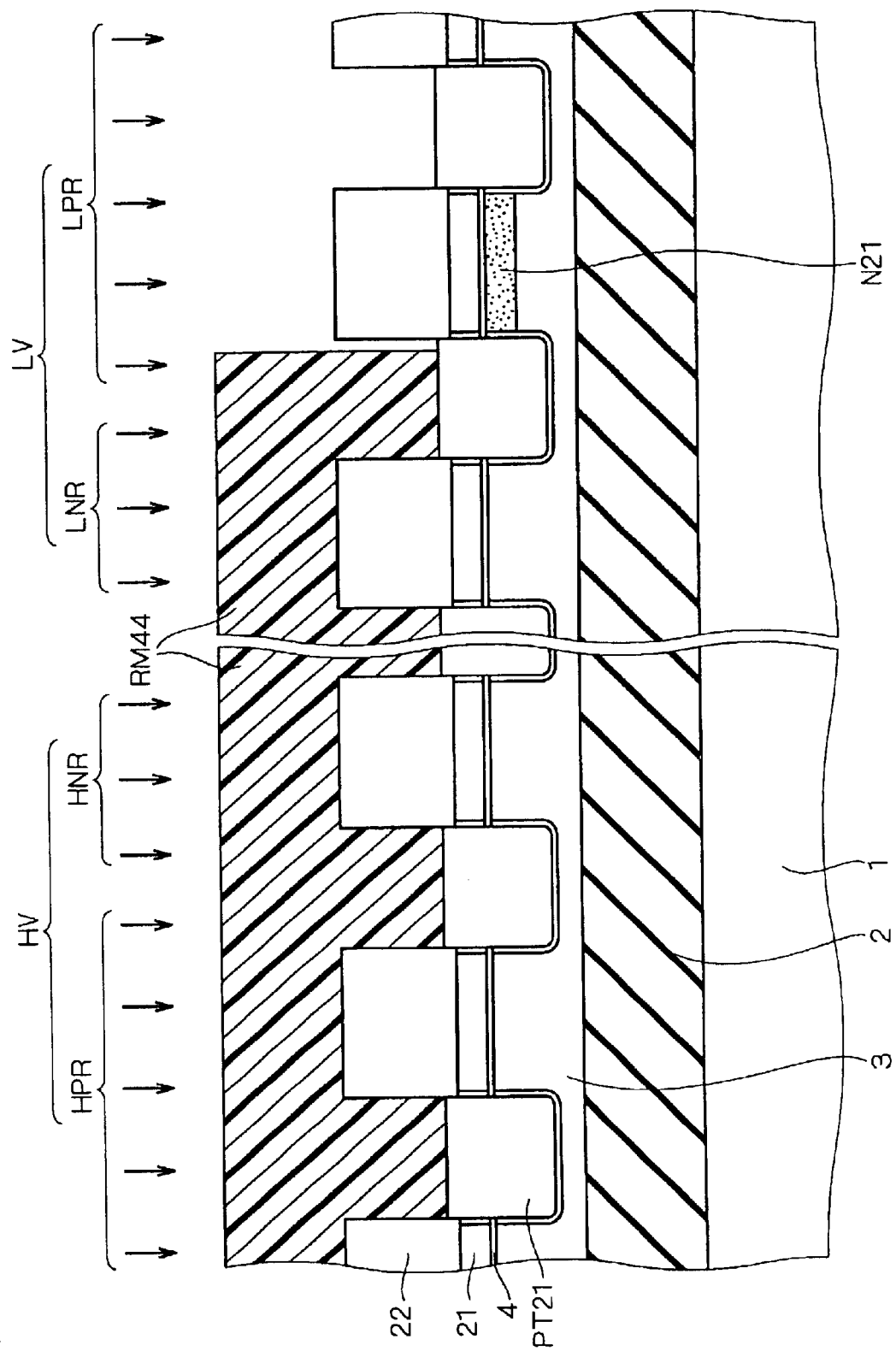

In a process shown in FIG. 81, a resist mask RM44 having an opening only over region LPR is formed. In region LPR as an opening, channel implantation of N-type impurities (additional implantation) is performed. The density of channel implantation layer N2 in SOI layer 3 in active region AR of the region increases, and a channel implantation layer P21 is formed.

For example, if arsenic (As) is used as the impurity to be implanted in this case, its implantation energy is set to 30 to 150 keV, and a dose is set to $1 \times 10^{11}$ to $1 \times 10^{13}/cm^2$.

Figure 82:
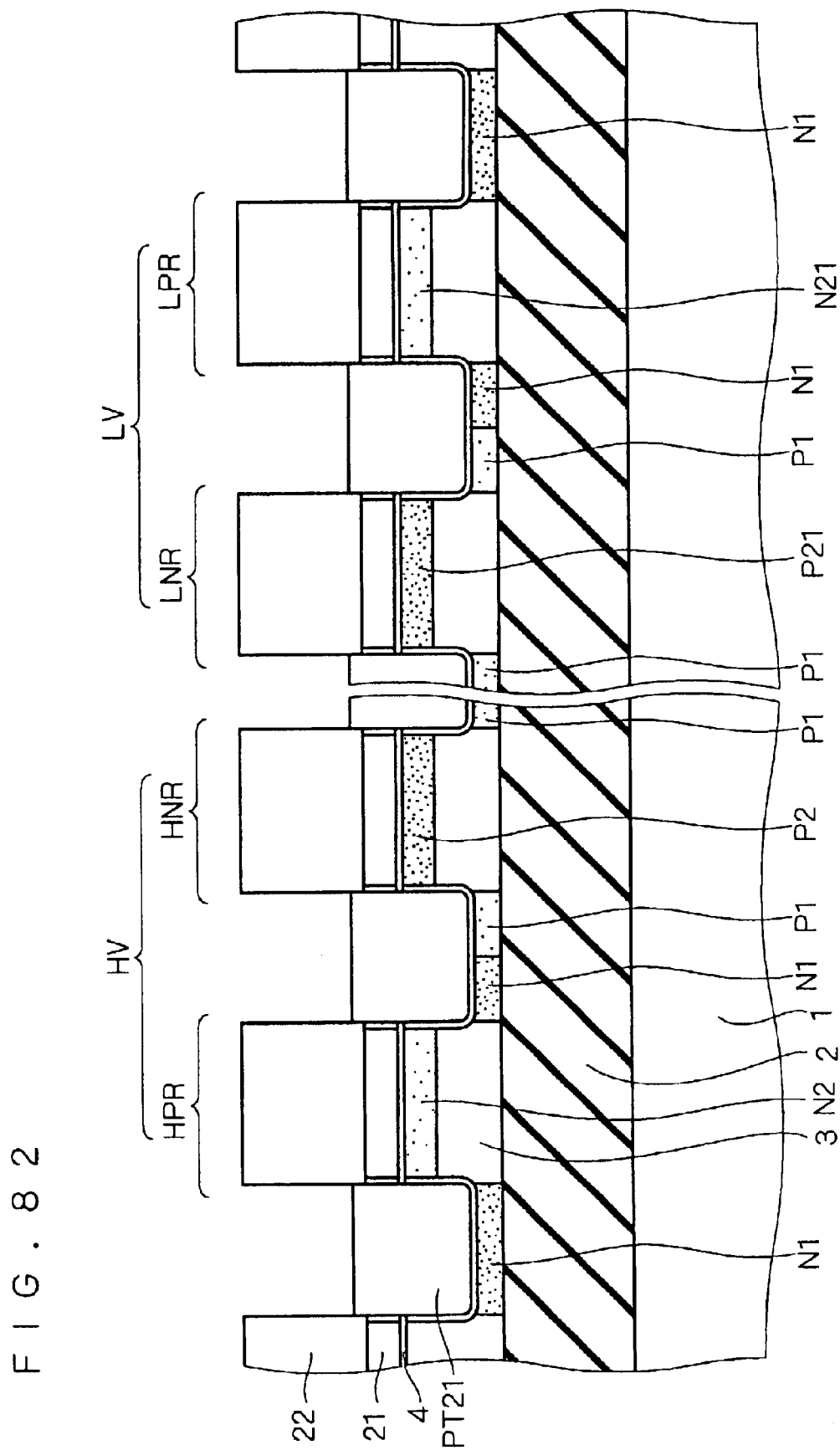

FIG. 82 shows a state where all of channel stop layers and channel implantation layers are formed.

J-2. Action and Effect

According to the fabricating method of the foregoing tenth embodiment, it is sufficient to perform the process of forming a resist mask four times to form four kinds of MOS transistors, so that an increase in fabricating cost can be suppressed.

In the above description, the impurity concentration in the channel implantation layer of a MOS transistor of a low voltage is set to be higher than that of the channel implantation layer of a MOS transistor of a high voltage. Channel implantation of the MOS transistor of the high voltage is performed also in the MOS transistor of the low voltage. By performing additional implantation in the MOS transistor of the low voltage, a desired impurity concentration is achieved. When the impurity concentration of the channel implantation layer of the MOS transistor of the low voltage is lower than that of the channel implantation layer of the MOS transistor of the high voltage, obviously, it is sufficient to exchange the processes.

J-3. Modification

In the fabricating method of the foregoing tenth embodiment, the case of performing the impurity implantation in a state of partial isolation oxide film PT21 having a large isolation step including the additional implantation of channel impurities has been described. After completion of formation of the channel stop layer, the isolation step of partial isolation oxide film PT21 is reduced and, in a state where partial isolation oxide film PT2 is formed, impurities may be implanted.

Specifically, as described by referring to FIG. 79, channel implantation layer N2 is formed by performing channel implantation of N-type impurity in regions HPR and LPR. After that, resist mask RM42 is removed and partial isolation oxide film PT21 is etched by, for example, the hydrofluoric acid (HF) process, thereby forming partial isolation oxide film PT2 with a reduced isolation step.

Figure 83:
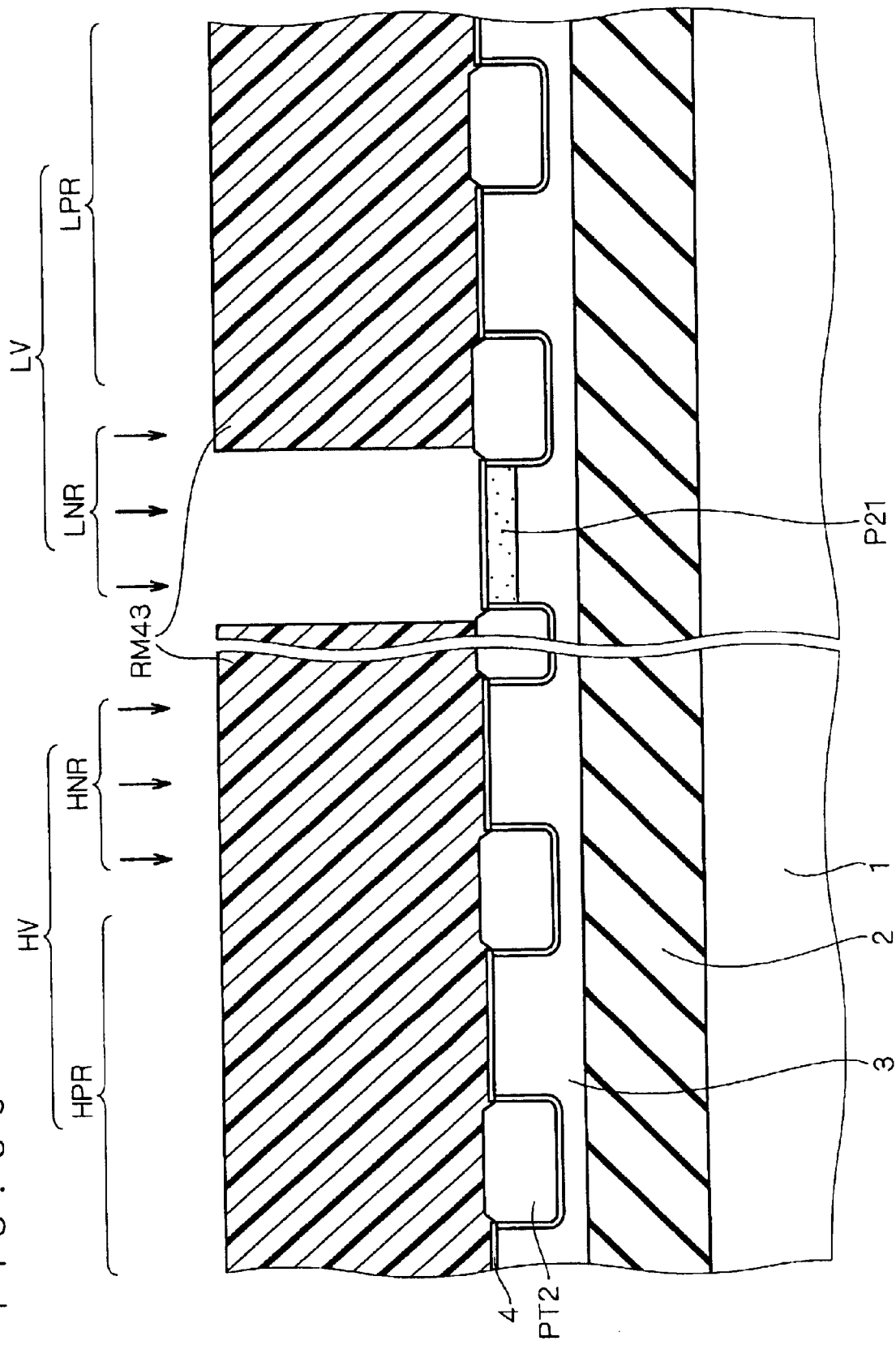
FIGS. 83 through 85 are cross sections showing a fabricating method of a modification of the tenth embodiment according to the present invention.

After that, polysilicon film 21 on oxide film 4 is removed by wet etching or dry etching having selectivity with an oxide film, thereby obtaining partial isolation oxide film PT2 as shown in FIG. 83.

In a process shown in FIG. 83, resist mask RM43 having an opening only above region LNR is formed. In region LNR as an opening, channel implantation (additional implantation) of P-type impurity is performed so that the concentration of channel implantation layer P2 in SOI layer 3 in active region AR in the region increases, thereby forming channel implantation layer P21.

For example, if boron (B) is used as the impurity to be implanted in this case, its implantation energy is set to 10 to 40 keV, and a dose is set to $1\times10^{11}$ to $1\times10^{13}/cm^2$.

Figure 84:
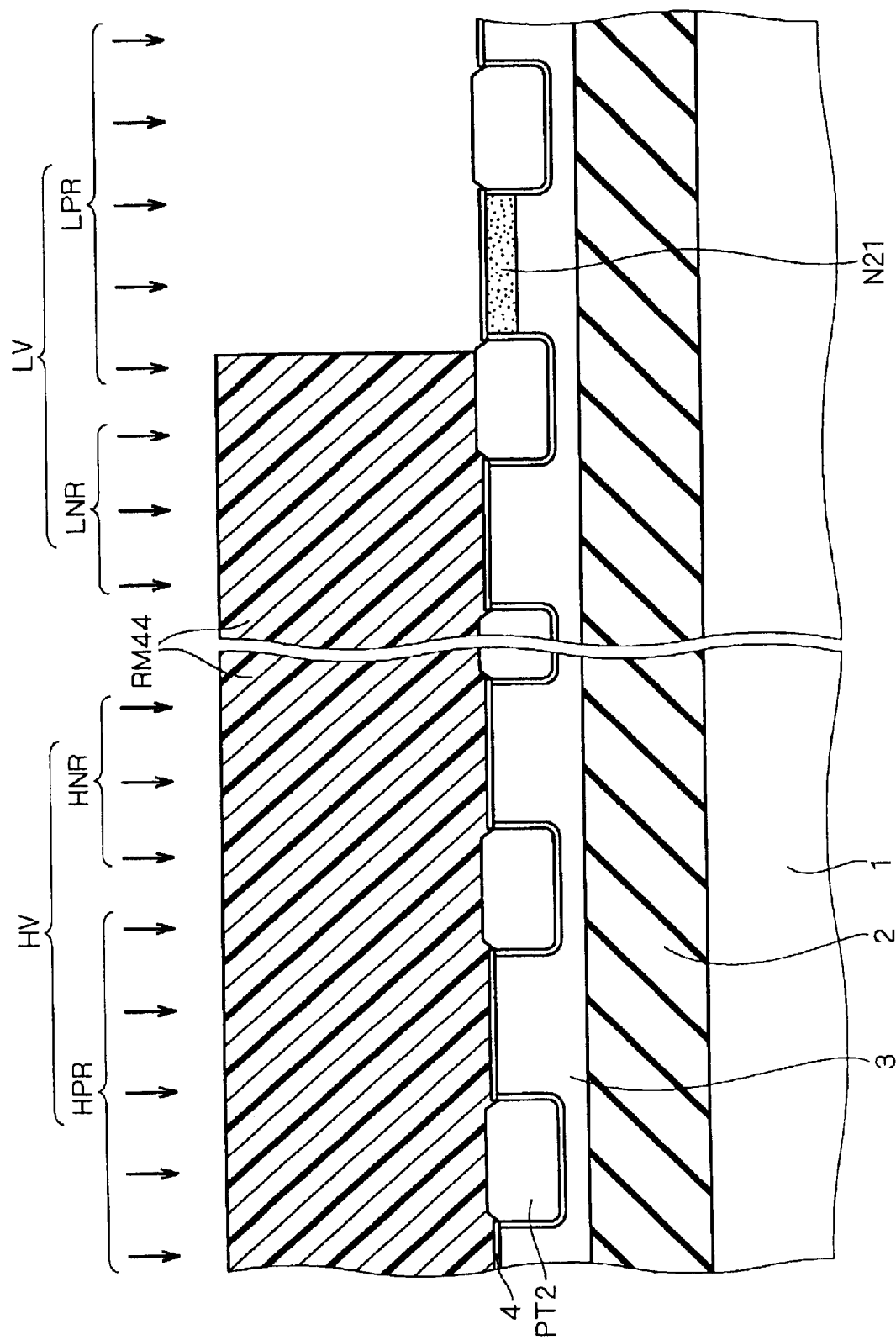

In a process shown in FIG. 84, resist mask RM44 as an opening only over region LPR is formed. In region LPR as an opening, channel implantation (additional implantation) of N-type impurity is performed so that the concentration of channel implantation layer N2 in SOI layer 3 in active region AR in the region increases, thereby forming channel implantation layer N21.

For example, if arsenic (As) is used as the impurity to be implanted in this case, its implantation energy is set to 30 to 150 keV, and a dose is set to $1\times10^{11}$ to $1\times10^{13}/cm^2$.

Figure 85:
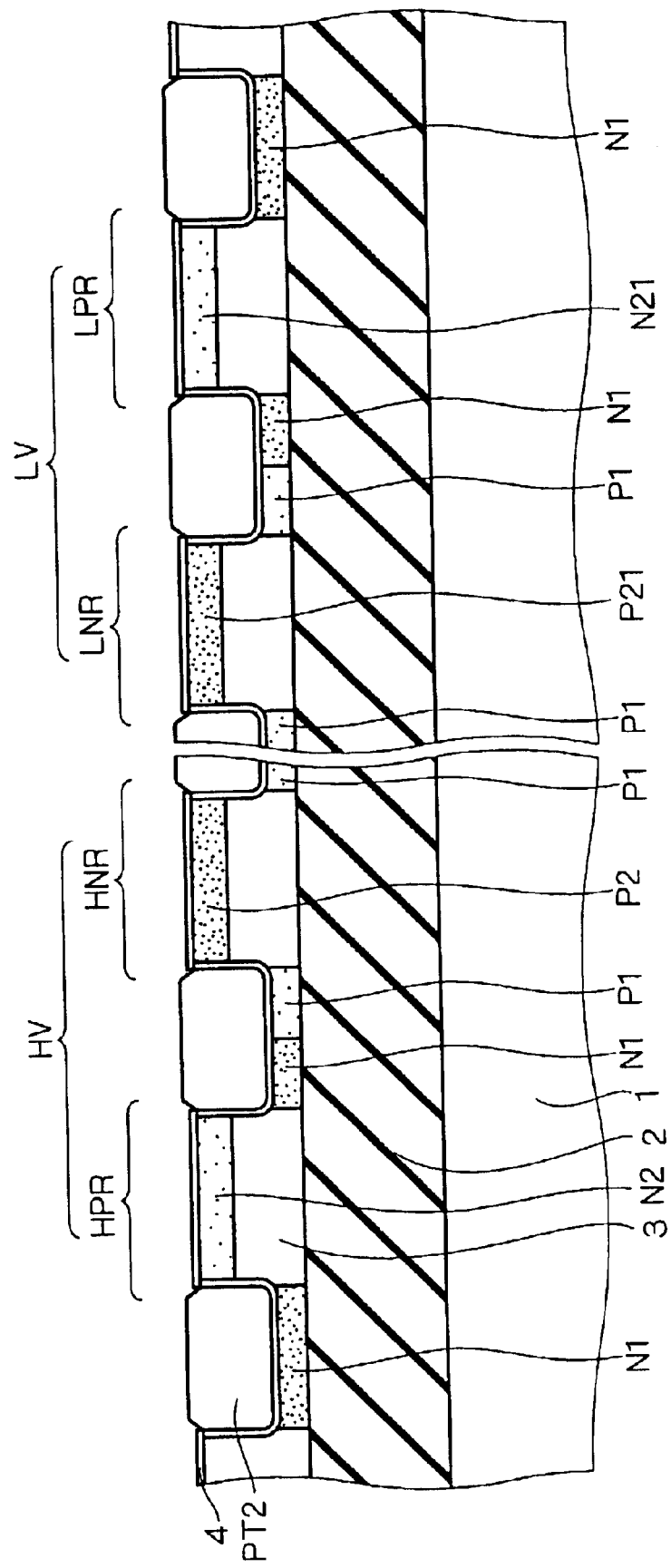

FIG. 85 shows a state where all of channel stop layers and channel implantation layers are formed.

K. Eleventh Embodiment

In the semiconductor device fabricating methods of the foregoing first to tenth embodiments, the case where the SOI layer under the partial isolation oxide film is implanted with the high-concentration impurity of the conduction type different from that of the source/drain layer, thereby forming the channel stop layer has been described. In this case, however, in the junction with the source/drain layer containing similarly high concentration of impurity, there is the possibility that the junction capacitance increases.

In order to reduce the junction capacitance, it is sufficient to reduce a junction area. As an eleventh embodiment of the present invention, a fabricating method capable of reducing the junction area will be described hereinbelow.

K-1. Fabricating Method

Figure 86:
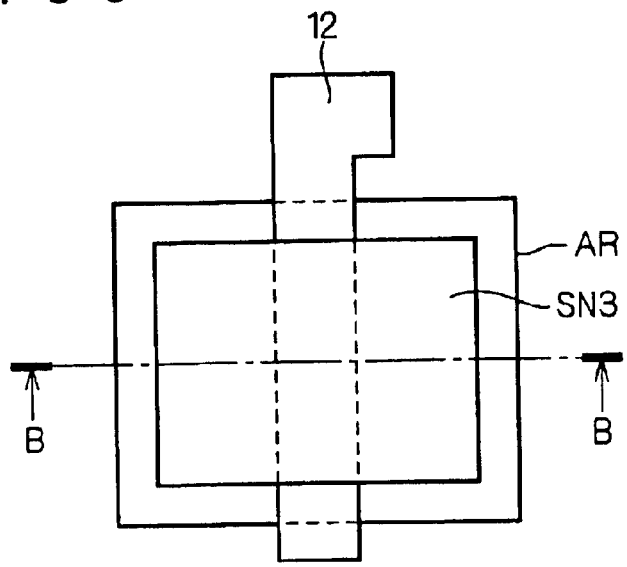
FIG. 86 is a plan view showing a method of fabricating a semiconductor device of an eleventh embodiment according to the present invention.

FIG. 86 is a plan view showing a MOS transistor according to the embodiment and shows a configuration that gate electrode 12 on active region AR is covered with a nitride film SN3. Nitride film SN3 is disposed to cover not only gate electrode 12 but also active region AR.

Figure 87:
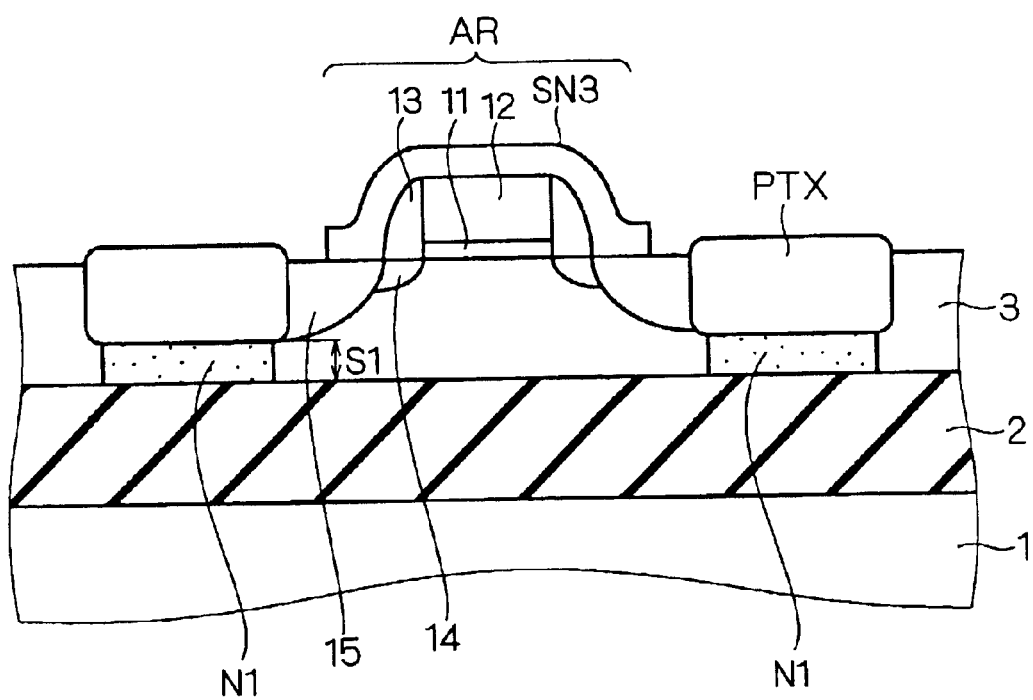
FIGS. 87 and 88 are cross sections showing the method of fabricating the semiconductor device of the eleventh embodiment according to the present invention.

FIG. 87 is a cross section taken along line B—B of FIG. 86. The configuration of the MOS transistor is, for example, similar to the PMOS transistor in SOI device 100 described by referring to FIG. 13. The same components are designated by the same reference numerals and their description will not be repeated. FIG. 87 shows a state where the MOS transistor is being fabricated and, particularly, at a stage before an interlayer insulating film or the like is formed.

As shown in FIG. 87, nitride film SN3 is disposed on gate electrode 12 and active region AR. In SOI layer 3 under partial isolation oxide film PTX (formed by any of the methods of the first to eighth embodiments) for specifying active region AR, channel stop layer N1 is formed by using an N-type impurity.

In this state, the thickness of channel stop layer N1 is S1 which is almost equal to the distance from the bottom of a trench formed at the time of forming partial isolation oxide film PTX to buried oxide film 2.

Although it is not shown that source/drain layer 15 is not joined to channel stop layer N1 in FIG. 87, in the case where source/drain layer 15 and channel stop layer N1 are joined to each other, the junction area is determined by thickness S1 of channel stop layer N1.

Figure 88:
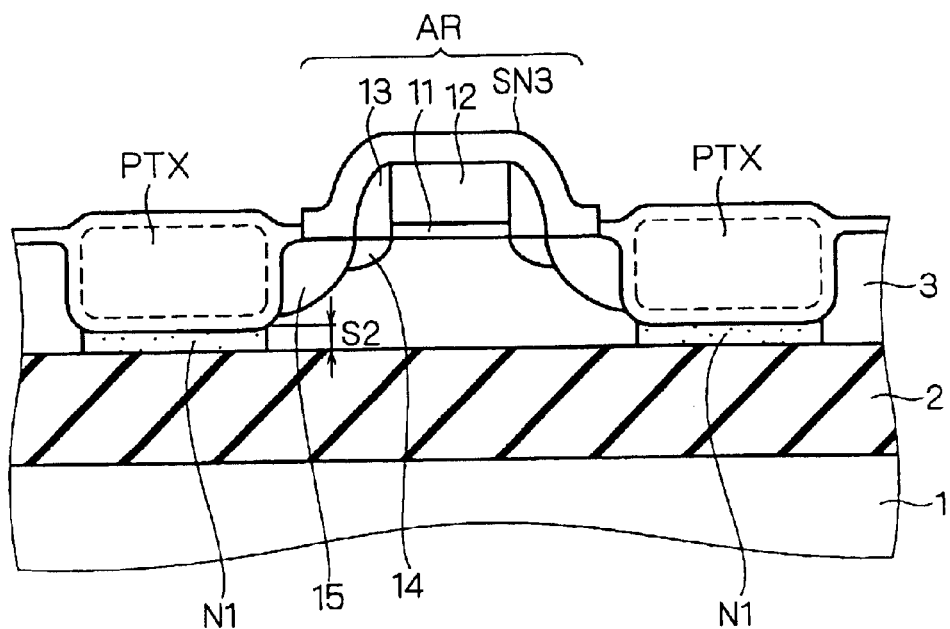

FIG. 88 shows a state where, in order to reduce thickness S1 of channel stop layer N1, partial isolation oxide film PTX is subjected to thermal oxidation to enlarge its cross sectional area. The thickness of channel stop layer N1 is reduced to S2 only by an amount corresponding to the enlarged amount of partial isolation oxide film PTX. A portion covered with nitride film SN3 is not oxidized, and the thickness of gate insulating film 11 does not change. Nitride film SN3 functions as an oxidation preventing film.

K-2. Action and Effect

According to the fabricating method of the eleventh embodiment, by enlarging the cross sectional area of the partial isolation oxide film, the thickness of the channel stop layer is reduced, so that the junction area can be reduced and the junction capacitance can be reduced.

K-3. Modification

Figure 89:
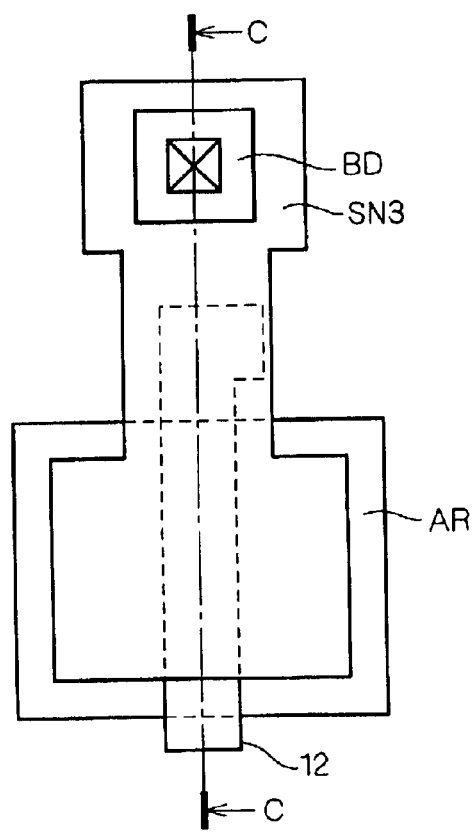
FIGS. 89 througn 91 are plan views showing the method of fabricating the semiconductor device of the eleventh embodiment according to the present invention.

Although gate electrode 12 on active region AR is covered with nitride film SN3 as an oxidation preventing film in the above description, as shown in FIG. 89, a portion from active region AR toward body region BD may be covered with nitride film SN3.

Body region BD is a region for supplying a potential to fix the potential of the channel formation region. The potential applied here is to be applied to the channel formation region via the SOI layer under the partial isolation oxide film.

Figure 90:
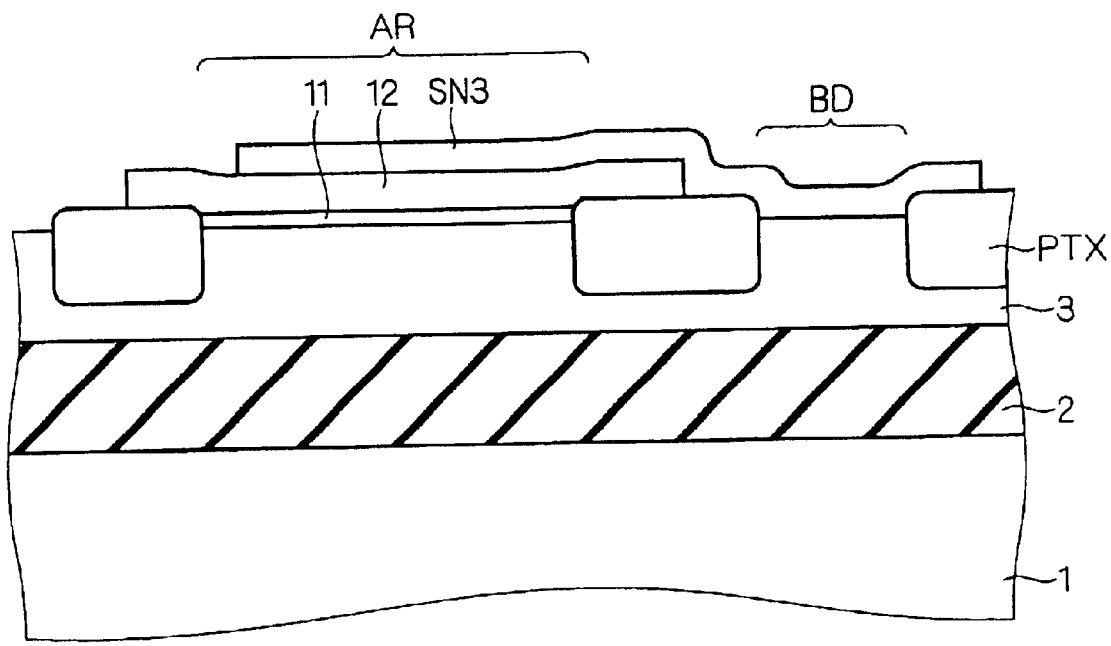

FIG. 90 is a cross section taken along line B—B of FIG. 89. As shown in FIG. 90, body region BD and active region AR are electrically connected to each other via SOI layer 3 under partial isolation oxide film PTX. Also on partial isolation oxide film PTX as a path, nitride film SN3 is disposed.

Figure 91:
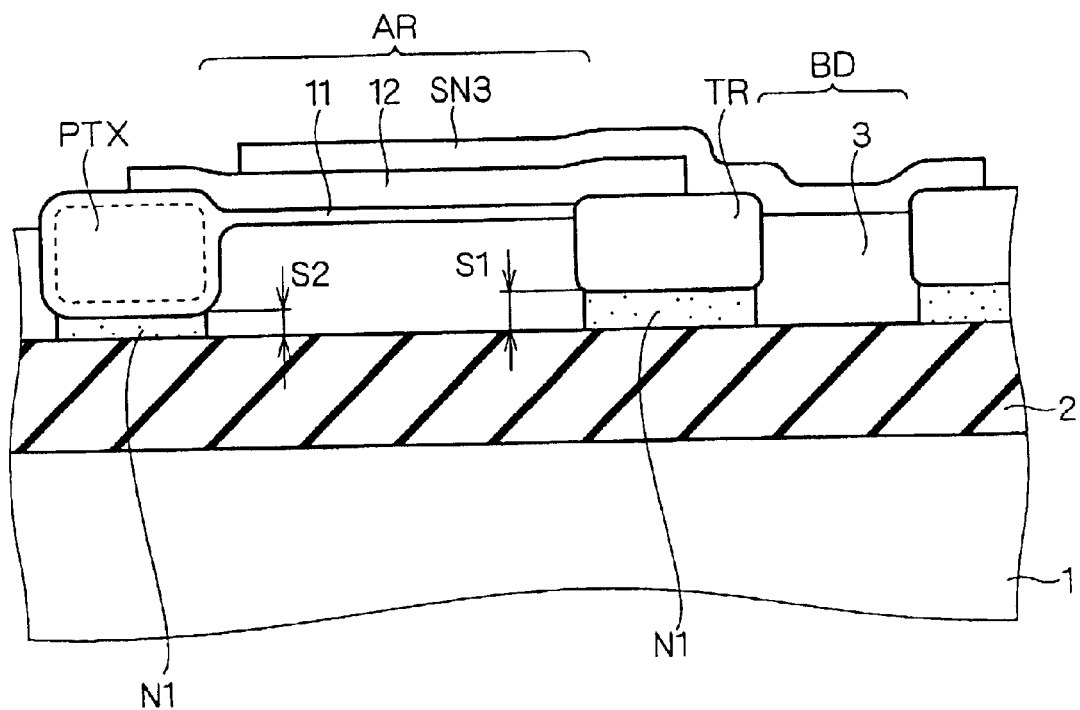
Figure 92:
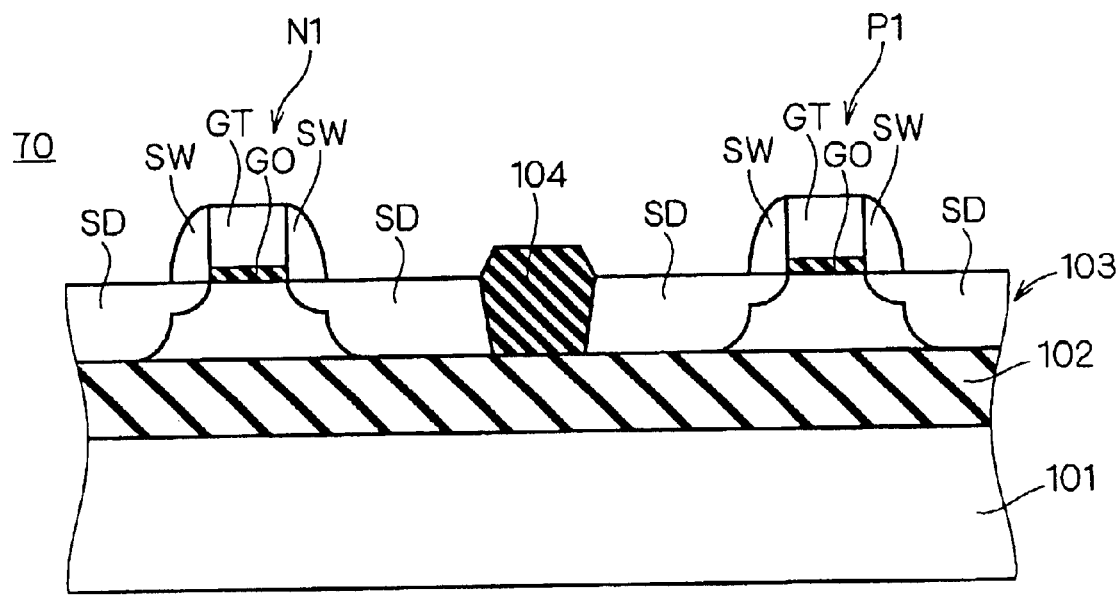
FIGS. 92 and 93 are cross sections for explaining the configuration of a conventional semiconductor device.
Figure 93:
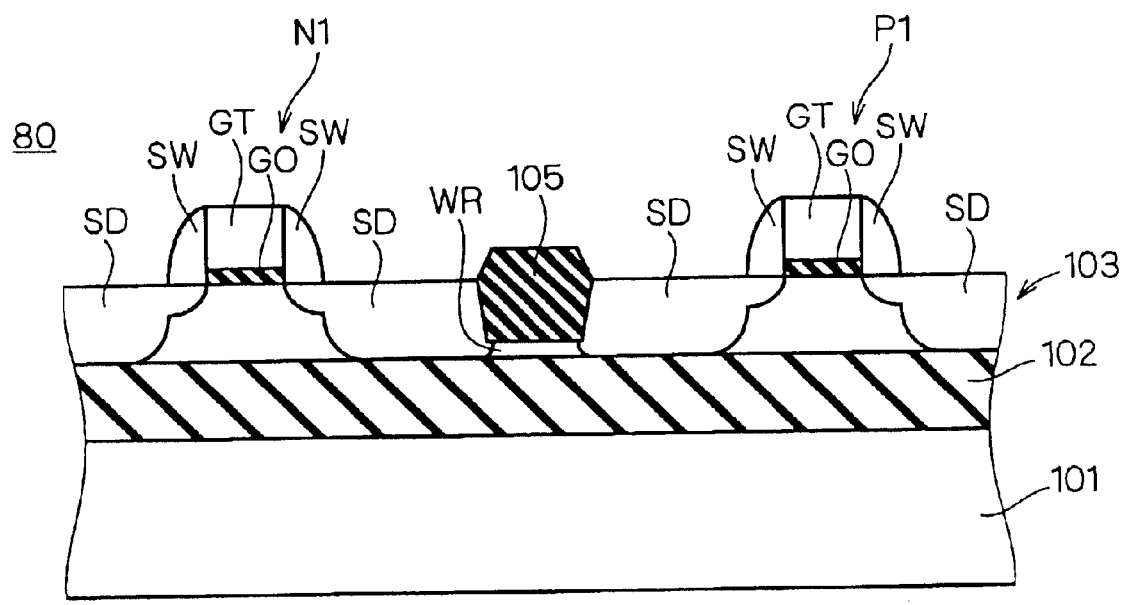
Figure 94:
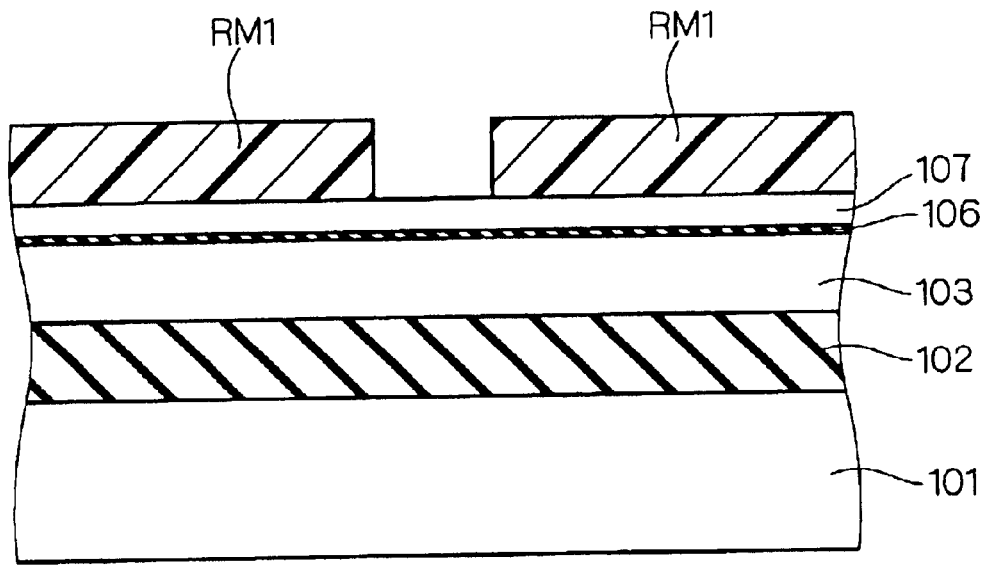
FIGS. 94 through 100 are cross sections for explaining a fabricating process of the conventional semiconductor device.
Figure 95:
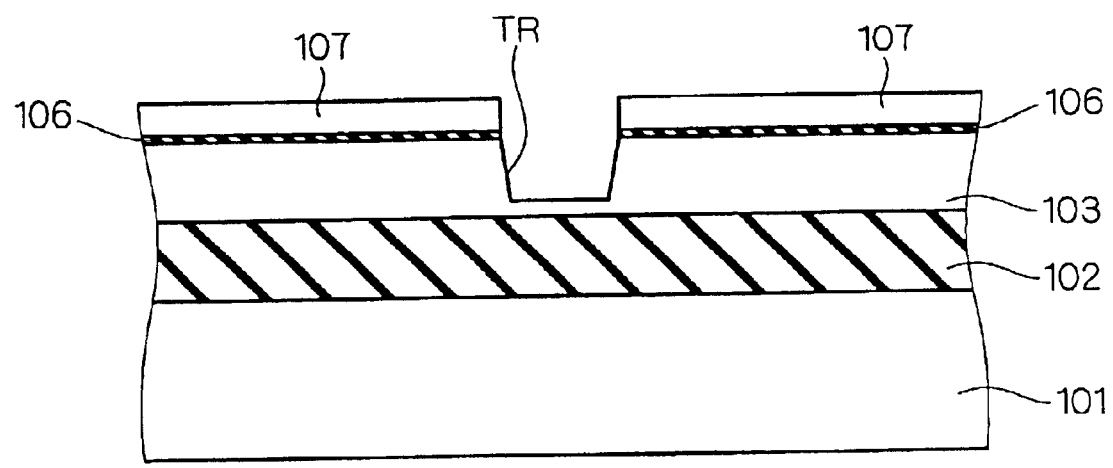
Figure 96:
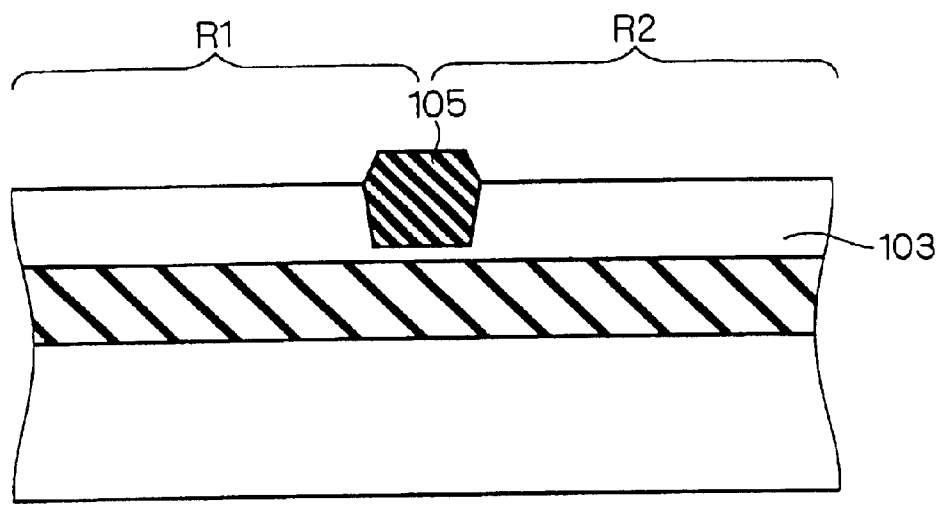
Figure 97:
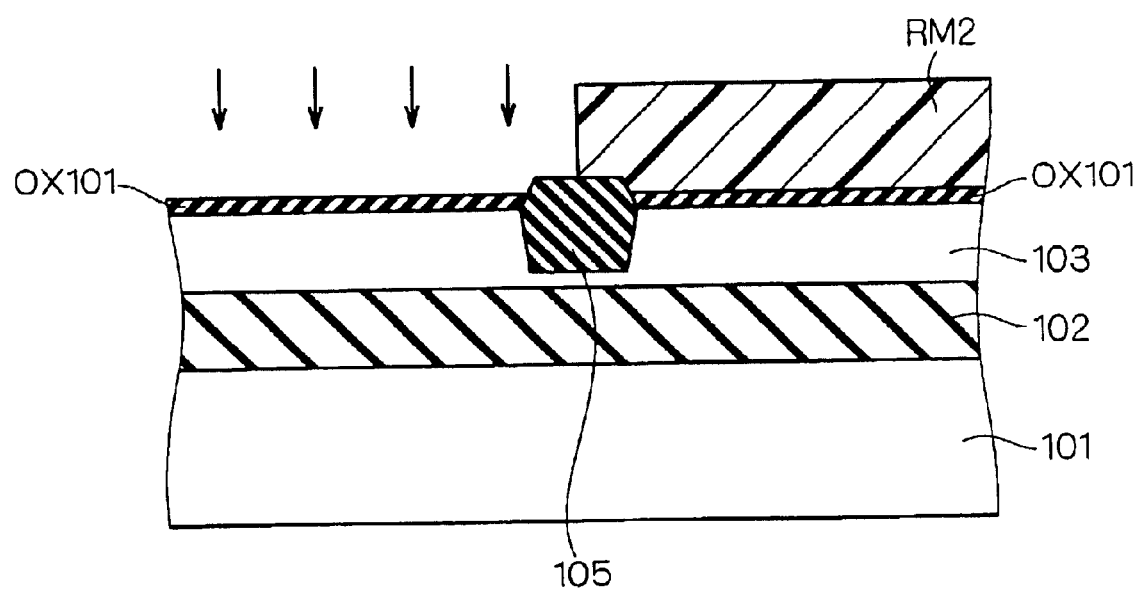
Figure 98:
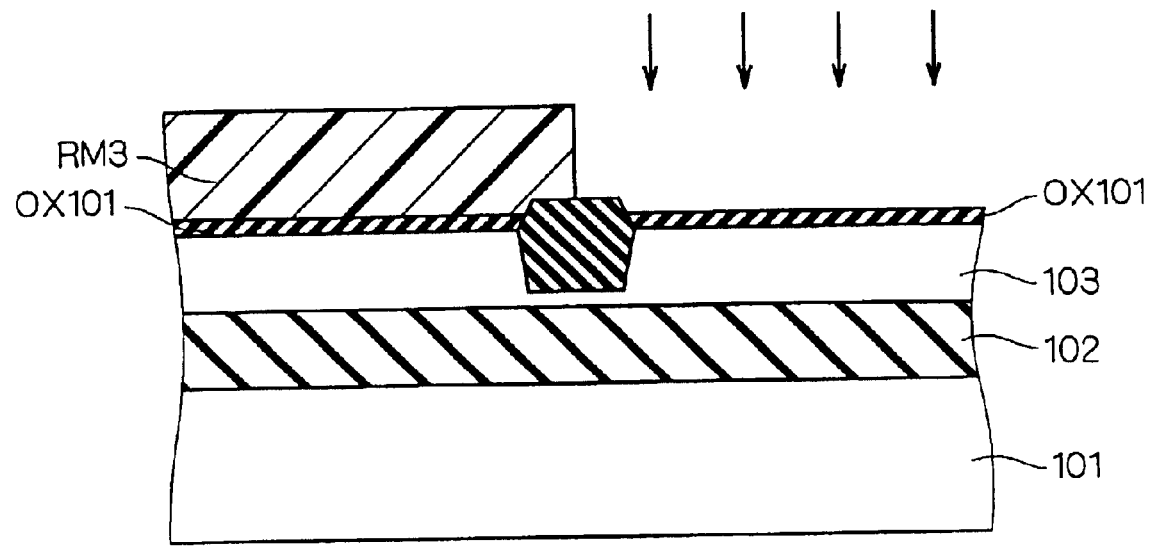
Figure 99:
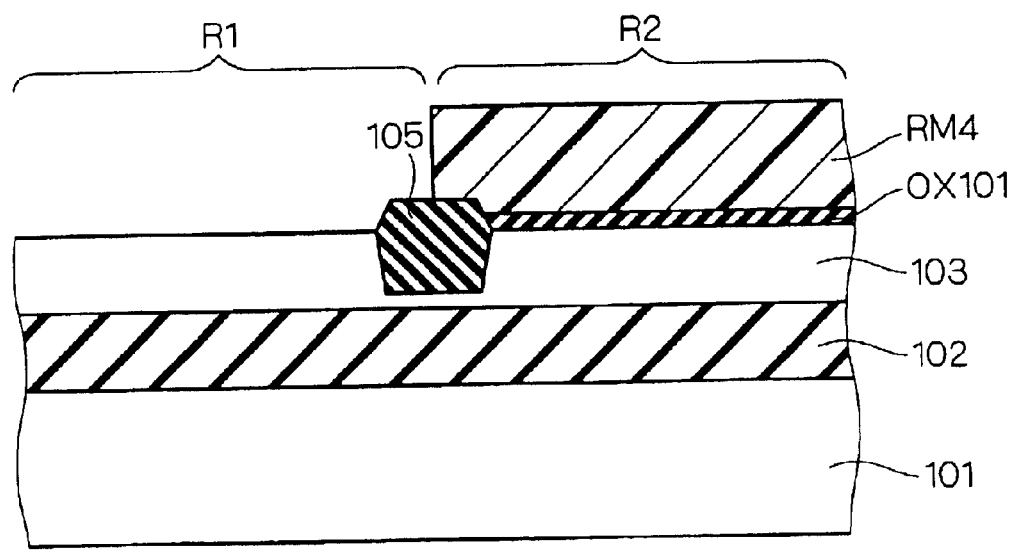
Figure 100:
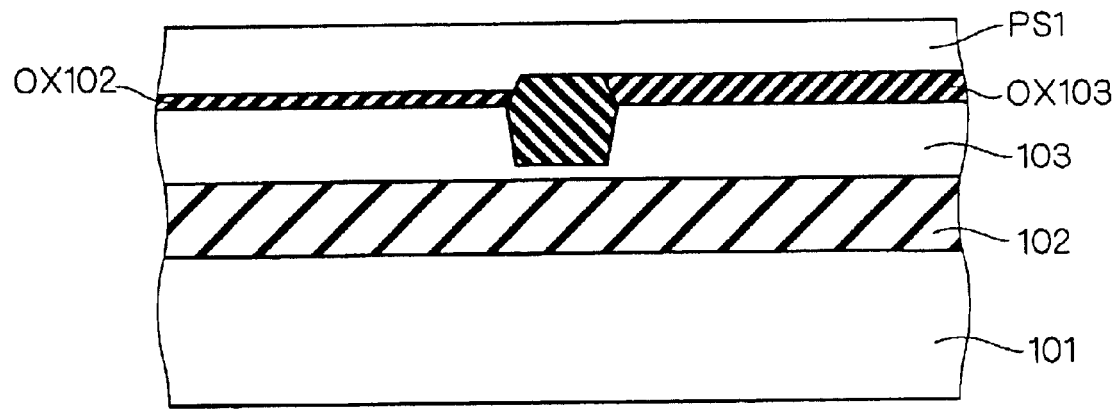
Figure 101:
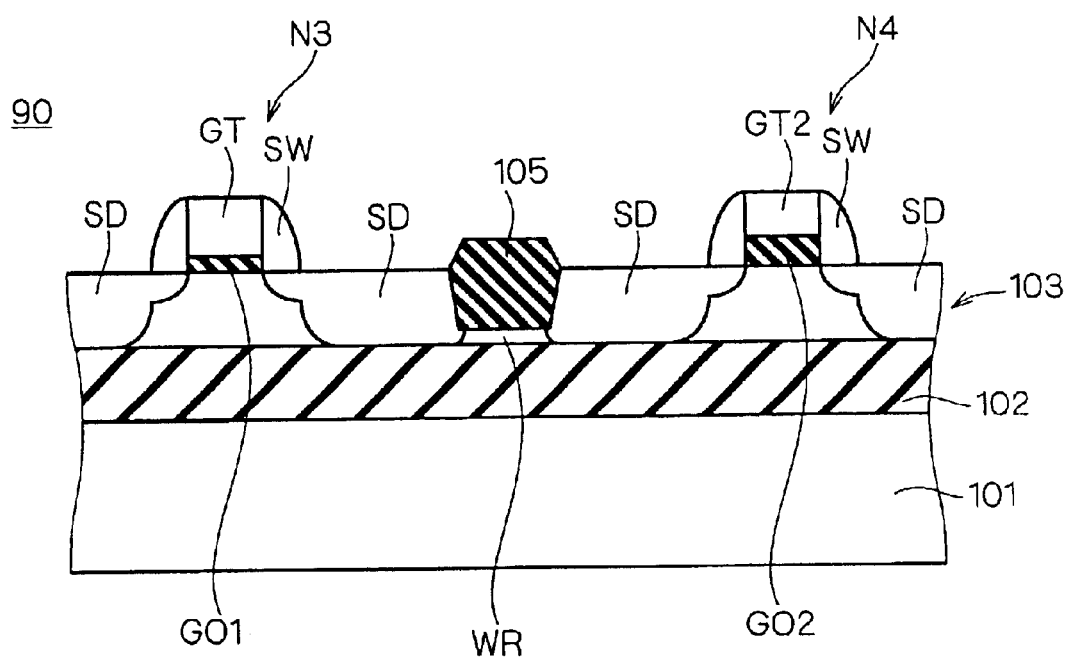
FIG. 101 is a cross section for explaining the configuration of the conventional semiconductor device.
Figure 102:
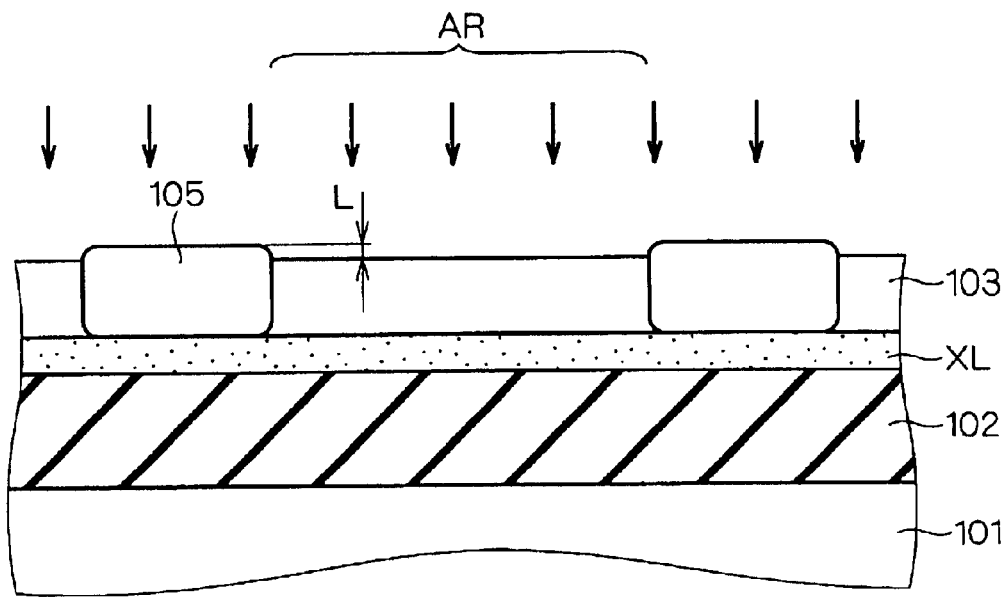
FIGS. 102 and 103 are cross sections for explaining a problem of the conventional semiconductor device.
Figure 103:
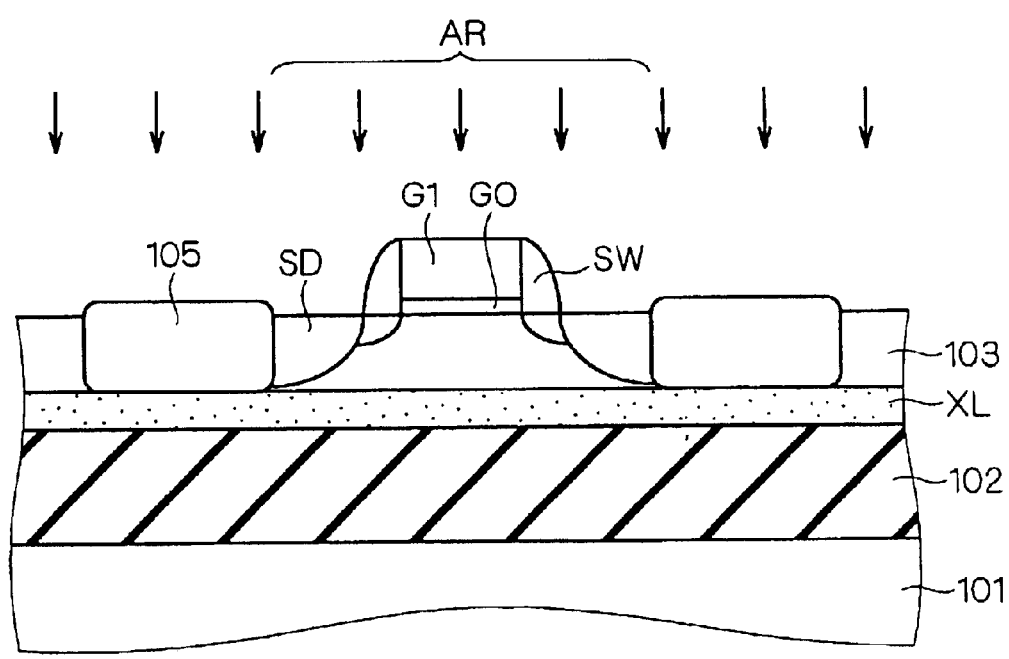

FIG. 91 shows a state where partial isolation oxide film PTX is subjected to thermal oxidation. The cross sectional area of partial isolation oxide film PTX in the region which is not covered with nitride film SN3 becomes larger and, as described above, the thickness of channel stop layer N1 is reduced to S2. On the other hand, partial isolation oxide film PTX in the portion covered with nitride film SN3 is not oxidized and the thickness of channel stop layer N1 remains as S1.

In such a manner, by increasing the thickness of channel stop layer N1 under partial isolation oxide film PTX serving as an electric connection path to body region BD and active region AR, electric resistance (body resistance) of the path can be reduced, and the potential in active region AR can be easily fixed.

As described above, it is desirable that the body resistance in the channel stop layer under the partial isolation oxide film serving as the electric connection path of the body region and active region is lower. Consequently, the impurity concentration of the channel stop layer is set to be high.

However, even if the P-type channel stop layer constructing the channel stop layer of an NMOS transistor has the same impurity concentration as that of the N-type channel stop layer constructing the channel stop layer of a PMOS transistor, dues to its physical properties, its resistance value is higher than that of the N-channel stop layer.

Consequently, it is sufficient to form the N-type channel stop layer so that the impurity concentration is higher than that of the P-type channel stop layer or to preliminarily introduce an N-type impurity, for example, boron into the partial isolation oxide film.

Specifically, at the time of forming the partial isolation oxide film by HDP-CVD, it is sufficient to add $BH_3$ gas to CVD gas or introduce boron by ion implantation after formation of the partial isolation oxide film. A dose at that time is set to $1 \times 10^{13}$ to $1 \times 10^{15}/cm^2$.

By the arrangement, in a later heat treatment process, the P-type impurity in the partial isolation oxide film is diffused into the P-type channel stop layer to thereby increase the concentration.

On the contrary, the P-type impurity in the channel stop layer is diffused into the partial isolation oxide film, so that the impurity concentration can be prevented from decreasing.

In this case, the partial isolation oxide film including the P-type impurity is also formed in the region where a PMOS transistor is to be formed. However, an influence of a change in a resistance value due to diffusion of the P-type impurity into the N-type channel stop layer is small.

In the foregoing first to eleventh embodiments, an SOI device has been described as an example. The present invention can be applied to a semiconductor device in which a channel stop layer is formed in a semiconductor layer under an isolation oxide film. For example, also in the case of a bulk device directly formed on a silicon substrate, a similar effect can be produced.

While the present invention has been shown and described in detail, the foregoing description is in all aspects illustrative and not restrictive. It is therefore understood that numerous modifications and variations can be devised without departing from the scope of the present invention.

What is claimed is:

1. A method of fabricating a semiconductor device comprising at least one kind of a MOS transistor on a semiconductor layer, and a trench isolation oxide film for defining at lest one active region as a region in which said MOS transistor is formed and electrically isolating said MOS transistor, comprising the steps of:
   (a) forming an auxiliary film for forming said trench isolation oxide film on said semiconductor layer;
   (b) forming a trench penetrating said auxiliary film and reaching a predetermined depth in said semiconductor layer;
   (c) forming said trench isolation oxide film by filling said trench with an oxide film and, after that, removing said auxiliary film on said active region by a predetermined thickness to thereby make said trench isolation oxide film project from a main surface of said auxiliary film;
   (d) implanting ions of an impurity of a conduction type different from that of a source/drain layer of said MOS transistor with energy by which the ions pass through said trench isolation oxide film and pass through the at least one active region, wherein after said step (c), a peak of a profile is formed in said semiconductor layer under said trench isolation oxide film and beneath the semiconductor layer under said active region; and
   (e) reducing the thickness of said trench isolation oxide film after formation of said channel stop layer.

2. The method of fabricating a semiconductor device according to claim 1, wherein
   said step (a) includes a step of forming said auxiliary film by a multilayer film,
   said multilayer film has, in accordance with the order from said semiconductor layer side, a first oxide film, a first polysilicon film, a second oxide film, a second polysilicon film, and a nitride film for mask, and
   said step (c) includes a step of removing said nitride film for mask and said second polysilicon film in said auxiliary film on said active region.

3. The method of fabricating a semiconductor device according to claim 2, wherein
   said step (a) includes a step of forming said second polysilicon film so as to be thicker than said first polysilicon film.

4. The method of fabricating a semiconductor device according to claim 1, wherein
   said step (a) includes a step of forming said auxiliary film by a multilayer film,
   said multilayer film has, in accordance with the order from said semiconductor layer side, a first oxide film, a first polysilicon film, and a nitride film for mask,
   said step (c) includes a step of completely removing said nitride film for mask in said auxiliary film on said active region, and
   a step of removing said first polysilicon film by a predetermined thickness.

5. The method of fabricating a semiconductor device according to claim 4, wherein
   said step (e) includes a step of covering the surface of said trench isolation oxide film projected from the main surface of said auxiliary film and the surface of said first polysilicon film with a second oxide film and, after that, removing said trench isolation oxide film together with said second oxide film by dry etching.

6. The method of fabricating a semiconductor device according to claim 4, wherein
   said step (e) includes a step of covering said trench isolation oxide film projected from the main surface of said auxiliary film and said first polysilicon film with a second oxide film and removing said trench isolation oxide film together with said second oxide film by wet etching.

7. The method of fabricating a semiconductor device according to claim 4, wherein
   said step (e) includes the steps of:
   covering said trench isolation oxide film projected from the main surface of said auxiliary film and said first polysilicon film with a second oxide film; and
   reducing thickness of said second oxide film by dry etching, forming a side wall spacer of an oxide film on side faces of said trench isolation oxide film, and removing said trench isolation oxide film together with said side wall spacer by wet etching.

8. The method of fabricating a semiconductor device according to claim 4, wherein said step (e) includes the steps of:

forming a side wall spacer of a nitride film on side faces of said trench isolation oxide film projected from the main surface of said auxiliary film; and removing said trench isolation oxide film surrounded by said side wall spacer by wet etching.

9. The method of fabricating a semiconductor device according to claim 1, wherein said step (d) includes a step of implanting said impurity obliquely.

10. The method of fabricating a semiconductor device according to claim 1, wherein said step (a) includes a step of forming said auxiliary film by a multilayer film, said multilayer film has, in accordance with the order from said semiconductor layer side, a first oxide film, a first polysilicon film, a second oxide film, and a nitride film for mask, and said step (c) includes a step of removing said nitride film for mask in said auxiliary film on said active region.

11. The method of fabricating a semiconductor device according to claim 1, wherein said semiconductor layer has crystallizability, and the method further comprises, after said step (e), a step of implanting ions of an impurity of said source/drain layer of said MOS transistor at an angle that the implanted ions cause channeling at the time of implantation of ions into said semiconductor layer.

12. The method of fabricating a semiconductor device according to claim 1, wherein said active region is divided into:

a high-voltage region in which a high-voltage MOS transistor having a relatively high gate voltage is formed; and a low-voltage region in which a low-voltage MOS transistor having a relatively low gate voltage, a dose of the impurity for adjusting the threshold value of said low-voltage MOS transistor is higher than a dose of the impurity for adjusting the threshold value of said high-voltage MOS transistor, the method further comprises:

a first ion implanting step of implanting ions of said impurity for adjusting the threshold value of said high-voltage MOS transistor; and a second ion implanting step of implanting ions of said impurity for adjusting the threshold value of said low-voltage MOS transistor, and said first ion implanting step is executed also in said low-voltage region.

13. The method of fabricating a semiconductor device according to claim 1, wherein said active region has:

a high-voltage region in which a high-voltage MOS transistor having a relatively high gate voltage is formed; and a low-voltage region in which a low-voltage MOS transistor having a relatively low gate voltage is formed, a dose of the impurity for adjusting the threshold value of said high-voltage MOS transistor is higher than a dose of the impurity for adjusting the threshold value of said low-voltage MOS transistor, the method further comprises:

a first ion implanting step of implanting ions of said impurity for adjusting the threshold value of said low-voltage MOS transistor; and a second ion implanting step of implanting ions of said impurity for adjusting the threshold value of said high-voltage MOS transistor, and said first ion implanting step is executed also in said high-voltage region.

14. The method of fabricating a semiconductor device according to claim 1, wherein said trench isolation oxide film contains a p-type impurity.

15. The method of fabricating a semiconductor device according to claim 1, wherein said semiconductor layer corresponds to an SOI layer of an SOI substrate having a silicon substrate, a buried oxide film disposed on the silicon substrate, and said SOI layer disposed on the buried oxide film, and said trench isolation oxide film is a partial isolation oxide film having said SOI layer between its bottom and said buried oxide film.

16. A method of fabricating a semiconductor device comprising at least one kind of a MOS transistor on a semiconductor layer, and a trench isolation oxide film for defining at lest one active region as a region in which said MOS transistor is formed and electrically isolating said MOS transistor, comprising the steps of:

(a) forming an auxiliary film for forming said trench isolation oxide film on said semiconductor layer;

(b) forming a trench penetrating said auxiliary film and reaching a predetermined depth in said semiconductor layer;

(c) forming said trench isolation oxide film by filling said trench with an oxide film and removing said trench isolation oxide film to a uniform predetermined thickness;

(d) after said step (c), implanting ions of an impurity of a conduction type different from that of a source/drain layer of said MOS transistor with energy by which the ions pass through said trench isolation oxide film but do not reach the said at least one active region, wherein a peak of a profile is generated in said semiconductor layer under said trench isolation oxide film in a state where said auxiliary film remains on said active region, thereby forming channel stop layers in said semiconductor layer under said trench isolation oxide film; and (e) after formation of said channel stop layers, further reducing the thickness of said trench isolation oxide film.

17. The method of fabricating a semiconductor device according to claim 16, wherein said step (a) includes a step of forming said auxiliary film by a multilayer film, and said multilayer film has, in accordance with the order from said semiconductor layer side, a first oxide film, a first polysilicon film, and a nitride film for mask.

18. The method of fabricating a semiconductor device according to claim 17, wherein said step (a) includes a step of forming said nitride film for mask to be thicker than said first polysilicon film.

19. The method of fabricating a semiconductor device according to claim 16, wherein said step (c) includes a step (c-1) of introducing an impurity into said oxide film filled in said trench and removing said oxide film filled in said trench by wet etching.

20. The method of fabricating a semiconductor device according to claim 19, wherein said step (c-1) includes a step of introducing said impurity by ion implantation with an energy by which an implantation range is 100 to 200 nm at a dose of $4 \times 10^{14}/\text{cm}^2$ or higher.

21. The method of fabricating a semiconductor device according to claim 16, further comprising, after said step (c) and before said step (d), a step of forming a side wall spacer of a nitride film on an inner wall face of said trench, wherein said step (d) includes a step of implanting ions of said impurity in a state where said sidewall spacer is formed.

22. The method of fabricating a semiconductor device according to claim 16, wherein said semiconductor layer has crystallizability, and the method further comprises, after said step (e), a step of implanting ions of an impurity of said source/drain layer of said MOS transistor at an angle that the implanted ions cause channeling at the time of implantation of ions to said semiconductor layer.

23. The method of fabricating a semiconductor device according to claim 16, wherein said active region is divided into:

a high-voltage region in which a high-voltage MOS transistor having a relatively high gate voltage is formed; and a low-voltage region in which a low-voltage MOS transistor having a relatively low gate voltage is formed, a dose of the impurity for adjusting the threshold value of said low-voltage MOS transistor is higher than a dose of the impurity for adjusting the threshold value of said high-voltage MOS transistor, the method further comprises:

a first ion implanting step of implanting ions of said impurity for adjusting the threshold value of said high-voltage MOS transistor; and a second ion implanting step of implanting ions of said impurity for adjusting the threshold value of said low-voltage MOS transistor, and said first ion implanting step is executed also in said low-voltage region.

24. The method of fabricating a semiconductor device according to claim 16, wherein said active region has:

a high-voltage region in which a high-voltage MOS transistor having a relatively high gate voltage is formed; and a low-voltage region in which a low-voltage MOS transistor having a relatively low gate voltage is formed, a dose of the impurity for adjusting the threshold value of said high-voltage MOS transistor is higher than a dose of the impurity for adjusting the threshold value of said low-voltage MOS transistor, the method further comprises:

a first ion implanting step of implanting ions of said impurity for adjusting the threshold value of said low-voltage MOS transistor; and a second ion implanting step of implanting ions of said impurity for adjusting the threshold value of said high-voltage MOS transistor, and said first ion implanting step is executed also in said high-voltage region.

25. The method of fabricating a semiconductor device according to claim 16, wherein said trench isolation oxide film contains a p-type impurity.

26. The method of fabricating a semiconductor device according to claim 16, wherein said semiconductor layer corresponds to an SOI layer of an SOI substrate having a silicon substrate, a buried oxide film disposed on the silicon substrate, and said SOI layer disposed on the buried oxide film, and said trench isolation oxide film is a partial isolation oxide film having said SOI layer between its bottom and said buried oxide film.

27. A method of fabricating a semiconductor device comprising a trench isolation oxide film for defining an active region as a region in which a MOS transistor is formed on a semiconductor layer having crystallizability and electrically isolating said MOS transistor, comprising the steps of:

(a) forming said trench isolation oxide film in a main surface of said semiconductor layer; and (b) implanting ions of an impurity of a conduction type different from that of a source/drain layer of said MOS transistor at an angle that the implanted ions cause channeling at the time of implantation of ions to said semiconductor layer, wherein said impurity implantation is performed with energy by which the impurity passes through said trench isolation oxide film and through said active region, wherein a peak of a profile is formed in said semiconductor layer under said trench isolation oxide film and beneath the semiconductor layer under said active region.

28. The method of fabricating a semiconductor device according to claim 27, wherein said angle at which channeling occurs is 0 degree or 45 degrees with respect to a normal line to the main surface of said semiconductor layer.

29. The method of fabricating a semiconductor device according to claim 28, wherein said semiconductor layer corresponds to an SOI layer of an SOI substrate having a silicon substrate, a buried oxide film disposed on the silicon substrate, and said SOI layer disposed on the buried oxide film, and said trench isolation oxide film is a partial isolation oxide film having said SOI layer between its bottom and said buried oxide film.

30. A method of fabricating a semiconductor device comprising at least one kind of a MOS transistor on a semiconductor layer, and a trench isolation oxide film for defining at least one active region as a region in which said MOS transistor is formed and electrically isolating said MOS transistor, comprising the steps of:

(a) forming an auxiliary film for forming said trench isolation oxide film on said semiconductor layer;

(b) forming a trench penetrating said auxiliary film and reaching a predetermined depth in said semiconductor layer;

(c) forming said trench isolation oxide film by filling said trench with an oxide film and, after that, removing said auxiliary film on said active region by a predetermined thickness to thereby make said trench isolation oxide film project from a main surface of said auxiliary film;

(d) implanting ions of an impurity of a conduction type different from that of a source/drain layer of said MOS transistor with energy by which the ions pass through said trench isolation oxide film and pass through the at least one active region, wherein a peak of a profile is formed in said semiconductor layer under said trench isolation oxide film after said step (c), thereby forming channel stop layers in said semiconductor layer under said trench isolation oxide film; and (e) reducing the thickness of said trench isolation oxide film after formation of said channel stop layer, wherein said step (a) includes a step of forming said auxiliary film by a multilayer film, said multilayer film has, in accordance with the order from said semiconductor layer side, a first oxide film, a first polysilicon film, a second oxide film, a second polysilicon film, and a nitride film for mask, and said step (c) includes a step of removing said nitride film for mask and said second polysilicon film in said auxiliary film on said active region.

31. The method of fabricating a semiconductor device according to claim 30, wherein said step (a) includes a step of forming said second polysilicon film so as to be thicker than said first polysilicon film.

32. A method of fabricating a semiconductor device comprising at least one kind of a MOS transistor on a semiconductor layer, and a trench isolation oxide film for defining at least one active region as a region in which said MOS transistor is formed and electrically isolating said MOS transistor, comprising the steps of:

(a) forming an auxiliary film for forming said trench isolation oxide film on said semiconductor layer;

(b) forming a trench penetrating said auxiliary film and reaching a predetermined depth in said semiconductor layer;

(c) forming said trench isolation oxide film by filling said trench with an oxide film and, after that, removing said auxiliary film on said active region by a predetermined thickness to thereby make said trench isolation oxide film project from a main surface of said auxiliary film;

(d) implanting ions of an impurity of a conduction type different from that of a source/drain layer of said MOS transistor with energy by which the ions pass through said trench isolation oxide film and pass through the at least one active region, wherein a peak of a profile is formed in said semiconductor layer under said trench isolation oxide film after said step (c), thereby forming channel stop layers in said semiconductor layer under said trench isolation oxide film; and (e) reducing the thickness of said trench isolation oxide film after formation of said channel stop layer, wherein said step (a) includes a step of forming said auxiliary film by a multilayer film, said multilayer film has, in accordance with the order from said semiconductor layer side, a first oxide film, a first polysilicon film, a second oxide film, and a nitride film for mask, and said step (c) includes a step of removing said nitride film for mask in said auxiliary film on said active region.

* * * * *